US012720849B2

(12) United States Patent
Kubo

(10) Patent No.: US 12,720,849 B2
(45) Date of Patent: Aug. 25, 2026

(54) SEMICONDUCTOR DEVICE INCLUDING A FIRST ELEMENT STRUCTURE WITH A COLUMN LAYER AND A SECOND ELEMENT STRUCTURE

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 412 days.

(21) Appl. No.: 17/913,166

(22) PCT Filed: Mar. 22, 2021

(86) PCT No.: PCT/JP2021/011608
§ 371 (c)(1),
(2) Date: Sep. 21, 2022

(87) PCT Pub. No.: WO2021/200324
PCT Pub. Date: Oct. 7, 2021

(65) Prior Publication Data
US 2023/0155020 A1 May 18, 2023

(30) Foreign Application Priority Data

| | | |
|---|---|---|
| Mar. 31, 2020 | (JP) | 2020-062479 |
| Mar. 31, 2020 | (JP) | 2020-062480 |
| Mar. 31, 2020 | (JP) | 2020-062481 |

(51) Int. Cl.
*H10D 84/00* (2025.01)
*H10D 12/00* (2025.01)
(Continued)

(52) U.S. Cl.
CPC ......... *H10D 84/144* (2025.01); *H10D 12/441* (2025.01); *H10D 30/668* (2025.01);
(Continued)

(58) Field of Classification Search
CPC ............... H01L 29/7805; H01L 21/221; H01L 21/26513; H01L 27/0664; H01L 29/0634;
(Continued)

(56) References Cited

U.S. PATENT DOCUMENTS

2015/0091126 A1* 4/2015 Takahashi ............ H10D 62/111 257/488
2017/0077084 A1* 3/2017 Shirakawa ............ H01L 29/861

FOREIGN PATENT DOCUMENTS

JP 2006-261562 A 9/2006
JP 2013-62343 A 4/2013
(Continued)

OTHER PUBLICATIONS

International Search Report and Written Opinion mailed on Jun. 15, 2021, received for PCT Application PCT/JP2021/011608, filed on Mar. 22, 2021, 13 pages including English Translation.
(Continued)

*Primary Examiner* — Duy T Nguyen
*Assistant Examiner* — Zhijun Xu
(74) *Attorney, Agent, or Firm* — XSENSUS LLP

(57) ABSTRACT

A semiconductor device includes a semiconductor layer having a first surface and a second surface, an element structure formed on the first surface side of the semiconductor layer and including a first conductivity type first region and a second conductivity type second region in contact with the first region, a gate electrode opposing the second region with a gate insulating film therebetween, a first conductivity type third region formed in the semiconductor layer to be in contact with the second region, and a first electrode formed on the semiconductor layer and electrically connected to the first region and the second region, in which the element structure includes a first and a second element structure, the first element structure is separated
(Continued)

from the second region in a direction along the first surface of the semiconductor layer, and includes a second conductivity type first column layer extending in a thickness direction.

15 Claims, 56 Drawing Sheets

(51) Int. Cl.

| | |
|---|---|
| ***H10D 30/66*** | (2025.01) |
| ***H10D 62/10*** | (2025.01) |
| ***H10D 84/60*** | (2025.01) |
| ***H10P 30/20*** | (2026.01) |
| ***H10P 32/10*** | (2026.01) |

(52) U.S. Cl.
CPC ......... *H10D 62/111* (2025.01); *H10D 84/617* (2025.01); *H10P 30/204* (2026.01); *H10P 30/21* (2026.01); *H10P 32/171* (2026.01); *H10P 32/18* (2026.01)

(58) Field of Classification Search
CPC ............. H01L 29/7395; H01L 29/7813; H01L 21/761; H01L 29/0834; H01L 29/1095; H01L 29/0696; H01L 29/0878; H01L 29/32; H01L 29/404; H01L 29/7811; H01L 29/66348; H01L 29/66712; H01L 29/7397; H01L 29/861; H01L 29/868; H10D 84/144; H10D 12/441; H10D 30/668; H10D 62/111; H10D 84/617; H10D 8/50; H10D 30/665; H10D 12/038; H10D 12/481; H10D 30/0291; H10D 62/051; H10D 62/157; H10D 62/53; H10D 64/112; H10D 62/142; H10D 62/393; H10D 62/127; H10P 30/204; H10P 30/21; H10P 32/171; H10P 32/18; H10W 10/031; H10W 10/30
See application file for complete search history.

(56) References Cited

FOREIGN PATENT DOCUMENTS

| | | | |
|---|---|---|---|
| JP | 2013-243399 | A | 12/2013 |
| JP | 2015-070184 | A | 4/2015 |
| JP | 2017-59667 | A | 3/2017 |
| JP | 2018-041983 | A | 3/2018 |
| JP | 2018-049908 | A | 3/2018 |
| JP | 2018-107477 | A | 7/2018 |
| JP | 2019-102556 | A | 6/2019 |

OTHER PUBLICATIONS

Notice of Reasons for Refusal dated Feb. 13, 2025 in corresponding Japanese patent application No. 2022-511949 (11 pages; with English machine translation).

* cited by examiner 1
3
2
4
II
10
III
6
12
9
5
13
7
11
8
A1

A8
202(201)
214(241)
215(242)
228
223
220
247
231
248
217
229
216
230
255
233
239
238
222
253
240
232
391
(219)
392
(219)
221
235
236
234
381
(218)
382
(218)
237
245
249
DB
DC
X
Z 239
228
222
223
202(201)
253
Z
X
232
220
(Low) Resistance value (High)
221
218
219
773(257)
781(258)
279
(282)
1021
235
Lc
H1
259
217
236
234
280
258
D1
W1
281
235
H2
1022
(282)
278
260
D2
231
256
279
782(258)
229
233
216
774(257)
255
230

X
Z
264
263
263
217
263
263
261
229
216
230
262
262
262
262
262
214(241)
215(242)
232
233

X
Z
231
247
248
217
229
216
220
391
(219)
221
238
235
236
230
381
(218)
214(241)
220
234
237
245
215(242)
382
(218)
392
(219)
249
232
233

X
Z
231
247
248
217
229
216
230
228
223
220
391
(219)
221
235
236
238
222
381
(218)
234
214(241)
253
237
245
382
(218)
215(242)
392
(219)
232
233
249

X
Z
231
247
248
217
229
216
230
202(201)
228
223
220
391
(219)
221
1021
(282)
235
236
239
238
381
(18)
222
234
214(241)
253
237
245
215(242)
240
382
392
249
232
233
D3

A8
X
Z
202(201)
214(241)
215(242)
217
231
247
248
216
229
230
233
255
245
249
232
391
(219)
392
(219)
381
(218)
382
(218)
220
221
222
223
228
234
235
236
237
238
239
240
253

High

Sample 9 (two-step irradiation $D_{10}$ + 10 $\mu$m and $D_{10}$ − 10 $\mu$m)

A

B

C

D

BVDSS

Sample 10 ($D_{10}$)

Low

X
Z
202(201)
214(241)
215(242)
228
223
220
247
231
248
217
229
216
230
255
239
238
222
253
237
249
240
221
391
(219)
392
(219)
381
(218)
382
(218)
265
232
233
A9

X
Z
231
268
247
248
217
266
229
216
230
381
(218)
265
381
(218)
214(241)
249
382
(218)
265
382
(218)
215(242)

X
Z
A10
202(201)
214(241)
215(242)
231
247
248
217
229
216
230
255
233
Dв
Dc
228
223
239
238
222
253
240
232
220
221
391
(219)
392
(219)
381
(218)
382
(218)
235
236
234
237
245
249

X
Z
231
247
248
217
229
216
230
202(201)
228
220
391
(219)
221
237
235
236
239
271
270
269
381
(218)
238
214(241)
234
253
245
271
270
269
228
237
235
236
240
221
382
(218)
215(242)
271
270
269
234
A12
255
221
220
253
238
249
232
392
(219)
233

X
Z
202(201)
214(241)
215(242)
228
220
247
231
248
217
229
216
239
391
(219)
221
237
235
236
230
271
270
269
381
(218)
238
234
253
A13
240
382
249
255
232
392
233

SEMICONDUCTOR DEVICE INCLUDING A FIRST ELEMENT STRUCTURE WITH A COLUMN LAYER AND A SECOND ELEMENT STRUCTURE

CROSS-REFERENCE TO RELATED APPLICATIONS

This application is based on PCT filing PCT/JP2021/011608, filed Mar. 22, 2021, which corresponds to Japanese Patent Application Nos. 2020-062479, 2020-062480 and 2020-062481, filed on Mar. 31, 2020 with the Japan Patent Office, the disclosures of each are incorporated herein by reference in their entirety.

TECHNICAL FIELD

The present disclosure relates to a semiconductor device.

BACKGROUND ART

Patent Literature 1 discloses a MOSFET. In the MOSFET, a super junction structure is provided between a semiconductor substrate with $n^+$ type impurities contained therein and a base layer with p type impurities contained therein. The super junction structure is configured such that a first semiconductor layer with n type impurities contained therein and a second semiconductor layer with p type impurities contained therein are arranged alternately and repeatedly in a direction intersecting with the direction in which the semiconductor substrate and the base layer oppose each other.

CITATION LIST

Patent Literature

Patent Literature 1: Japanese Patent Application Publication No. 2006-261562

SUMMARY OF THE INVENTION

Solution to Problem

A semiconductor device according to a preferred embodiment of the present disclosure includes a semiconductor layer having a first surface and a second surface, an element structure formed on the first surface side of the semiconductor layer and including a first conductivity type first region and a second conductivity type second region in contact with the first region, a gate electrode opposing the second region with a gate insulating film therebetween, a first conductivity type third region formed in the semiconductor layer to be in contact with the second region, and a first electrode formed on the semiconductor layer and electrically connected to the first region and the second region, in which the element structure includes a first element structure and a second element structure, the first element structure is separated from the second region in a direction along the first surface of the semiconductor layer and further includes a second conductivity type first column layer extending in a thickness direction of the semiconductor layer, and the second element structure further includes a second electrode opposing the third region with an insulating film therebetween and electrically connected to the first electrode.

BRIEF DESCRIPTION OF THE DRAWINGS

FIG. 18 is a main part enlarged view of a part surrounded by the alternate long and two short dashed line XVIII in FIG. 16.

DESCRIPTION OF PREFERRED EMBODIMENTS

Preferred Embodiments of the Present Disclosure

Figure 1:
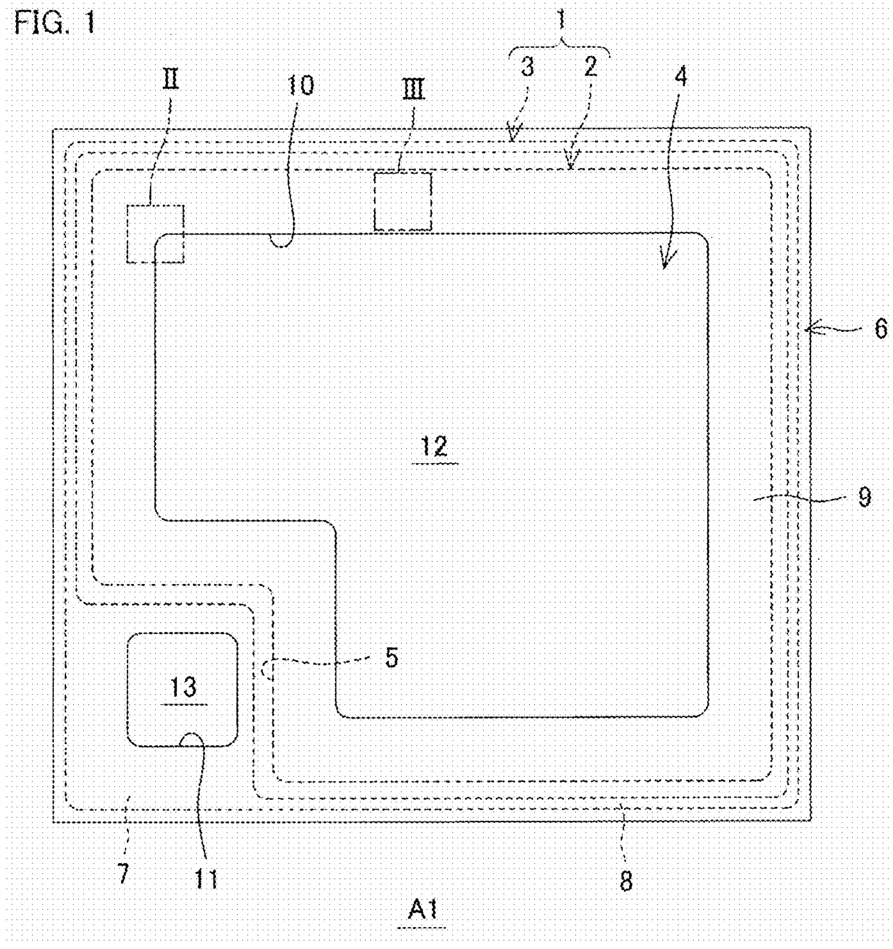
FIG. 1 is a schematic plan view of a semiconductor device according to a first preferred embodiment of the present disclosure.

Preferred embodiments of the present disclosure will first be listed and described.

A semiconductor device according to a preferred embodiment of the present disclosure includes a semiconductor layer having a first surface and a second surface, an element structure formed on the first surface side of the semiconductor layer and including a first conductivity type first region and a second conductivity type second region in contact with the first region, a gate electrode opposing the second region with a gate insulating film therebetween, a first conductivity type third region formed in the semiconductor layer to be in contact with the second region, and a first electrode formed on the semiconductor layer and electrically connected to the first region and the second region, in which the element structure includes a first element structure and a second element structure, the first element structure is separated from the second region in a direction along the first surface of the semiconductor layer and further includes a second conductivity type first column layer extending in a thickness direction of the semiconductor layer, and the second element structure further includes a second electrode opposing the third region with an insulating film therebetween and electrically connected to the first electrode.

For example, if the first conductivity type is n type and the second conductivity type is p type and when the third region is connected to an electric potential higher than that of the first region and the gate electrode is applied with a control voltage equal to or higher than a threshold voltage, an inversion layer (channel) is formed in the second region. This causes a current path to be formed between the first region and the third region. When the gate electrode is applied with no control voltage, no inversion layer is generated, so that the current path is blocked. The pn junction between the second region and the third region forms a parasitic diode. The parasitic diode is turned on when a forward voltage is applied, while it is turned off when a reverse voltage is applied. When the parasitic diode is turned off, a reverse recovery phenomenon occurs. This causes a current to flow, which is called a reverse recovery current. Carrier migration causes a depletion layer to extend from the pn junction, whereby the parasitic diode is turned off.

In this preferred embodiment, the first column layer is separated from the second region to electrically float with respect to the second region in the first element structure. Accordingly, the first column layer does not contribute to the operation of the parasitic diode, which suppresses steep extension of the depletion layer during the reverse recovery phenomenon. On the other hand, since the first electrode is connected to the second electrode in the second element structure, the density of holes in the n type region (third region) in the first surface of the semiconductor layer decreases locally when the parasitic diode is turned off. This facilitates extension of the depletion layer from the first surface of the semiconductor layer, and thereby allows the timing of extension of the depletion layer from the first surface to be accelerated. This allows the depletion layer to extend gradually from the first surface of the semiconductor layer.

Thus combining the advantageous effects of both the first element structure and the second element structure suppresses extension of the depletion layer in the thickness direction of the semiconductor layer and thereby suppresses the rate of extension of the depletion layer when the parasitic diode is turned off. This reduces the rate of change in the reverse recovery current (dir/dt) to thereby improve the recovery characteristics. The parasitic capacitance characteristics can also be improved.

Further, in the first element structure, the first column layer is separated from the second region in a horizontal direction along the first surface of the semiconductor layer. That is, since the second region is not formed on an extension of the first column layer in the thickness direction of the semiconductor layer, the first column layer cannot come into contact with the second region even if the first column layer is brought closer to the first surface. It is therefore possible to suppress an increase in the thickness of the semiconductor layer as a result of providing spacing between the first column layer and the second region and thereby suppress the current flowing in the thickness direction of the semiconductor layer from having an increased ON-resistance.

In the semiconductor device according to a preferred embodiment of the present disclosure, the semiconductor layer may include a first element region with a plurality of the first element structures arranged therein and a second element region with a plurality of the second element structures arranged therein.

In accordance with the arrangement above, the first element structures and the second element structures are mixed in their respective separated regions, which can further improve the parasitic capacitance characteristics.

In the semiconductor device according to a preferred embodiment of the present disclosure, the first element region may be surrounded by the second element region.

In the semiconductor device according to a preferred embodiment of the present disclosure, the semiconductor layer may include an active region with the element structure formed therein and an outer peripheral region surrounding the active region, and the second element region may be formed in a peripheral edge portion of the active region.

In the semiconductor device according to a preferred embodiment of the present disclosure, the first electrode may cover the first element region and the second element region, and the second element region may be formed in a peripheral edge portion of the first electrode.

In the semiconductor device according to a preferred embodiment of the present disclosure, the third region may include a first portion formed between a top portion of the first column layer and the second region and having a first impurity concentration and a second portion formed closer to the second surface of the semiconductor layer with respect to the first portion and having a second impurity concentration lower than the first impurity concentration.

In accordance with the arrangement above, since the region in the vicinity of the parasitic diode has a relatively higher first impurity concentration, it is possible to suppress steep extension of the depletion layer in the thickness direction (vertical direction) of the semiconductor layer during the reverse recovery phenomenon and cause the region to have a low resistance. On the other hand, since the region closer to the second surface with respect to the top portion of the first column layer has a second impurity concentration relatively lower than the first impurity concentration, it is possible to facilitate extension of the depletion layer from the first column layer in the horizontal direction along the first surface of the semiconductor layer and thereby maintain the withstand voltage.

In the semiconductor device according to a preferred embodiment of the present disclosure, the first column layer may have a concavo-convex side surface formed with multiple repeating sets of convex portions and concave portions in the thickness direction of the semiconductor layer, and the top portion of the first column layer may include the convex portion that is closest to the first surface of the semiconductor layer.

In the semiconductor device according to a preferred embodiment of the present disclosure, the gate electrode may include a first portion extending in a first direction, a second portion extending in a second direction orthogonal to the first direction, and an intersecting portion in which the first portion and the second portion intersect each other, and the first column layer may be formed below the intersecting portion of the gate electrode.

In the semiconductor device according to a preferred embodiment of the present disclosure, the second region of the first element structure may be formed in a quadrilateral shape in a plan view, and the first column layer may be formed adjacent to one of the corners of the second region.

In the semiconductor device according to a preferred embodiment of the present disclosure, a plurality of the first column layers are formed with spacing from each other, and the second region of the first element structure may be formed apart from a region between the first column layers adjacent to each other.

In the semiconductor device according to a preferred embodiment of the present disclosure, the second electrode may be formed between mutually adjoining ones of a plurality of the second regions.

In the semiconductor device according to a preferred embodiment of the present disclosure, the second element structure may further include a second conductivity type second column layer formed continuously to the second region and extending in the thickness direction of the semiconductor layer from the second region toward the second surface of the semiconductor layer.

In accordance with the arrangement above, the semiconductor device has a super junction structure in which the second column layer extends from the second region. Accordingly, by defining the spacing between second column layers such that the depletion layers extending horizontally from the second column layers are integrated, the inherent characteristics of the super junction structure of achieving excellent ON-resistance and switching speed can also be realized.

In the semiconductor device according to a preferred embodiment of the present disclosure, a plurality of the first column layers and a plurality of the second column layers may be arranged regularly at equal spacing from each other.

In the semiconductor device according to a preferred embodiment of the present disclosure, the element structure may include a planar gate structure.

In the semiconductor device according to a preferred embodiment of the present disclosure, the element structure may include a trench gate structure.

The semiconductor device according to a preferred embodiment of the present disclosure may include a MISFET having the first region as a source region and the second region as a body region.

The semiconductor device according to a preferred embodiment of the present disclosure may include an IGBT having the first region as an emitter region, the second region as a base region, and a second conductivity type collector region in contact with the third region.

Detailed Description of Preferred Embodiments of the Present Disclosure

Next, preferred embodiments of the present disclosure will be described in detail with reference to the accompanying drawings.

First Preferred Embodiment

<<Overall Structure of Semiconductor Device A1>>

FIG. 1 is a schematic plan view of a semiconductor device A1 according to a first preferred embodiment of the present disclosure.

The semiconductor device A1 has a quadrilateral shape in a plan view. The semiconductor device A1 is formed with, for example, a MISFET (Metal Insulator Semiconductor Field Effect Transistor). An electrode film 1 is formed on the surface of the semiconductor device A1. The electrode film 1 covers approximately the entire surface of the semiconductor device A1. In this preferred embodiment, the electrode film 1 includes a source electrode film 2 and a gate electrode film 3. In this preferred embodiment, the source electrode film 2 may be an example of the "first electrode" cited in the appended claims.

The source electrode film 2 is formed in a manner covering an active region 4 of the semiconductor device A1. The active regions 4 is, for example, a region in which element structures 39, 40 to be described hereinafter are formed. The source electrode film 2 is formed over approximately the entire active region 4. The source electrode film 2 is formed selectively with a recessed portion 5 in a plan view. In this preferred embodiment, the recessed portion 5 is formed at one of the corners of the semiconductor device A1.

The gate electrode film 3 is formed in an outer peripheral region 6 of the semiconductor device A1 surrounding the active region 4. The gate electrode film 3 integrally includes a pad portion 7 formed within the recessed portion 5 of the source electrode film 2 and a finger portion 8 extending from the pad portion 7 along the sides of the semiconductor device A1 in a plan view. In this preferred embodiment, the finger portion 8 is formed in a closed annular shape to surround the source electrode film 2. As a matter of course, the finger portion 8 may not necessarily have a closed annular shape. For example, the finger portion 8 may extend in parallel along two mutually opposing sides (e.g. upper and lower sides in FIG. 1) of the semiconductor device A1 and terminate at the corners of the semiconductor device A1.

The electrode film 1 is partially covered with a passivation film 9 formed on the surface of the semiconductor device A1. The passivation film 9 collectively covers the source electrode film 2 and the gate electrode film 3, and has a plurality of openings 10, 11 that expose portions of the electrode film 1 therethrough. In FIG. 1, a portion of the source electrode film 2, a portion of the pad portion 7 and the finger portion 8 of the gate electrode film 3 are indicated by a broken line, and the broken line portion corresponds to a portion covered with the passivation film 9.

A portion of the source electrode film 2 is exposed through the first pad opening 10 as a source pad 12, and a portion of the gate electrode film 3 (pad portion 7) is exposed through the second pad opening 11 as a gate pad 13. A bonding material such as a bonding wire may be bonded to each pad 12, 13 at the time of packaging of the semiconductor device A1.

Figure 2:
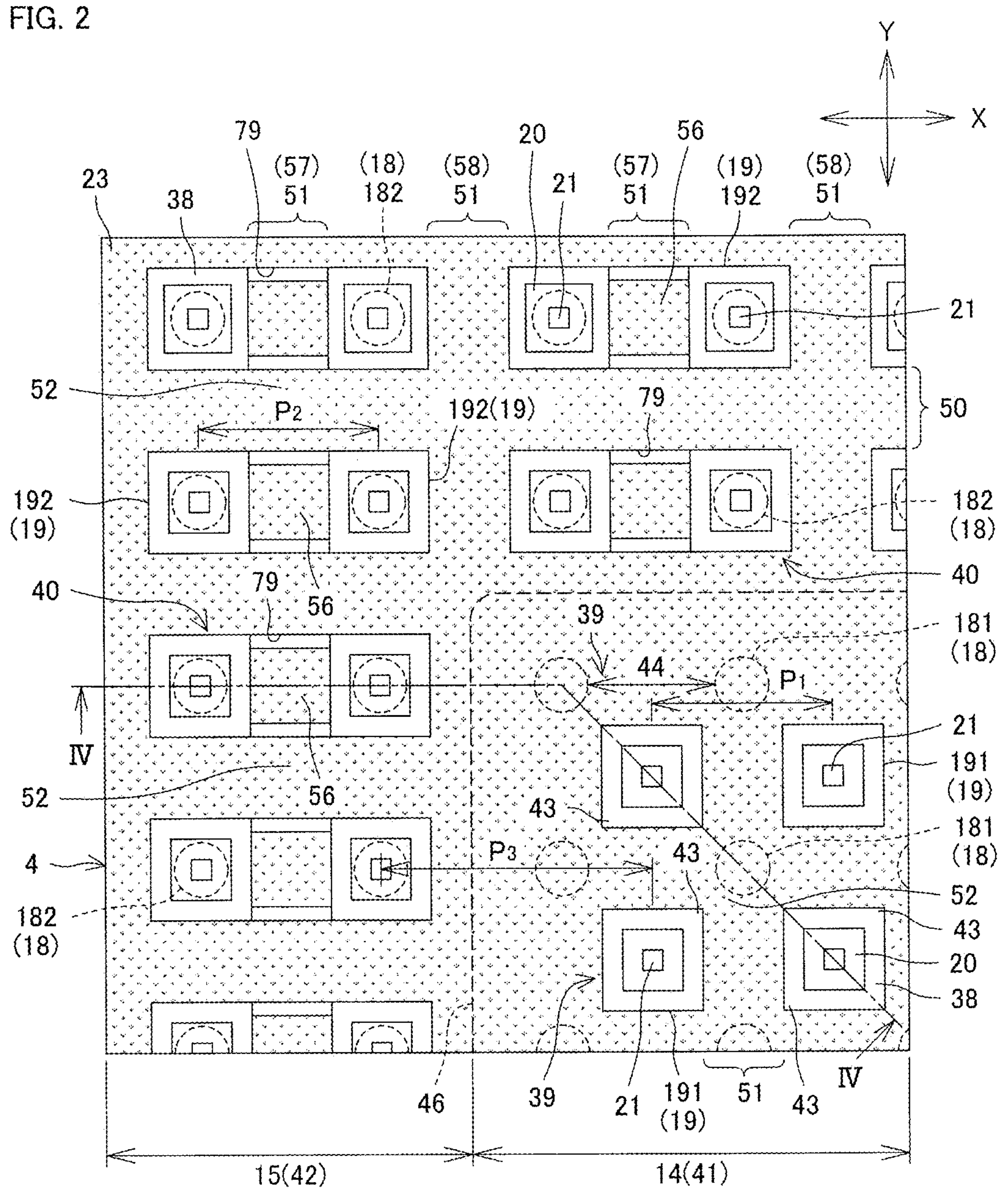
FIG. 2 is a main part enlarged view of a part surrounded by the alternate long and two short dashed line II in FIG. 1.
Figure 3:
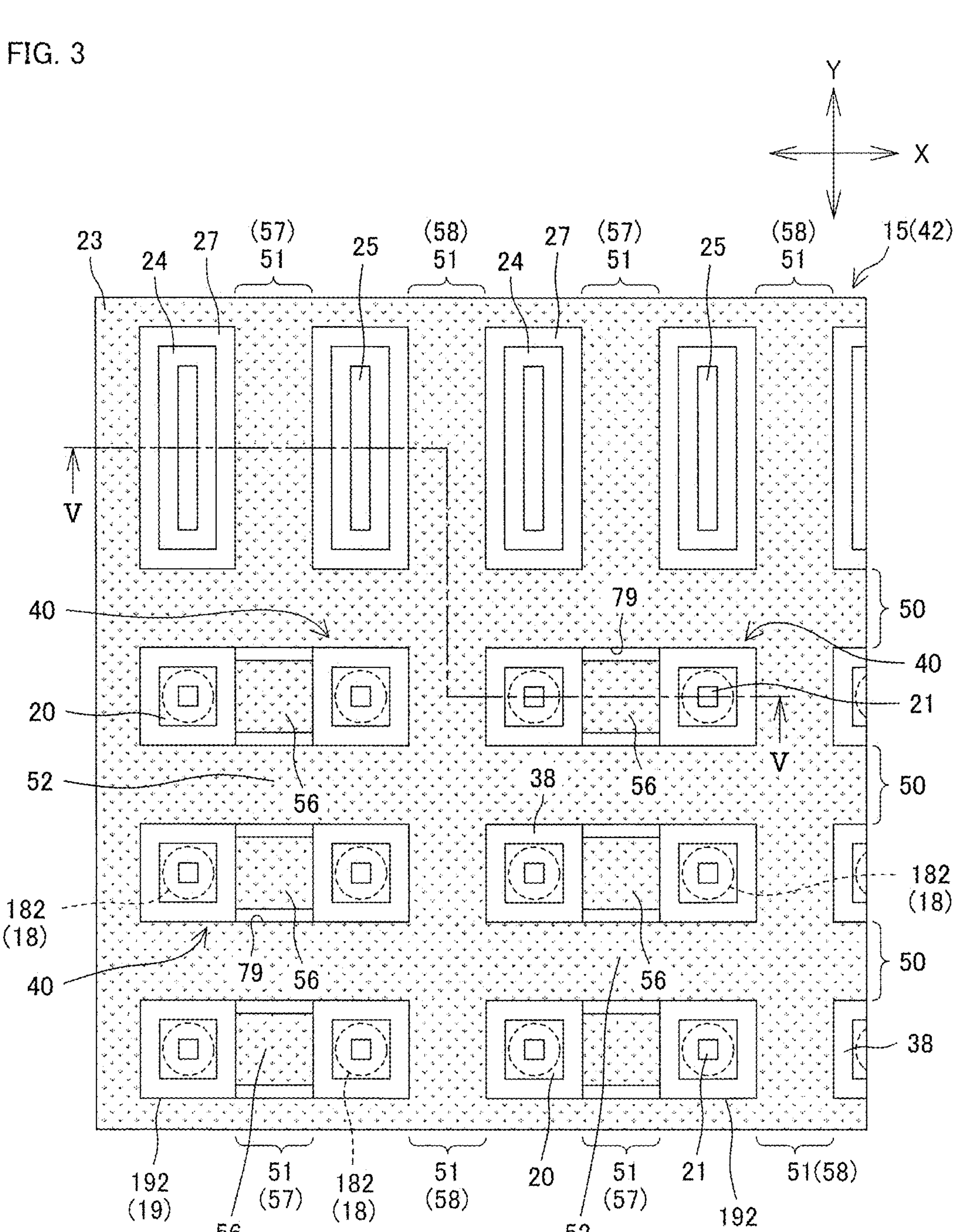
FIG. 3 is a main part enlarged view of a part surrounded by the alternate long and two short dashed line III in FIG. 1.

FIG. 2 is a main part enlarged view of a part surrounded by the alternate long and two short dashed line II in FIG. 1. FIG. 3 is a main part enlarged view of a part surrounded by the alternate long and two short dashed line III in FIG. 1. More specifically, FIG. 2 shows the internal structure of a boundary portion between the region of the source electrode film 2 covered with the passivation film 9 and the source pad 12. FIG. 3 shows the internal structure of the region of the source electrode film 2 covered with the passivation film 9. The region of the source electrode film 2 covered with the passivation film 9 has a closed annular shape surrounding the source pad 12 and forms a peripheral edge portion of the source electrode film 2. The peripheral edge portion is also an outer peripheral portion of the active region 4 surrounding a central portion 14 of the active region 4 below the source pad 12 and therefore may also be referred to as a peripheral edge portion 15 of the active region 4. Also, in FIGS. 2 and 3, the gate electrode 23 is partially hatched for convenience of understanding (portions of the gate electrode 23 opposing body regions 19 are not hatched for the purpose of clarification).

Figure 4:
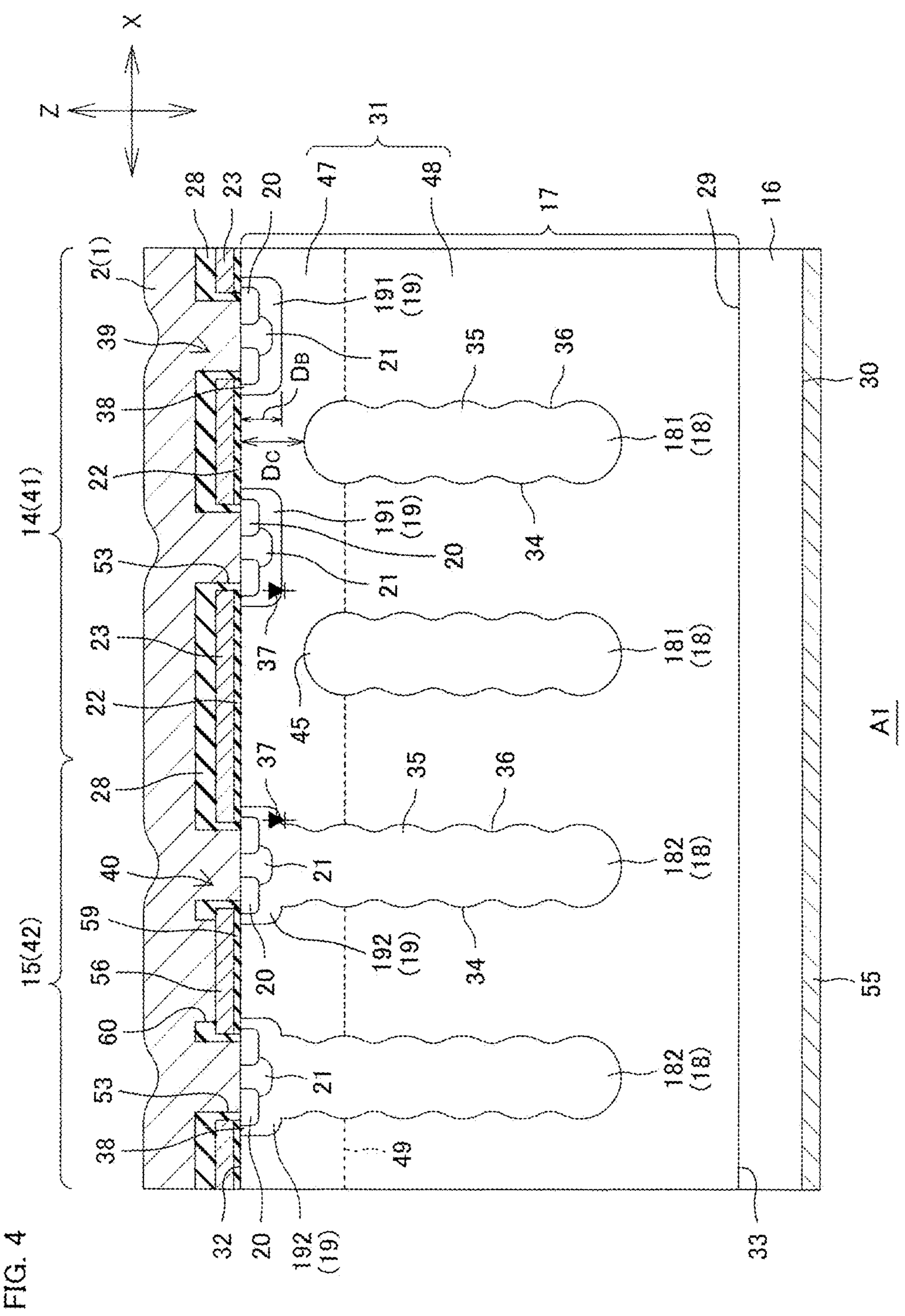
FIG. 4 is a cross-sectional view taken along the line IV-IV in FIG. 2.
Figure 5:
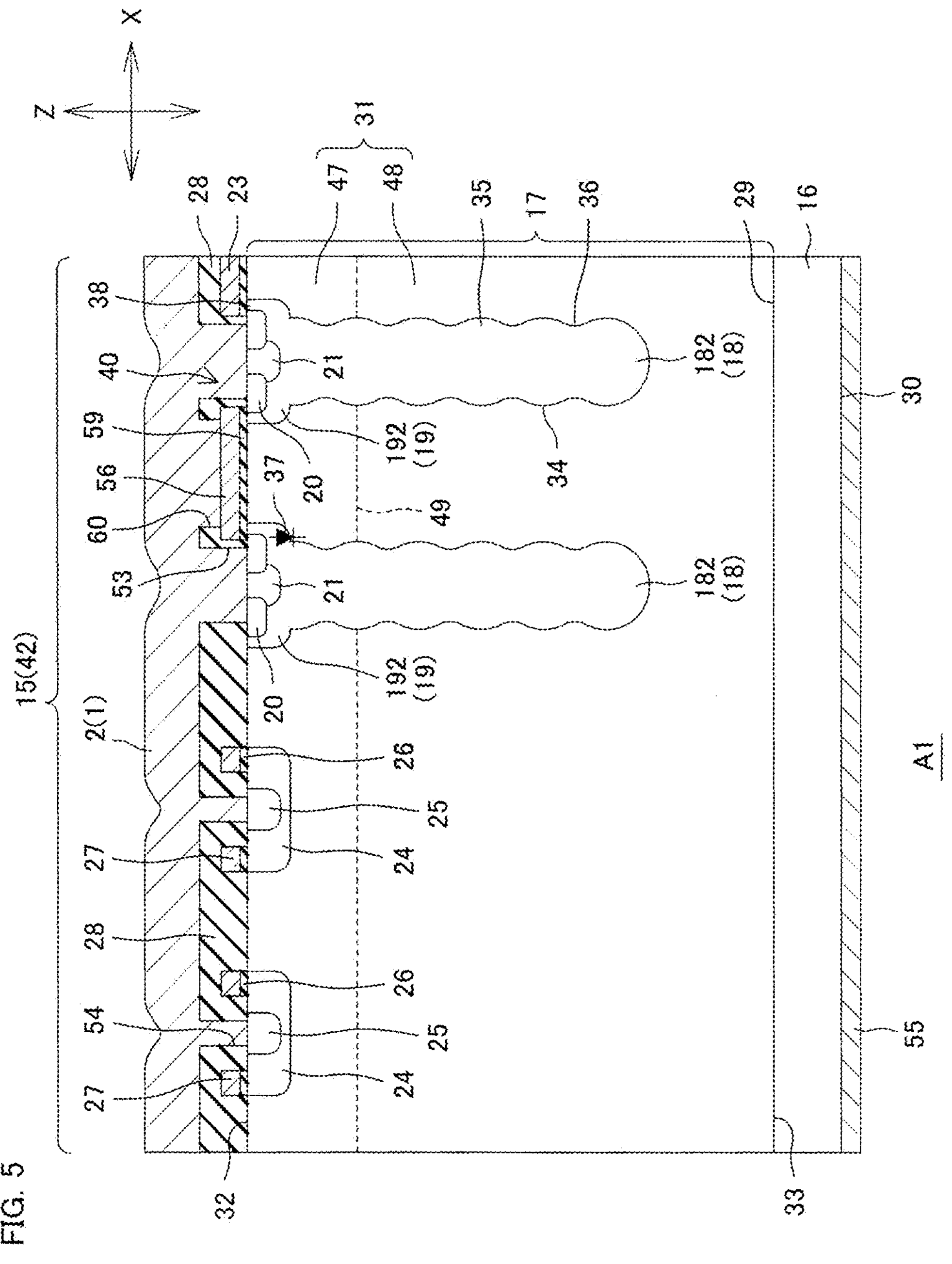
FIG. 5 is a cross-sectional view taken along the line V-V in FIG. 3.

FIG. 4 is a cross-sectional view taken along the line IV-IV in FIG. 2. FIG. 5 is a cross-sectional view taken along the line V-V in FIG. 3. For the purpose of description, three mutually orthogonal directions are defined as X direction, Y direction, and Z direction. The Z direction corresponds to a thickness direction of the semiconductor device A1. The X direction corresponds to a left-right direction in a plan view of the semiconductor device A1 (see FIGS. 2 and 3). The Y direction corresponds to an up-down direction in a plan view of the semiconductor device A1 (see FIGS. 2 and 3).

The semiconductor device A1 may include a semiconductor substrate 16, an epitaxial layer 17, a column layer 18, a body region 19, a source region 20, a body contact region 21, a gate insulating film 22, a gate electrode 23, a p type region 24, a p type contact region 25, an insulating film 26, a floating electrode 27, and an interlayer insulating film 28. In this preferred embodiment, the epitaxial layer 17, the body region 19, and the source region 20 may be respective examples of the "semiconductor layer," "second region," and "first region" cited in the appended claims.

In this preferred embodiment, the semiconductor substrate 16 may be composed of an $n^+$ type semiconductor substrate (e.g. silicon substrate). Other substrate types commonly employed for transistors, such as an SiC substrate and GaN substrate, may also be used. The $n^+$ type semiconductor substrate 16 may be a semiconductor substrate that has undergone crystal growth with n type impurities being doped. P (phosphorus), As (arsenic), Sb (antimony), etc. may be applied as the n type impurities. The $n^+$ type semiconductor substrate 16 may also have an impurity concentration of, for example, about $1.0\times10^{18}$ $cm^{-3}$ to $5.0\times10^{20}$ $cm^{-3}$. The semiconductor substrate 16 has a first surface 29 and a second surface 30 on the side opposite thereto.

The epitaxial layer 17 may be, for example, an $n^-$ type layer on the $n^+$ type semiconductor substrate 16 that has undergone epitaxial growth with n type impurities being doped. Examples of the n type impurities include those as mentioned above. The $n^-$ type epitaxial layer 17 may also have an impurity concentration of, for example, about $1.0\times10^{10}$ $cm^{-3}$ to $1.0\times10^{16}$ $cm^{-3}$, which is lower than that of the $n^+$ type semiconductor substrate 16. The $n^-$ type region in the epitaxial layer 17 may also be referred to as an $n^-$ type drift region 31. In this preferred embodiment, the drift region 31 may be an example of the "third region" cited in the appended claims.

The epitaxial layer 17 (drift region 31) has a first surface 32 and a second surface 33 on the side opposite thereto. The first surface 32 may also be referred to as an element principal surface, in which element structures 39, 40 to be described hereinafter are formed. The second surface 33 is a surface in contact with the first surface 29 of the semiconductor substrate 16.

The column layer 18 may be a semiconductor layer formed through ion implantation of p type impurities into the epitaxial layer 17. B (boron), Al (aluminum), Ga (gallium), etc. may be applied as the p type impurities. The column layer 18 may also have an impurity concentration of, for example, about $1.0\times10^{15}$ $cm^{-3}$ to $1.0\times10^{19}$ $cm^{-3}$.

Figure 6A:
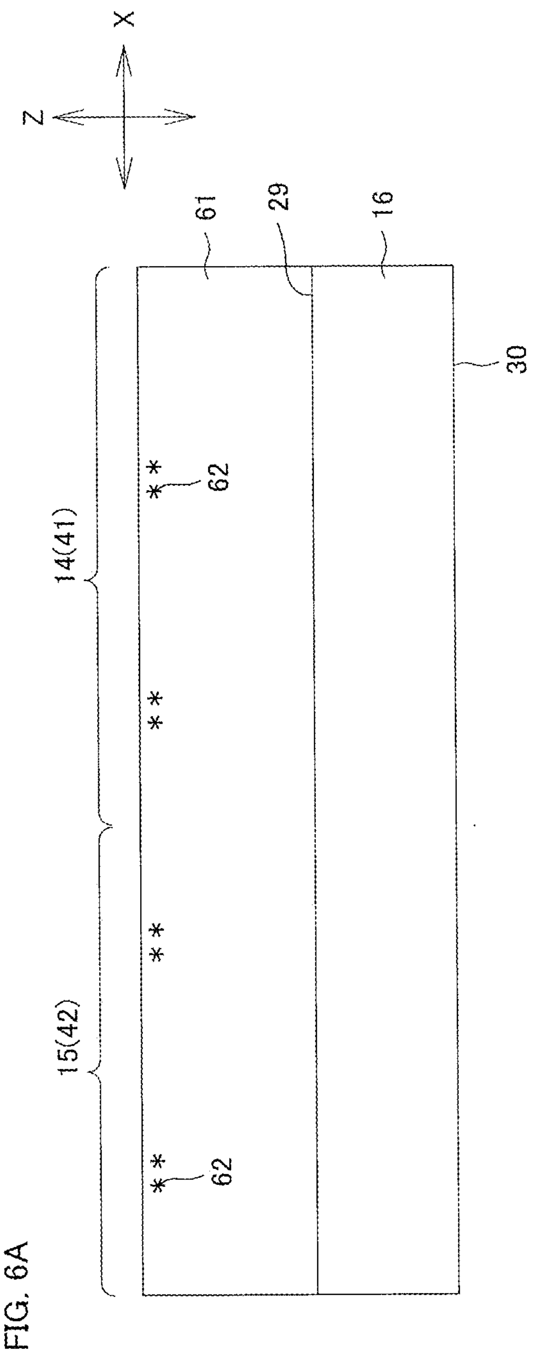
FIG. 6A is a view showing a process step for manufacturing the semiconductor device in FIG. 4.
Figure 6B:
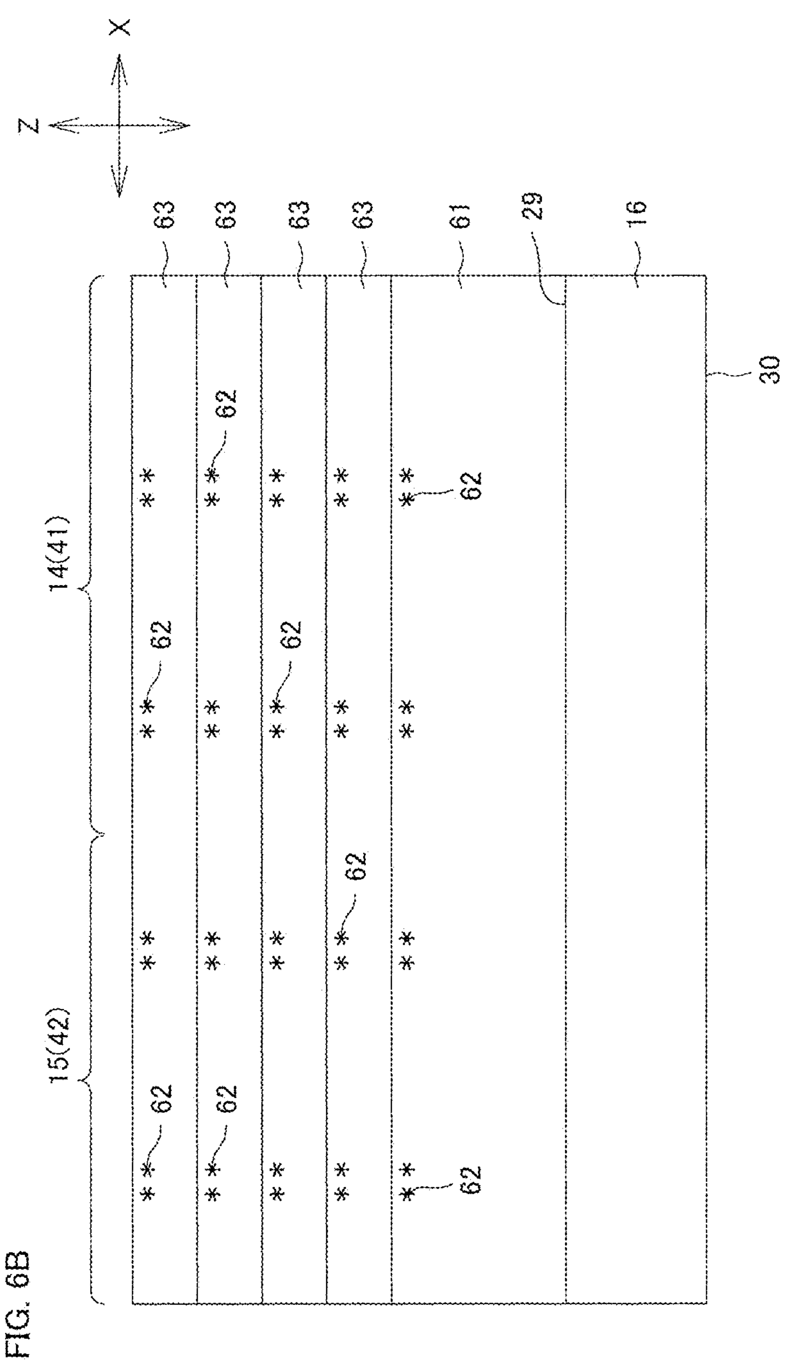
FIG. 6B is a view showing a step following FIG. 6A.

As shown in FIGS. 4 and 5, the column layer 18 extends in the Z direction, for example, from an upper portion of the epitaxial layer 17 beyond a central portion of the epitaxial layer 17 in the Z direction. As shown in FIGS. 2 and 3, the column layer 18 has a circular shape in a plan view. It is noted that the column layer 18 is not limited to have a circular shape but may have, for example, a triangular shape, a quadrilateral shape, etc. in a plan view. The column layer 18 also has a periodically waving concavo-convex side surface 34 extending in the Z direction and formed with multiple repeating sets of convex portions 35 and concave portions 36 in the Z direction. The number of the concavities and convexities 35, 36 commonly approximately corresponds to the step number of n type semiconductor layers 63 to be described hereinafter (FIGS. 6A and 6B).

As shown in FIGS. 2 and 3, the column layers 18 are arranged regularly at equal spacing from each other. In this preferred embodiment, the plurality of column layers 18 are arranged to have the same spacing (pitch) in the X and Y directions. As shown in FIG. 2, the column layers 18 are also arranged in an equally spaced matrix manner across the boundary between the peripheral edge portion 15 of the active region 4 and the central portion 14 of the active region 4.

A plurality of body regions 19 are formed in a surficial portion of the epitaxial layer 17, and more specifically, may be provided as a semiconductor layer formed through ion implantation of p type impurities into the $n^-$ type epitaxial layer 17. Examples of the p type impurities include those as mentioned above. The body regions 19 may also have an impurity concentration of, for example, about $1.0\times10^{15}$ $cm^{-3}$ to $1.0\times10^{19}$ $cm^{-3}$, which may be equal to that of the column layers 18. The body regions 19 may each have a quadrilateral shape in a plan view with a width of 3 μm to 10 μm, for example. As shown in FIGS. 4 and 5, the body regions 19 each form a parasitic diode 37 (body diode) at the interface (pn junction plane) with the drift region 31.

The source region 20 is formed in an inner region of each body region 19. The source region 20 is formed selectively in a surficial portion of the body region 19 in the inner region. The source region 20 may be formed through selective ion implantation of n type impurities into the body region 19. Examples of the n type impurities include those as mentioned above. The source region 20 may also have an impurity concentration of, for example, about $1.0\times10^{18}$ $cm^{-3}$ to $5.0\times10^{20}$ $cm^{-3}$, which is higher than that of the drift region 31.

The source region 20 has a quadrilateral shape in a plan view and is spaced inward by a predetermined distance from the peripheral edge of the body region 19 (the boundary between the body region 19 and the drift region 31). This causes the surficial portion of the body region 19 to be interposed between the source region 20 and the drift region 31 in a surficial portion of the epitaxial layer 17 including the drift region 31, the body region 19, etc. The interposed surficial portion serves as a channel region 38 in which a channel is formed when an appropriate voltage is applied to the gate electrode 23.

The body contact region 21 has a quadrilateral shape in a plan view and is formed selectively in a surficial portion of the body region 19. The body contact region 21 extends toward the second surface 33 of the epitaxial layer 17 to pass through the source region 20 and reach the body region 19. The body contact region 21 may be formed through selective ion implantation of p type impurities into the body region 19. Examples of the p type impurities include those as mentioned above. The body contact region 21 may also have an impurity concentration of, for example, about $5.0\times10^{17}$ $cm^{-3}$ to $1.0\times10^{19}$ $cm^{-3}$, which is higher than that of the body region 19.

Further, the body region 19, the source region 20, and the body contact region 21 constitute element structures 39, 40 (unit cells) of the MISFET. A portion of the drift region 31 is exposed between mutually adjoining element structures 39, 40.

In this preferred embodiment, the element structures 39, 40 may include first element structures 39 and second element structures 40. The first element structures 39 are arranged in the central portion 14 of the active region 4 as shown in FIG. 2, while the second element structures 40 are arranged in the peripheral edge portion 15 of the active region 4 as shown in FIGS. 2 and 3. The central portion 14 of the active region 4 is a region in which the plurality of first element structures 39 are arranged and therefore may also be referred to as a first element region 41. On the other hand, the peripheral edge portion 15 of the active region 4 is a region in which the plurality of second element structures 40 are arranged and therefore may also be referred to as a second element region 42.

As shown in FIG. 2, the first element structures 39 each has an element structure that includes a column layer 18 and a body region 19, in which the body region 19 is formed apart from the column layer 18 so as not to overlap the column layer 18 in a plan view, while the column layer 18 is adjacent to the body region 19. The body region 19 and the column layer 18 of the first element structure 39 may also be referred to as, respectively, a first body region 191 and a first column layer 181.

The first column layer 181 is separated physically from the first body region 191 in a direction along the first surface 32 of the epitaxial layer 17 (a direction along the X-Y plane in this preferred embodiment), serving as a floating region in the epitaxial layer 17. As shown in FIG. 2, the first column layer 181 is formed adjacent to one of the corners 43 of the first body region 191 having a quadrilateral shape in a plan view. For example, first column layers 181 may be formed adjacent to the four respective corners 43 of one first body region 191. The first body region 191 may also be formed apart from a region 44 between mutually adjacent first column layers 181 (a region sandwiched between adjoining first column layers 181). Further, each first column layer 181 may be shared by adjoining first element structures 39.

As shown in FIG. 4, the first column layer 181 may have a top portion 45 at a position deeper than that of a bottom portion of the first body region 191 (the convex portion 35 of the first column layer 181 closest to the first surface 32 of the epitaxial layer 17 in this preferred embodiment). That is, the distance $D_C$ from the first surface 32 of the epitaxial layer 17 to the first column layer 181 may be longer than the distance $D_B$ from the first surface 32 to the bottom portion of the first body region 191.

As shown in FIGS. 2 and 3, the second element structures 40 are each an element structure that includes a column layer 18 and a body region 19, in which the body region 19 overlaps the column layer 18 in a plan view and the column layer 18 is adjacent to the body region 19. The body region 19 and the column layer 18 of the second element structure 40 may also be referred to as, respectively, a second body region 192 and a second column layer 182.

The second column layer 182 is formed in an inner region of each second body region 192. More specifically, the second column layer 182 is formed continuously to a lower portion of the second body region 192 and extends from the second body region 192 toward the second surface 33 of the epitaxial layer 17. Bottom portions of the second column layer 182 and the first column layer 181 may be positioned at the same depth position from the first surface 32 of the epitaxial layer 17.

As shown in FIG. 2, the spacing between adjoining first and second body regions 191 and 192 may be increased selectively in a boundary portion 46 between the first element region 41 and the second element region 42. For example, the spacing (pitch $P_1$) between first body regions 191 in the first element region 41 and the spacing (pitch $P_2$) between second body regions 192 in the second element region 42 are from 5 μm to 20 μm and may be equal to each other. On the other hand, the spacing $P_3$ between the first body region 191 and the second body region 192 adjoining across the boundary portion 46 may be from 5 μm to 20 μm. It is noted that the pitch $P_3$ has a range from 5 μm to 20 μm by way of example, which is the same as an example of the range of the pitches $P_1$, $P_2$, but may be greater than the pitches $P_1$, $P_2$ within the foregoing range.

Also, as shown in FIG. 4, the drift region 31 may include a first portion 47 and a second portion 48 having their respective different impurity concentrations. The first portion 47 is formed between the top portion 45 of the first column layer 181 and the first body region 191 and has a first impurity concentration. On the other hand, the second portion 48 is formed closer to the second surface 33 of the epitaxial layer 17 with respect to the first portion 47 and has a second impurity concentration lower than the first impurity concentration. More specifically, a boundary portion 49 between the first portion 47 and the second portion 48 may be set in a Z-directional middle portion of the top portion 45 of the first column layer 181. In this preferred embodiment, the first impurity concentration may be about $1\times10^{10}$ $cm^{-3}$ to $1\times10^{13}$ $cm^{-3}$, and the second impurity concentration may also be about $1\times10^{10}$ $cm^{-3}$ to $1\times10^{13}$ $cm^{-3}$. It is noted that the first impurity concentration has a range from $1\times10^{10}$ $cm^{-3}$ to $1\times10^{13}$ $cm^{-3}$ by way of example, which is the same as an example of the range of the second impurity concentration, but the first impurity concentration may be higher than the second impurity concentration within the foregoing range.

The gate insulating film 22 may be composed of, for example, a silicon oxide film, a silicon nitride film, a silicon oxynitride film, a hafnium oxide film, an alumina film, a tantalum oxide film, etc. The gate electrode 23 may also be composed of polysilicon that is formed through impurity implantation. If the gate insulating film 22 is composed of a silicon oxide film, MISFET may also be referred to as MOSFET (Metal Oxide Semiconductor Field Effect Transistor).

The gate insulating film 22 covers at least the surface of the body region 19. In this preferred embodiment, the gate insulating film 22 covers a portion of the surface of the source region 20 and the surfaces of the channel region 38 and the drift region 31. More briefly, the gate insulating film 22 is formed in a pattern having an opening in the body contact region 21 of each element structure 39, 40 and a portion of the source region 20 that is continuous to the body contact region 21.

The gate insulating film 22 is interposed between the gate electrode 23 and the epitaxial layer 17. This causes the gate electrode 23 to oppose the channel region 38 with the gate insulating film 22 therebetween. The gate electrode 23 is formed in approximately the same pattern as the gate insulating film 22 to thereby form a planar gate structure. The gate insulating film 22 may also have a thickness of, for example, 300 Å to 700 Å.

Also, in this preferred embodiment, the gate electrode 23 is formed across the first element region 41 and the second element region 42, as shown in FIGS. 2 and 3. The gate electrode 23 is formed in a grid pattern in each of the first element region 41 and the second element region 42. More specifically, in the first element region 41 and the second element region 42, the gate electrode 23 includes a first portion 50 extending in the X direction, a second portion 51 extending in the Y direction orthogonal to the X direction, and an intersecting portion 52 in which the first portion 50 and the second portion 51 intersect each other. In the first element region 41, the first column layer 181 is formed below the intersecting portion 52 of the gate electrode 23.

Also, in this preferred embodiment, the gate electrode 23 includes a dummy gate electrode 56 in each second element structure 40. The dummy gate electrode 56 is separated physically from the surrounding gate electrode 23. More specifically, the dummy gate electrode 56 is separated from the surrounding gate electrode 23 with a clearance gap 79 therebetween. In this preferred embodiment, the dummy gate electrode 56 may be an example of the "second electrode" cited in the appended claims.

As shown in FIGS. 2 and 3, a pair of clearance gaps 79 are formed to connect mutually adjoining second body regions 192. For example, the pair of clearance gaps 79 oppose each other with spacing therebetween in the Y direction. The portion of the gate electrode 23 sandwiched between the pair of clearance gaps 79 serves as the dummy gate electrode 56. This causes the dummy gate electrode 56 to be formed between mutually adjoining second body regions 192. It is noted that the clearance gaps 79 may be straight as shown in FIGS. 2 and 3 or may be curved.

In this preferred embodiment, the dummy gate electrode 56 is formed between second body regions 192 adjoining in the X direction. The dummy gate electrode 56 is also formed between a pair of adjoining second body regions 192 once every other pair in the X direction. This may cause a first column 57 in which dummy gate electrodes 56 are arranged in the Y direction and a second column 58 in which no dummy gate electrode 56 is arranged to be formed in the second element region 42.

Accordingly, in the second element region 42, each dummy gate electrode 56 is formed between second body regions 192 adjoining in the X direction, while the gate electrode 23 is formed between second body regions 192 adjoining in the Y direction. This causes a portion of the channel region 38 formed in a closed annular shape (one of the sides of the channel region 38 in this preferred embodiment) to oppose the dummy gate electrode 56, while the remaining portion (the remaining three sides of the channel region 38 in this preferred embodiment) to oppose the gate electrode 23.

The insulating film 59 may be composed of, for example, a silicon oxide film, a silicon nitride film, a silicon oxynitride film, a hafnium oxide film, an alumina film, a tantalum oxide film, etc. The insulating film 59 is interposed between the dummy gate electrode 56 and the epitaxial layer 17. The insulating film 59 may be formed integrally with the gate insulating film 22.

A plurality of p type regions 24 are formed in a surficial portion of the epitaxial layer 17, and more specifically, may be provided as a semiconductor layer formed through ion implantation of p type impurities into the $n^-$ type epitaxial layer 17. Examples of the p type impurities include those as mentioned above. The p type regions 24 may also have an impurity concentration of, for example, about $1.0\times10^{15}$ $cm^{-3}$ to $1.0\times10^{19}$ $cm^{-3}$, which may be equal to that of the body regions 19. The p type regions 24 each have, for example, a rectangular shape in a plan view extending in the Y direction. The p type regions 24 are also arranged on the outside of the second element structures 40 in the second element region 42.

The p type contact region 25 has, for example, a quadrilateral shape in a plan view extending in the Y direction and is formed selectively in a surficial portion of each body region 24. This causes the closed annular-shaped p type region 24 to be exposed around the p type contact region 25. The p type contact region 25 may be formed through selective ion implantation of p type impurities into the p type region 24. Examples of the p type impurities include those as mentioned above. The p type contact region 25 may also have an impurity concentration of, for example, about $5.0\times10^{17}$ $cm^{-3}$ to $1.0\times10^{19}$ $cm^{-3}$, which is higher than that of the p type region 24 and may be equal to that of the body contact region 21.

The insulating film 26 may be composed of, for example, a silicon oxide film, a silicon nitride film, a silicon oxynitride film, a hafnium oxide film, an alumina film, a tantalum oxide film, etc. The floating electrode 27 may also be composed of polysilicon that is formed through impurity implantation. The insulating film 26 covers the exposed portion of the closed annular-shaped p type region 24, and the floating electrode 27 is formed on the insulating film 26 in a closed annular shape. The floating electrode 27 is an electrically floating conductive layer.

The interlayer insulating film 28 is formed on the epitaxial layer 17. The interlayer insulating film 28 covers the gate electrode 23, the dummy gate electrode 56, and the floating electrode 27. The interlayer insulating film 28 may be composed of an insulating material such as a silicon oxide film, a silicon nitride film, or a TEOS (tetraethoxysilane).

The interlayer insulating film 28 is formed with a first contact hole 53 through which the body contact region 21 and the source region 20 of the MISFET are exposed, a second contact hole 54 through which the p type contact region 25 is exposed, and a third contact hole 60 through which the dummy gate electrode 56 is exposed. The first contact hole 53 penetrates the interlayer insulating film 28 and the gate insulating film 22.

The above-mentioned electrode film 1 is formed on the interlayer insulating film 28. The electrode film 1 may be composed of aluminum or other metal. The source electrode film 2 is shown in FIGS. 4 and 5. It is noted that the source electrode film 2 may be referred to simply as a source electrode.

The source electrode film 2 is connected to the body contact region 21 and the source region 20 within the first contact hole 53 as shown in FIGS. 4 and 5, connected to the p type contact region 25 within the second contact hole 54 as shown in FIG. 5, and connected to the dummy gate electrode 56 within the third contact hole 60 as shown in FIGS. 4 and 5.

The source electrode film 2 thus connects in parallel the body region 19 and the source region 20 of the element structure that can serve as a MISFET (active cell that allows current to flow between drain and source) and the dummy gate electrode 56 as well as the p type region 24 that cannot serve as a MISFET (non-active cell that does not allow current to flow between drain and source). It is noted that the gate electrode film 3 is connected to the gate electrode 23 at respective positions not shown.

A drain electrode 55 is formed on the second surface 30 of the semiconductor substrate 16. The drain electrode 55 may be composed of aluminum or other metal. The drain electrode 55 is electrically connected to the drift region 31 via the semiconductor substrate 16.

<<Method for Manufacturing Semiconductor Device A1>>

FIGS. 6A to 6G are views showing process steps for manufacturing a semiconductor device A1 in the order of steps.

In order to manufacture the semiconductor device A1, referring first to FIG. 6A, an initial base layer 61 is formed on a semiconductor substrate 16 through epitaxial growth. Next, p type impurities 62 are implanted selectively at positions where column layers 18 are to be formed in the surface of the initial base layer 61.

Referring next to FIG. 6B, multiple layers of n type semiconductor layers 63 are laminated on the initial base layer 61 through multi-epitaxial growth in which the step of forming an n type semiconductor layer 63 is repeated while p type impurities 62 are implanted selectively at positions where column layers 18 are to be formed.

Figure 6C:
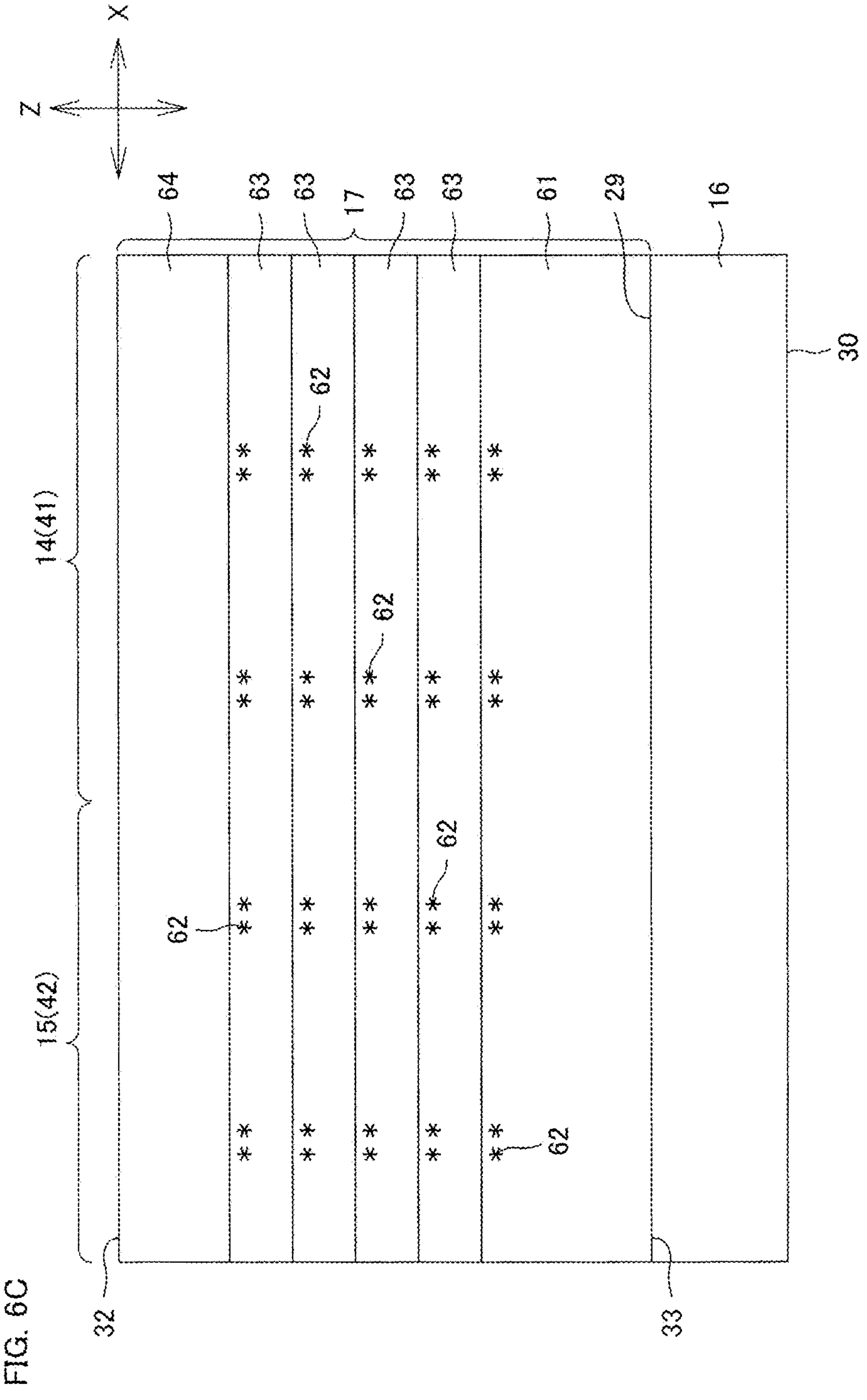
FIG. 6C is a view showing a step following FIG. 6B.

Referring further to FIG. 6C, an n type semiconductor layer 64 is laminated as an uppermost layer with no implantation of p type impurities. The plurality of n type semiconductor layers 63, 64 and the initial base layer 61 are thus integrated to form an epitaxial layer 17 (drift region 31). At this time, the impurity concentration when the n type semiconductor layer 64 is grown as an uppermost layer is higher than the impurity concentration when the n type semiconductor layers 63 under the uppermost n type semiconductor layer 64 are grown. Thus, a first portion 47 and a second portion 48 of the drift region 31 can be formed.

Figure 6D:
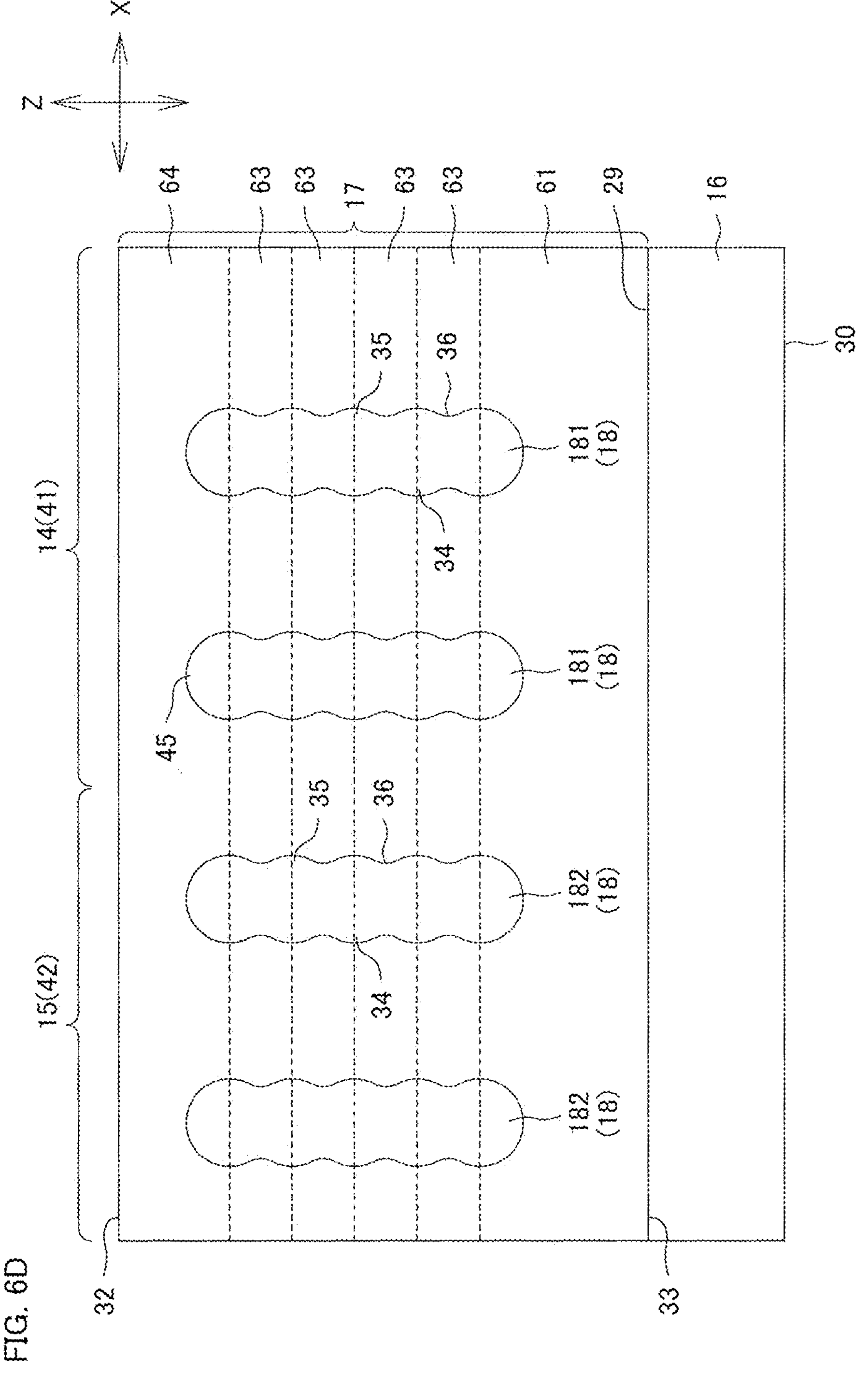
FIG. 6D is a view showing a step following FIG. 6C.

Referring next to FIG. 6D, p type impurities in the initial base layer 61 and the plurality of n type semiconductor layers 63, 64 are drive-diffused through annealing treatment (1000° C. to 1200° C.). This causes column layers 18 to be formed within the epitaxial layer 17.

Figure 6E:
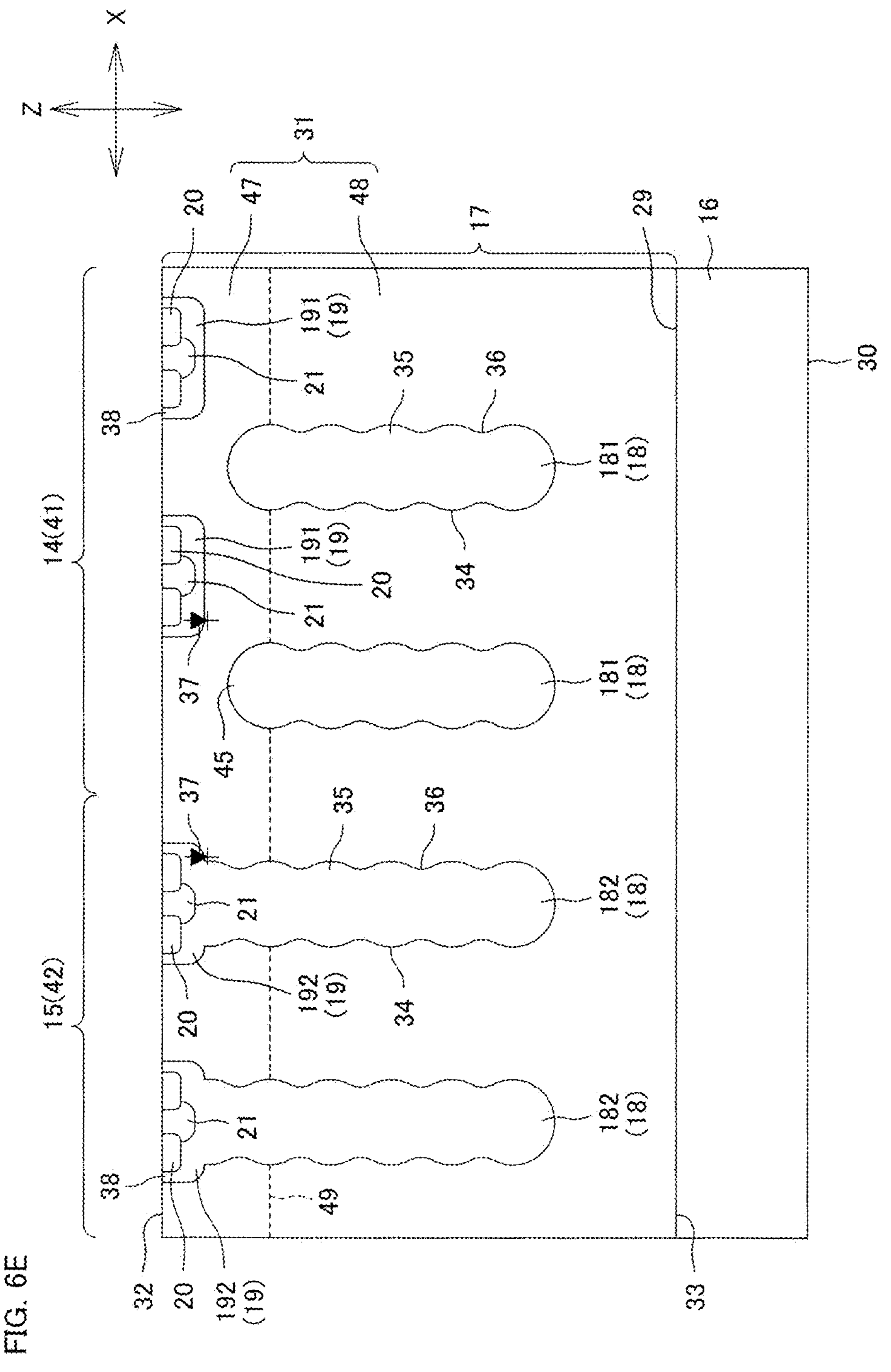
FIG. 6E is a view showing a step following FIG. 6D.

Referring next to FIG. 6E, p type impurities are implanted selectively into a surficial portion of the epitaxial layer 17 to form body regions 19 and p type regions 24 (not shown). The body regions 19 (second body regions 192) are connected to second column layers 182 in the second element region 42. Next, n type impurities are implanted selectively into a surficial portion of each body region 19 to form source regions 20. Next, p type impurities are implanted selectively into a surficial portion of each body region 19 and a surficial portion of each p type region 24 to form body contact regions 21 and p type contact regions 25 (not shown).

Figure 6F:
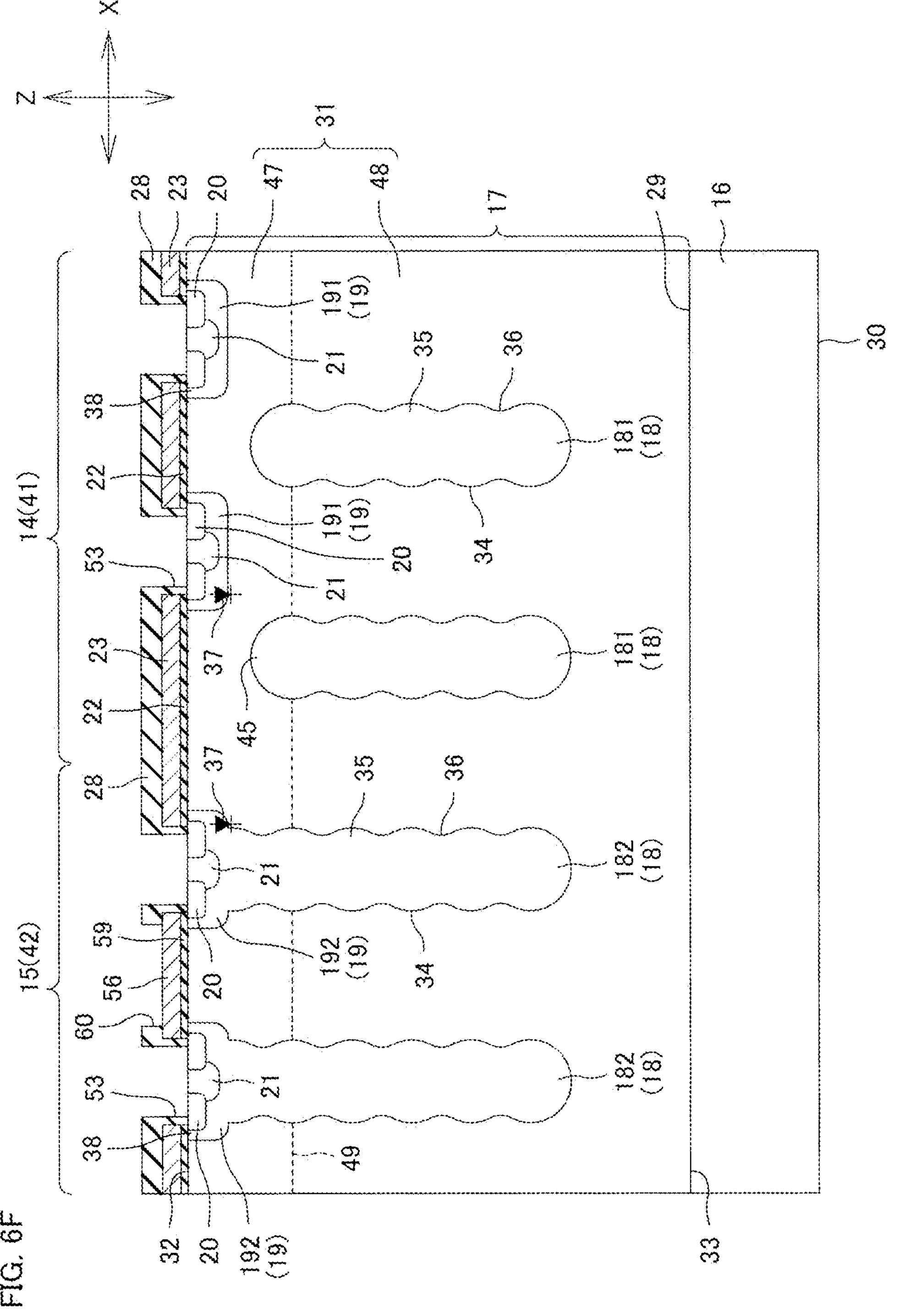
FIG. 6F is a view showing a step following FIG. 6E.

Referring next to FIG. 6F, a gate insulating film 22, an insulating film 26 (not shown), and an insulating film 59 are formed on the epitaxial layer 17. The gate insulating film 22, the insulating film 26, and the insulating film 59 may be formed by growing an oxide film through thermal oxidation of the semiconductor crystal surface and then patterning the oxide film. Next, a gate electrode 23 is formed on the gate insulating film 22, a floating electrode 27 (not shown) is formed on the insulating film 26, and a dummy gate electrode 56 is formed on the insulating film 59. The gate electrode 23, the floating electrode 27, and the dummy gate electrode 56 may be formed by, for example, forming a polysilicon film with impurities added thereto on the entire surface and then selectively etching the polysilicon film through photolithography. Next, an interlayer insulating film 28 is formed so as to cover the gate electrode 23, the floating electrode 27, and the dummy gate electrode 56. Next, first contact holes 53, second contact holes 54 (not shown), and third contact holes 60 are formed in the interlayer insulating film 28 through photolithography.

Figure 6G:
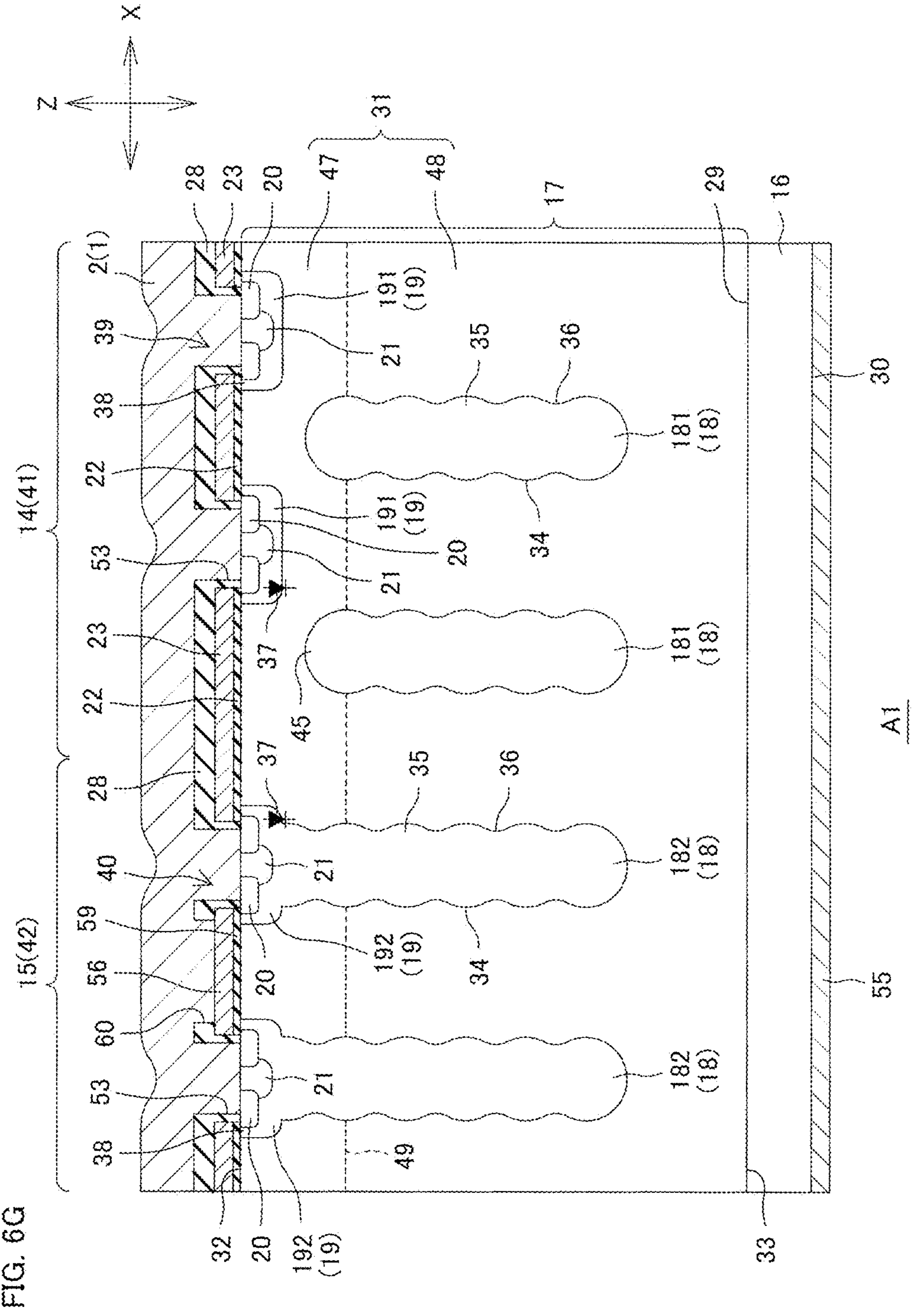
FIG. 6G is a view showing a step following FIG. 6F.

Referring next to FIG. 6G, the semiconductor substrate 16 is ground and flattened on the second surface 30. The amount of grinding is not particularly limited, but is preferably set such that the semiconductor substrate 16 has a thickness of 90 μm to 310 μm after grinding, for example. Next, a source electrode film 2 and a gate electrode film 3 (not shown) are formed on the interlayer insulating film 28. Next, a passivation film 9 (not shown) is formed so as to cover the source electrode film 2 and the gate electrode film 3. Next, pad openings 10, 11 (not shown) are formed in the passivation film 9 through photolithography.

Thereafter, a drain electrode 55 is formed on the second surface 30 of the semiconductor substrate 16, whereby the above-mentioned semiconductor device A1 can be obtained.

<<Operas and Effects of Semiconductor Device A1>>

First, an operation of the MISFET of the semiconductor device A1 will be described. When the drain electrode 55 is connected to an electric potential higher than that of the source electrode film 2 and a control voltage equal to or higher than a threshold voltage is applied to the gate electrode 23, an inversion layer (channel) is formed in the body region 19 (channel region 38). This causes a current path to be formed between the source region 20 and the drift region 31. When the gate electrode 23 is applied with no control voltage, no inversion layer is generated, so that the current path between the source and the drain is blocked. The parasitic diode 37 between the body region 19 and the drift region 31 is turned on when a forward voltage is applied, while it is turned off when a reverse voltage is applied. When the parasitic diode 37 is turned off, a reverse recovery phenomenon occurs. This causes a current to flow, which is called a reverse recovery current. Carrier migration causes a depletion layer to extend from the pn junction, whereby the parasitic diode 37 is turned off.

In this preferred embodiment, the first column layer 181 is separated from the first body region 191 to electrically float with respect to the first body region 191 in the first element structure 39. Accordingly, the first column layer 181 does not contribute to the operation of the parasitic diode 37, which suppresses steep extension of the depletion layer during the reverse recovery phenomenon. This suppresses extension of the depletion layer extending in the Z direction of the epitaxial layer 17 and thereby suppresses the rate of extension of the depletion layer when the parasitic diode 37 is turned off.

Figure 7:
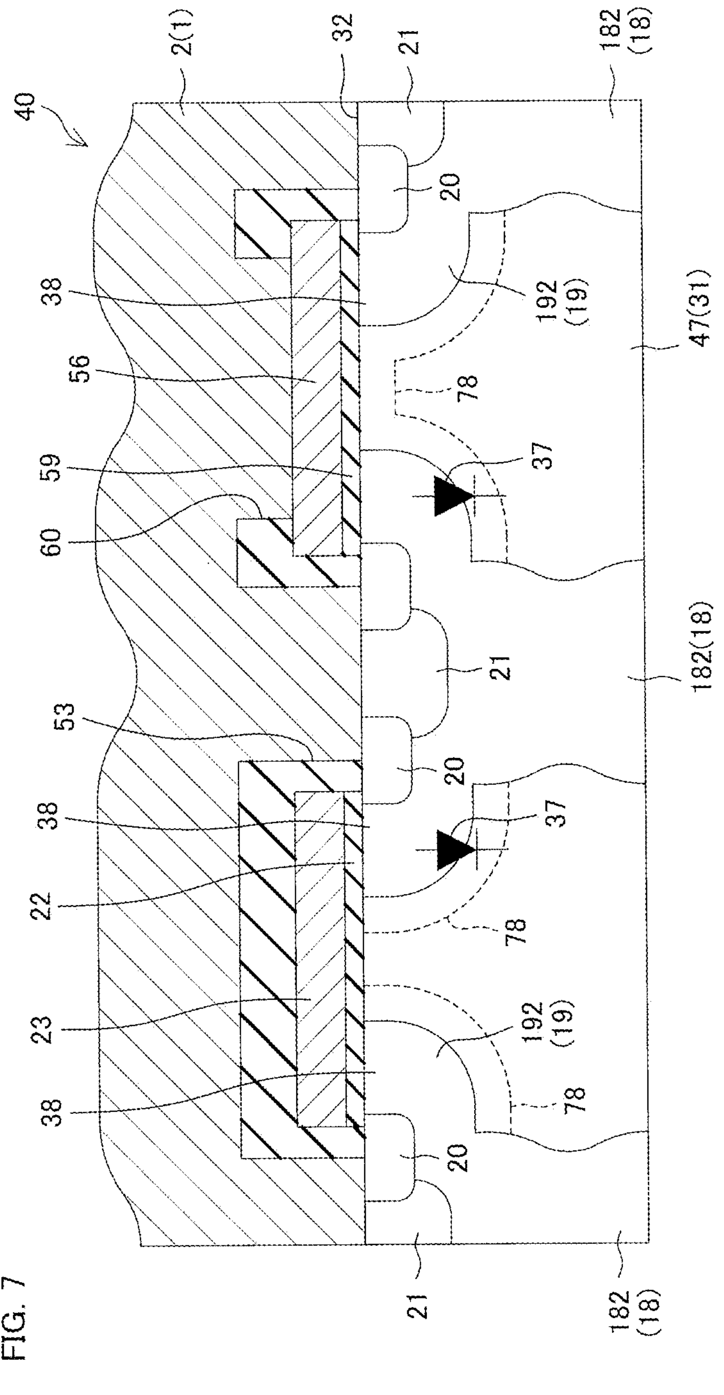
FIG. 7 is a view showing a state (simulation) of depletion of the outermost surface of an epitaxial layer.

On the other hand, since the source electrode film 2 is connected to the dummy gate electrode 56 in the second element structure 40, the density of holes in the $n^-$ type drift region 31 in the first surface 32 of the epitaxial layer 17 decreases locally when the parasitic diode 37 is turned off. This facilitates extension of the depletion layer from the first surface 32 of the epitaxial layer 17, and thereby allows the timing of extension of the depletion layer from the first surface 32 of the epitaxial layer 17 to be accelerated. This allows the depletion layer to extend gradually from the first surface 32 of the epitaxial layer 17. More specifically, the hole density distribution when the outermost surface (first surface 32) of the epitaxial layer 17 starts to deplete was confirmed by a simulation, and FIG. 7 is a view showing a result of the simulation. FIG. 7 shows that no depletion layer 78 is formed, i.e., no depletion has started in the first surface 32 of the $n^-$ type drift region 31 opposing the gate electrode 23, while a depletion layer 78 is formed in the first surface 32 of the $n^-$ type drift region 31 opposing the dummy gate electrode 56. That is, it is found that the timing of extension of the depletion layer 78 can be accelerated in the first surface 32 of the $n^-$ type drift region 31 opposing the dummy gate electrode 56.

Thus combining the advantageous effects of both the first element structure 39 and the second element structure 40 suppresses extension of the depletion layer in the Z direction of the epitaxial layer 17 and thereby suppresses the rate of extension of the depletion layer when the parasitic diode 37 is turned off. This reduces the rate of change in the reverse recovery current (dir/dt) to thereby improve the recovery characteristics. The parasitic capacitance characteristics can also be improved.

For example, a simulation was performed for the structure of the semiconductor device A1 and for a semiconductor device B1. In the semiconductor device B1, no dummy gate electrode 56 is formed and the first element structure 39 employs a structure in which the column layer 18 is connected to the body region 19 as with the second column layer 182. It could be confirmed from results of the simulation that the structure of semiconductor device A1 is effective in reducing Crss (feedback capacitance) and Qgd (gate-drain charge amount) and also improving the capacitance ratio and the reverse recovery time (trr).

Figure 8:
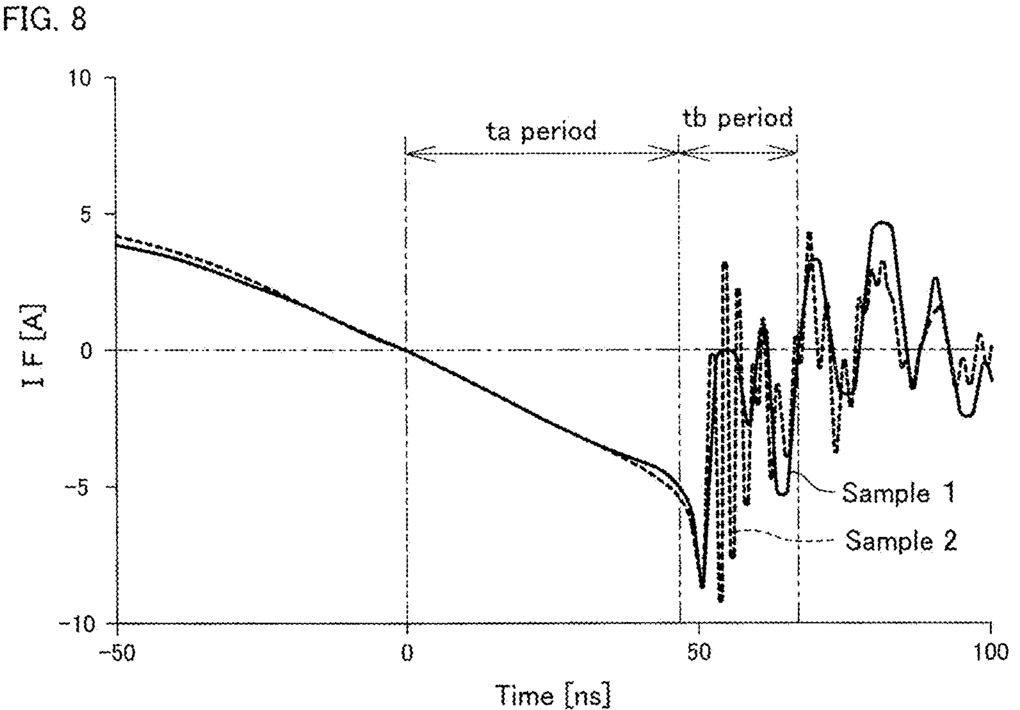
FIG. 8 is a view for comparing recovery characteristics between sample 1 and sample 2.

Next, how the structure of the above-mentioned semiconductor device A1 can improve the recovery characteristics was verified through experiments. FIG. 8 is a view for comparing the recovery characteristics between sample 1 and sample 2.

Sample 1 is an example having a dummy gate electrode 56, and in which the first element structure 39 of the semiconductor device A1 employs a structure in which the first column layer 181 is separated from the body region 19. On the other hand, sample 2 is an example having no dummy gate electrode 56, and in which the first element structure 39 of the semiconductor device A1 employs a structure in which the column layer 18 is connected to the body region 19 as with the second column layer 182. It is noted that the drift region 31 was applied with He irradiation for both sample 1 and sample 2.

In FIG. 8, the waveforms of recovery currents for sample 1 and sample 2 are superimposed. FIG. 8 shows that the ringing noise during the tb period for sample 1 is improved significantly compared to sample 2.

Further, in the semiconductor device A1, the first column layer 181 is separated from the first body region 191 in a horizontal direction along the first surface 32 of the epitaxial layer 17. That is, since the first body region 191 is not formed on an extension of the first column layer 181 in the Z direction of the epitaxial layer 17, the first column layer 181 cannot come into contact with the first body region 191 even if the first column layer 181 may be brought closer to the first surface 32. It is therefore possible to suppress an increase in the thickness of the epitaxial layer 17 as a result of providing spacing between the first column layer 181 and the first body region 191 and thereby suppress the current flowing in the Z direction of the drift region 31 from having an increased ON-resistance.

Further, since the first portion 47 of the drift region 31, which is a region in the vicinity of the parasitic diode 37, has a relatively higher first impurity concentration, it is possible to suppress steep extension of the depletion layer in the Z direction (vertical direction) of the drift region 31 during the reverse recovery phenomenon and cause the first portion 47 to have a low resistance. On the other hand, since the second portion 48, which is closer to the second surface 33 with respect to the top portion 45 of the first column layer 181, has a second impurity concentration relatively lower than the first impurity concentration, it is possible to facilitate extension of the depletion layer from the first column layer 181 in the horizontal direction along the first surface 32 of the epitaxial layer 17 and thereby maintain the withstand voltage.

Furthermore, the semiconductor device A1 has, as the second element structure 40, a super junction structure in which the second column layer 182 extends from the second body region 192. Accordingly, by defining the spacing between second column layers 182 such that the depletion layers extending horizontally from the second column layers 182 are integrated, the inherent characteristics of the super junction structure of achieving excellent ON-resistance and switching speed can also be realized.

Second Preferred Embodiment

Figure 9:
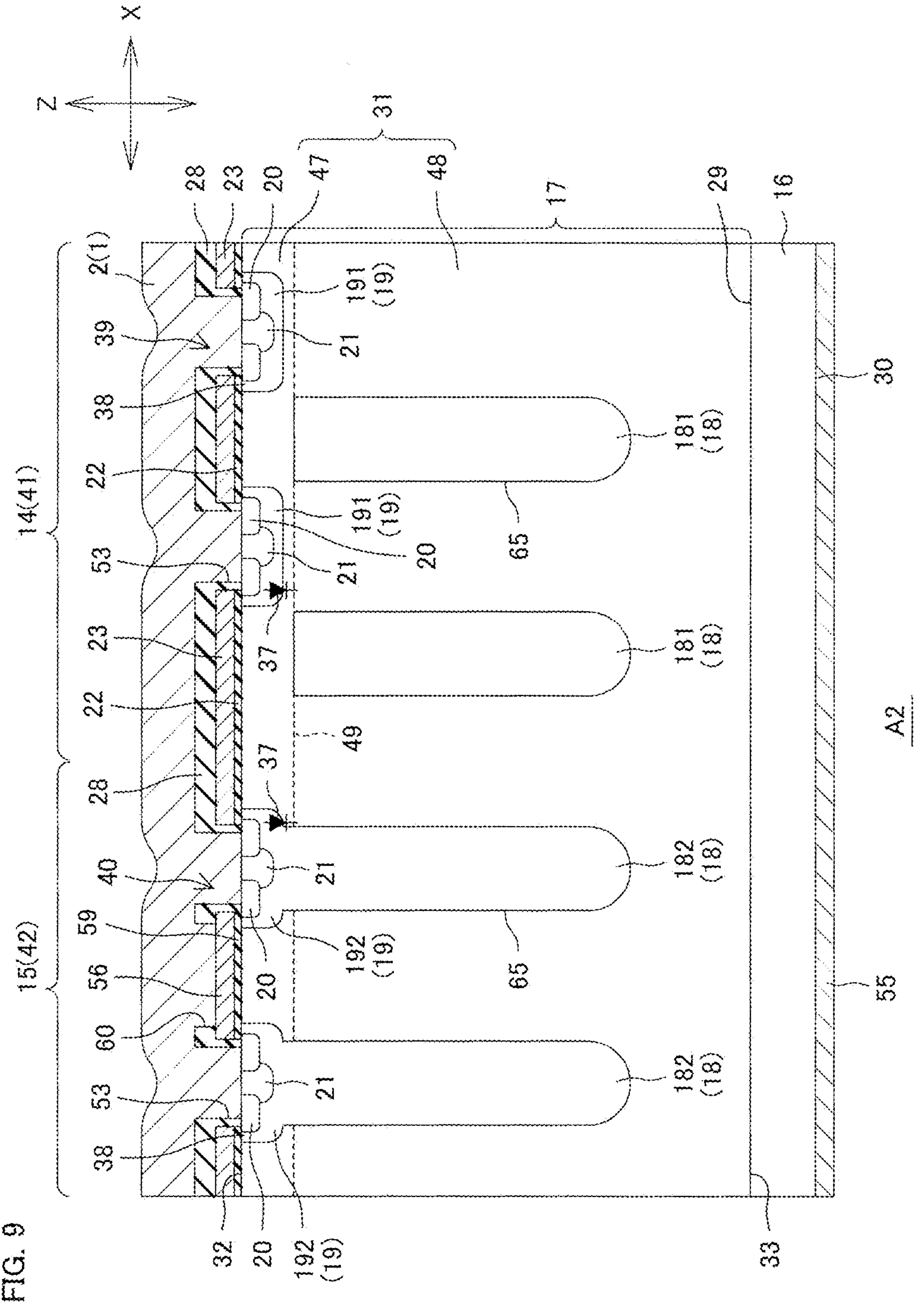
FIG. 9 is a schematic cross-sectional view of a semiconductor device according to a second preferred embodiment of the present disclosure.

FIG. 9 is a schematic cross-sectional view of a semiconductor device A2 according to a second preferred embodiment of the present disclosure.

The column layers 18 may each have a concavo-convex side surface 34 as in the first preferred embodiment or, alternatively, may have a flat side surface 65 as with the semiconductor device A2. In this case, the semiconductor device A2 may be manufactured through, for example, steps shown in FIGS. 10A to 10D.

Figure 10A:
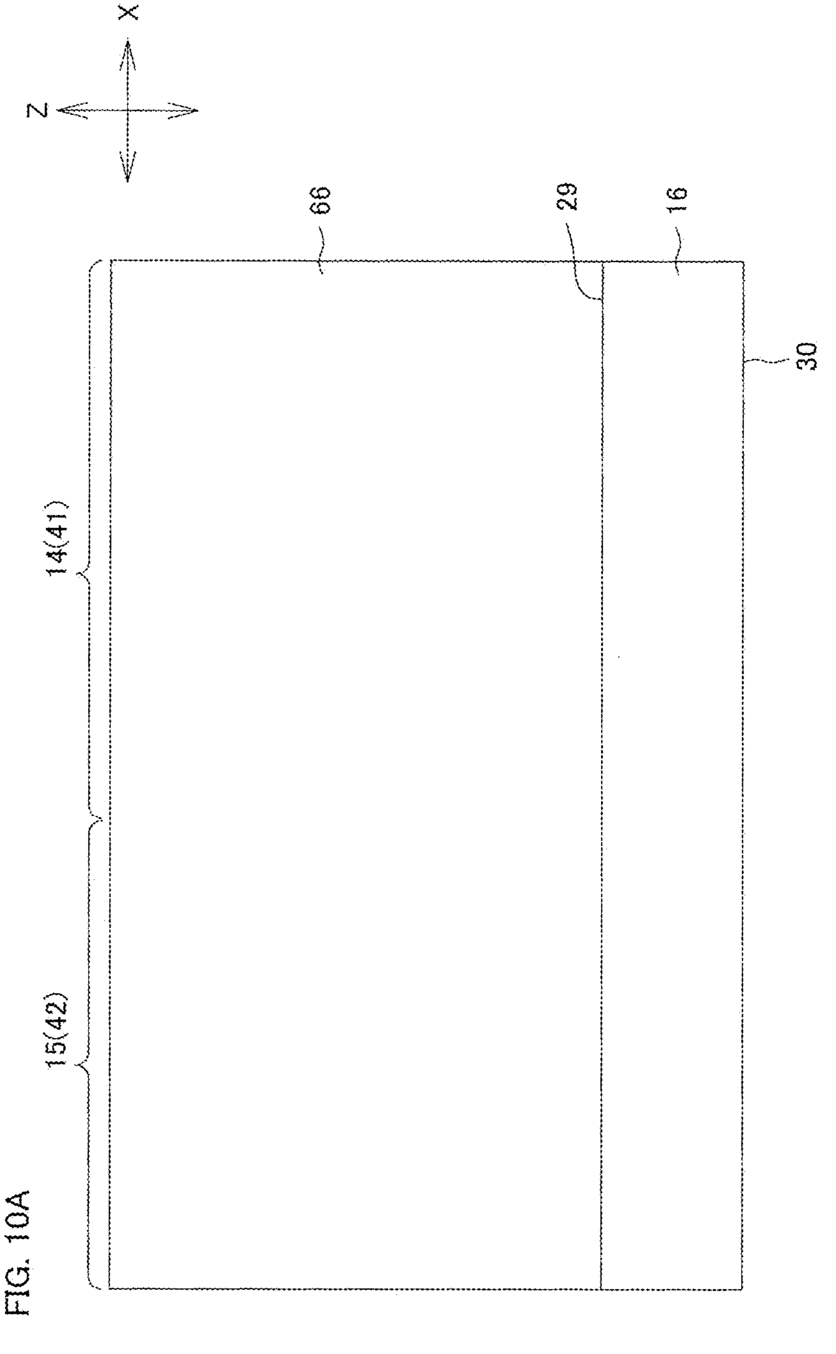
FIG. 10A is a view showing a process step for manufacturing the semiconductor device in FIG. 9.

In order to manufacture the semiconductor device A2, referring first to FIG. 10A, an initial base layer 66 is formed on a semiconductor substrate 16 through epitaxial growth.

Figure 10B:
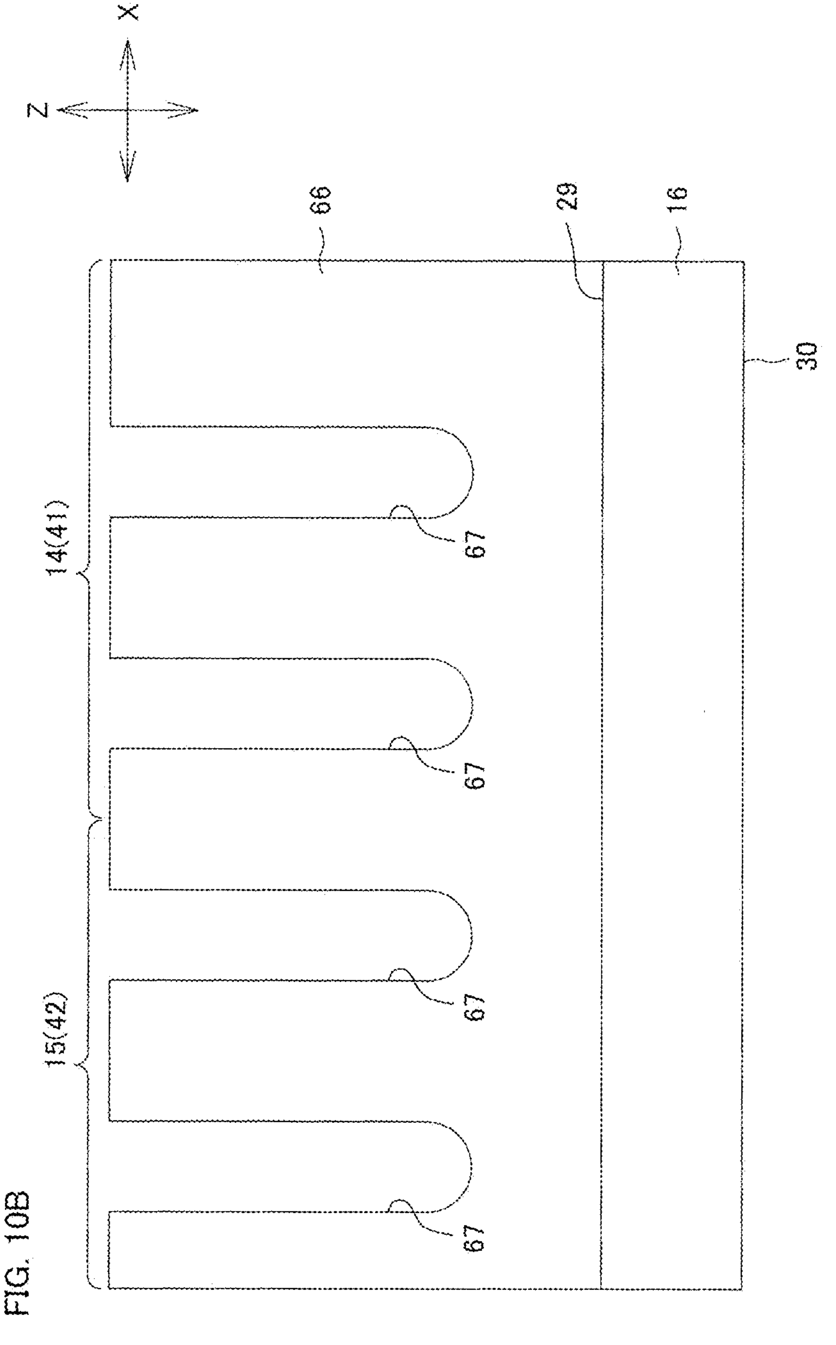
FIG. 10B is a view showing a step following FIG. 10A.

Referring next to FIG. 10B, regions in which column layers 18 are to be formed are removed selectively through etching in the initial base layer 66. This causes trenches 67 (more specifically, deep trenches) to be formed.

Figure 10C:
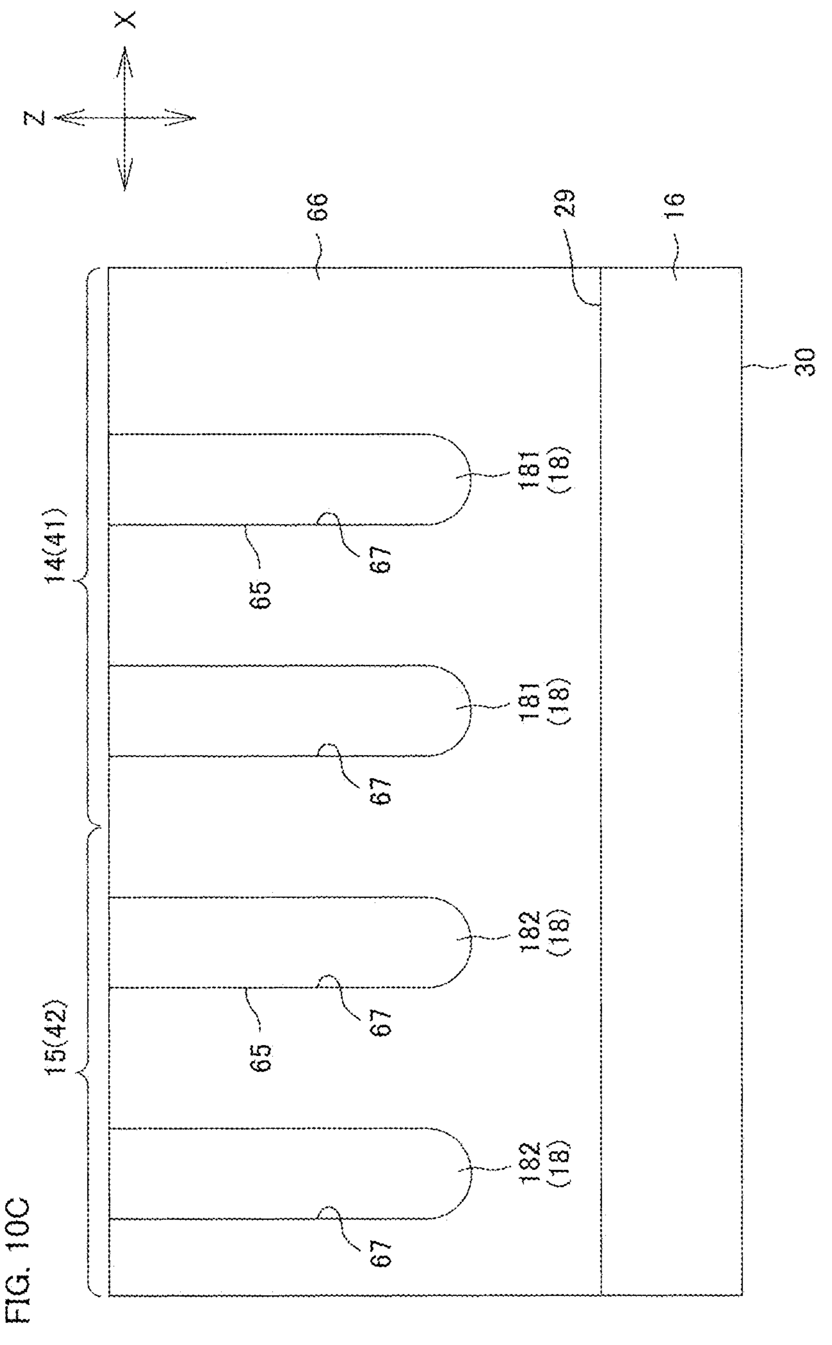
FIG. 10C is a view showing a step following FIG. 10B.

Referring next to FIG. 10C, the trenches 67 are backfilled with a semiconductor layer while p type impurities are implanted. This causes column layers 18 to be formed in the initial base layer 66.

Figure 10D:
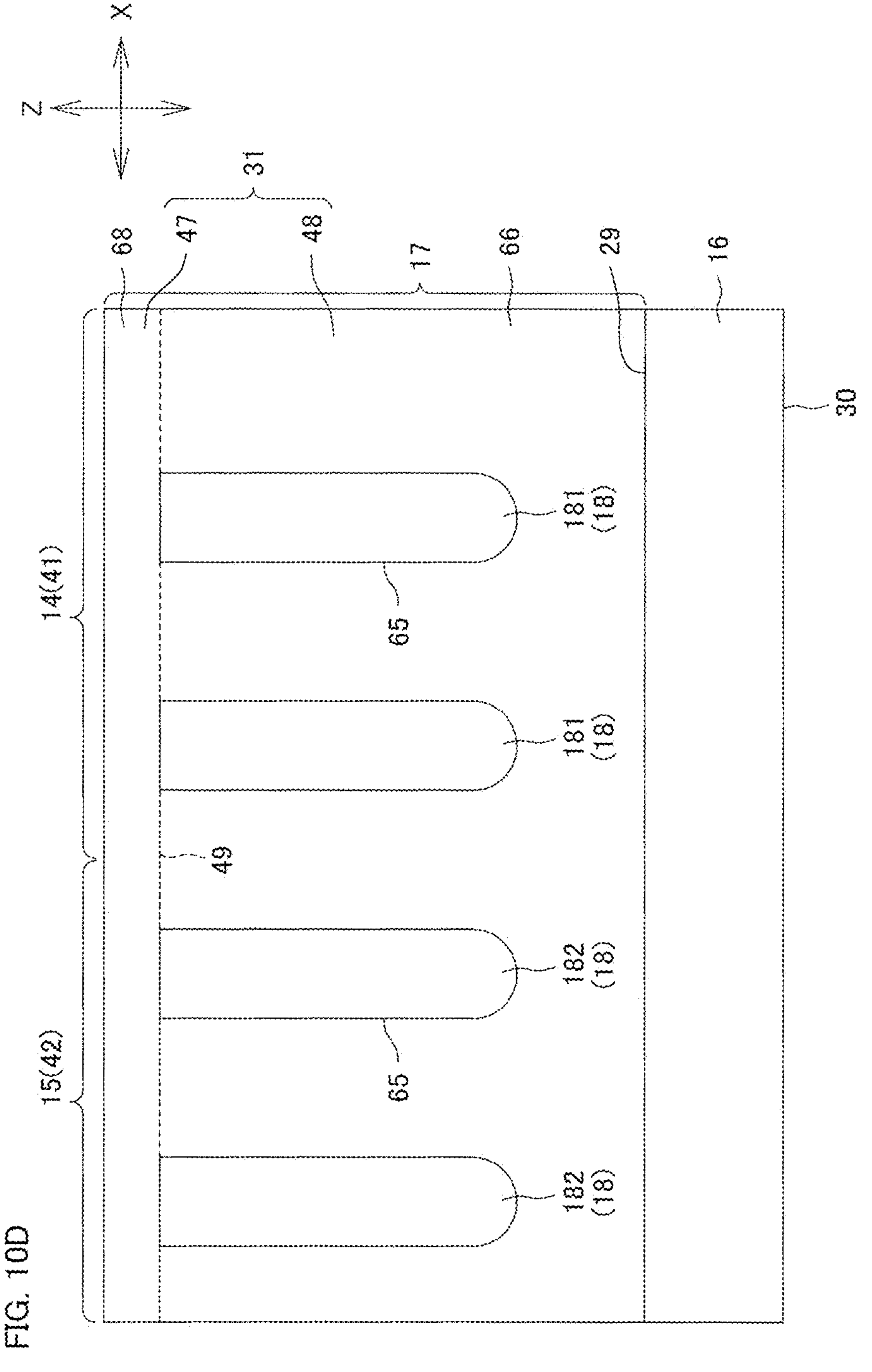
FIG. 10D is a view showing a step following FIG. 10C.

Referring next to FIG. 10D, an n type semiconductor layer 68 is laminated on the initial base layer 66 with no implantation of p type impurities. The n type semiconductor layer 68 and the initial base layer 66 are thus integrated to form an epitaxial layer 17 (drift region 31). At this time, the impurity concentration when the n type semiconductor layer 68 is grown is higher than the impurity concentration when the initial base layer 66 is grown. Thus, a first portion 47 and a second portion 48 of the drift region 31 can be formed.

Thereafter, the same steps as in FIGS. 6E to 6G are followed, whereby the semiconductor device A2 can be obtained.

Third Preferred Embodiment

Figure 11:
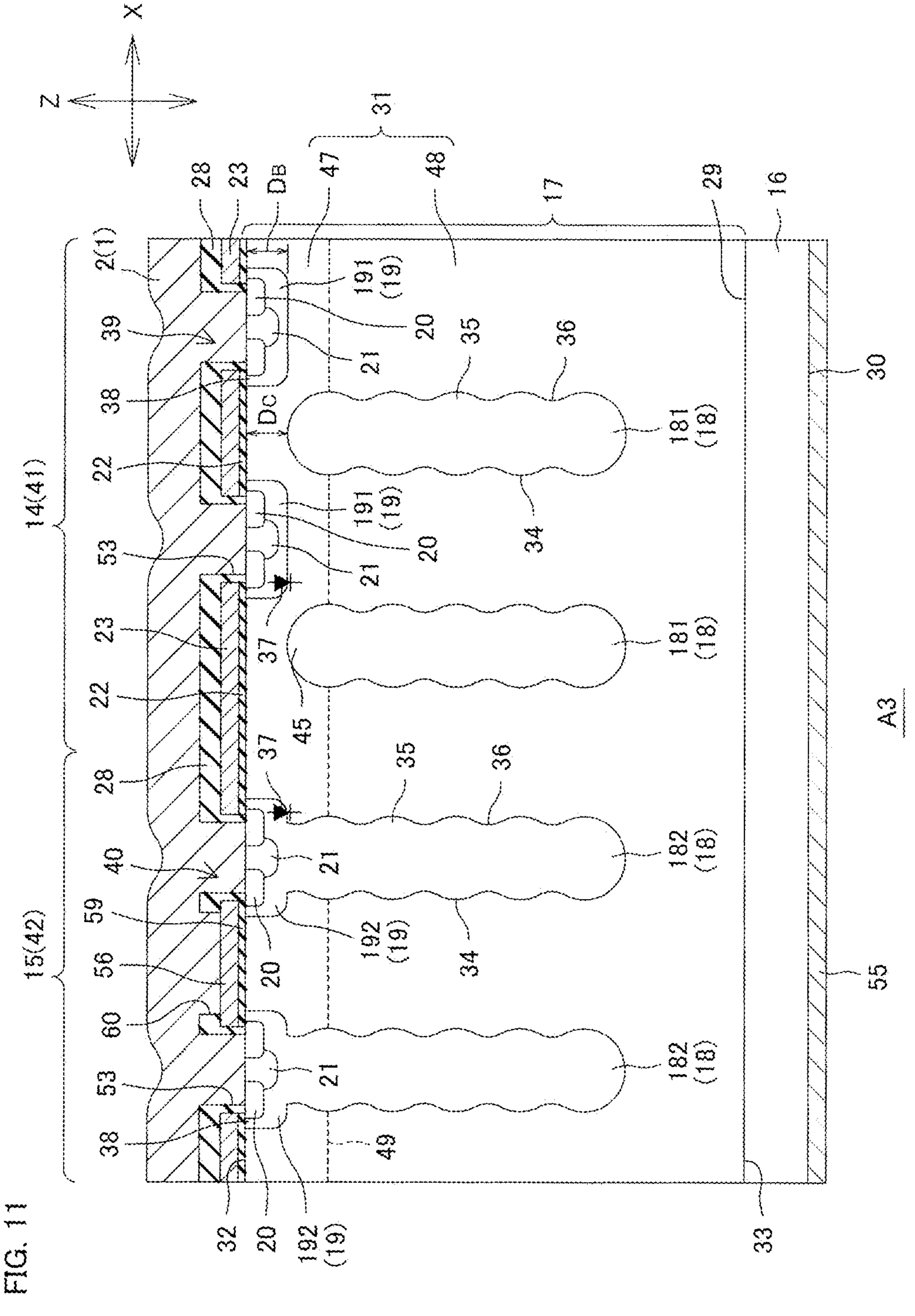
FIG. 11 is a schematic cross-sectional view of a semiconductor device according to a third preferred embodiment of the present disclosure.

FIG. 11 is a schematic cross-sectional view of a semiconductor device A3 according to a third preferred embodiment of the present disclosure.

The first column layers 181 may each have a top portion 45 at a position deeper than that of the bottom portion of the first body region 191 as in the first preferred embodiment or, alternatively, may have a top portion 45 at a depth position equal to that of the bottom portion of the first body region 191 as with the semiconductor device A3. That is, the distance $D_C$ from the first surface 32 of the epitaxial layer 17 to the first column layer 181 may be equal to the distance $D_B$ from the first surface 32 to the bottom portion of the first body region 191.

Fourth Preferred Embodiment

Figure 12:
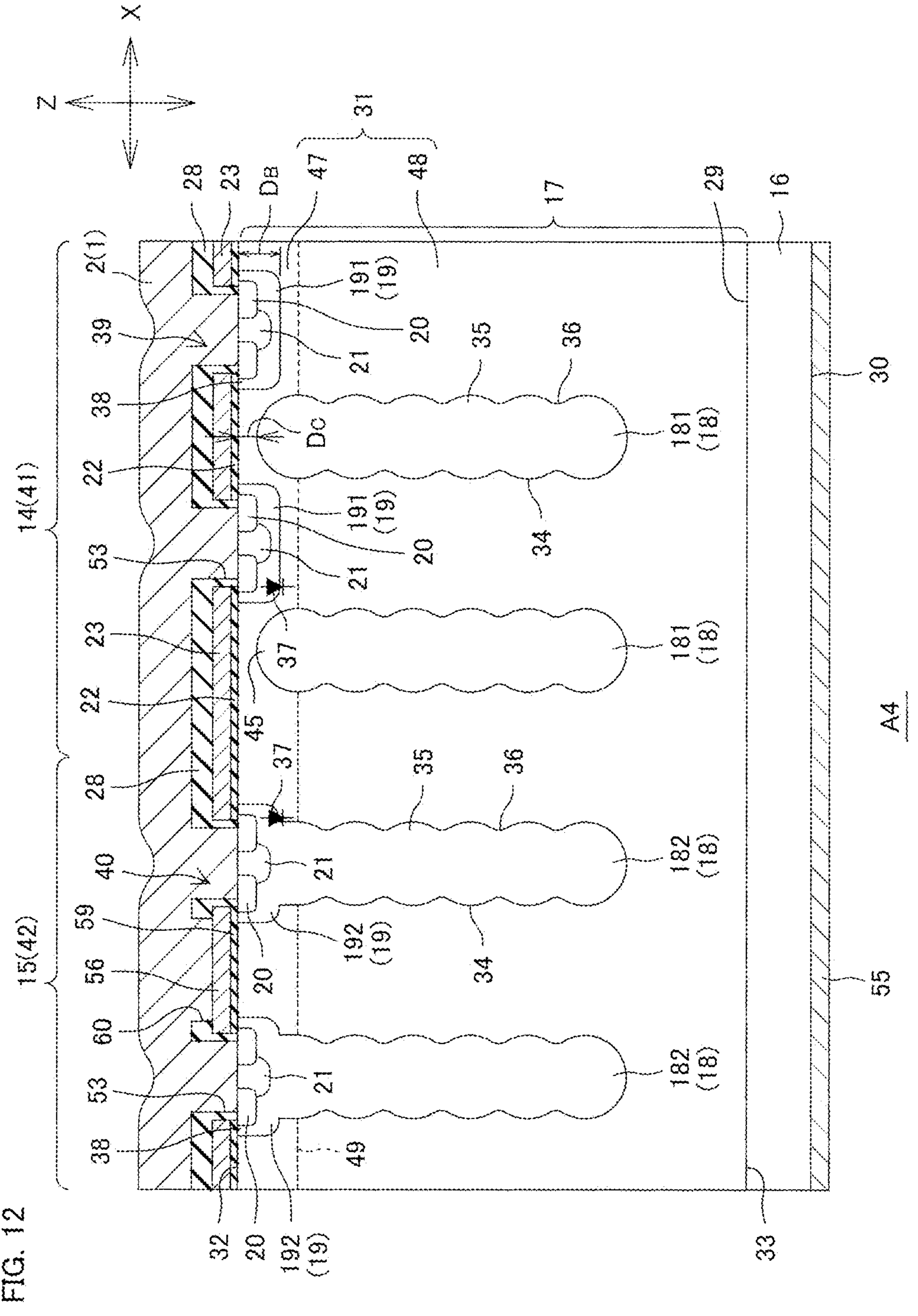
FIG. 12 is a schematic cross-sectional view of a semiconductor device according to a fourth preferred embodiment of the present disclosure.

FIG. 12 is a schematic cross-sectional view of a semiconductor device A4 according to a fourth preferred embodiment of the present disclosure.

The first column layers 181 may each have a top portion 45 at a position deeper than that of the bottom portion of the first body region 191 as in the first preferred embodiment or, alternatively, may have a top portion 45 at a position shallower than that of the bottom portion of the first body region 191 as with the semiconductor device A4. That is, the distance $D_C$ from the first surface 32 of the epitaxial layer 17 to the first column layer 181 may be shorter than the distance $D_B$ from the first surface 32 to the bottom portion of the first body region 191.

Fifth Preferred Embodiment

Figure 13:
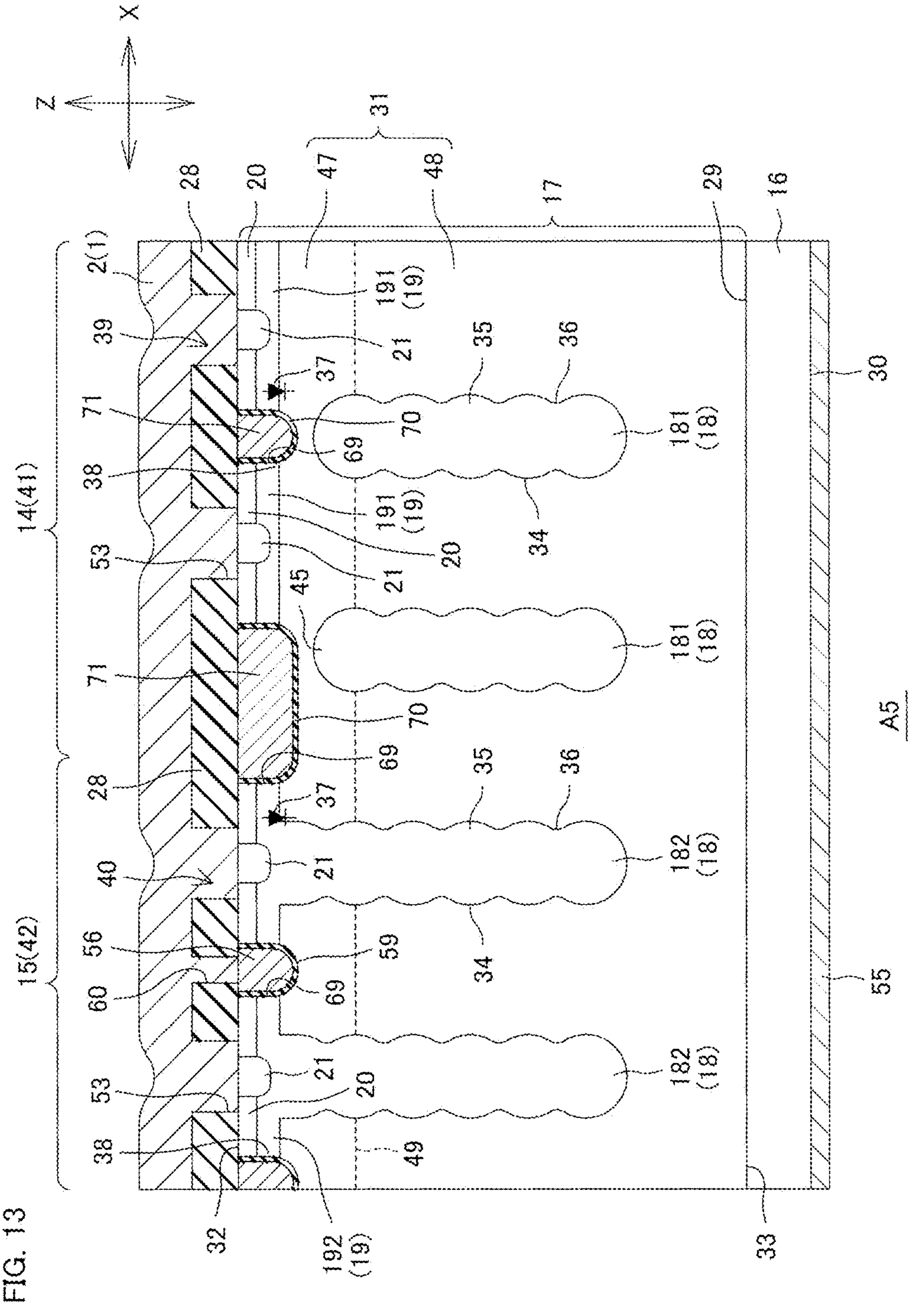
FIG. 13 is a schematic cross-sectional view of a semiconductor device according to a fifth preferred embodiment of the present disclosure.

FIG. 13 is a schematic cross-sectional view of a semiconductor device A5 according to a fifth preferred embodiment of the present disclosure.

The element structure of the semiconductor device A5 may be a planar gate structure as in the first preferred embodiment or, alternatively, may be a trench gate structure as with the semiconductor device A5.

The semiconductor device A5 includes a gate trench 69, a gate insulating film 70, and a gate electrode 71.

The gate trench 69 penetrates the source region 20 and the body region 19 from the first surface 32 of the epitaxial layer 17. The gate insulating film 70 is formed on the interior surface of the gate trench 69. The gate electrode 71 is filled, in the gate trench 69, inside the gate insulating film 70 therebetween. This forms a trench gate structure.

The first column layer 181 may be formed below the gate trench 69 and thereby separated from the first body region 191 in a direction along the first surface 32 of the epitaxial layer 17. In the semiconductor device A5, the first column layer 181 is further separated from the gate trench 69 toward the second surface 33 of the epitaxial layer 17.

Sixth Preferred Embodiment

Figure 14:
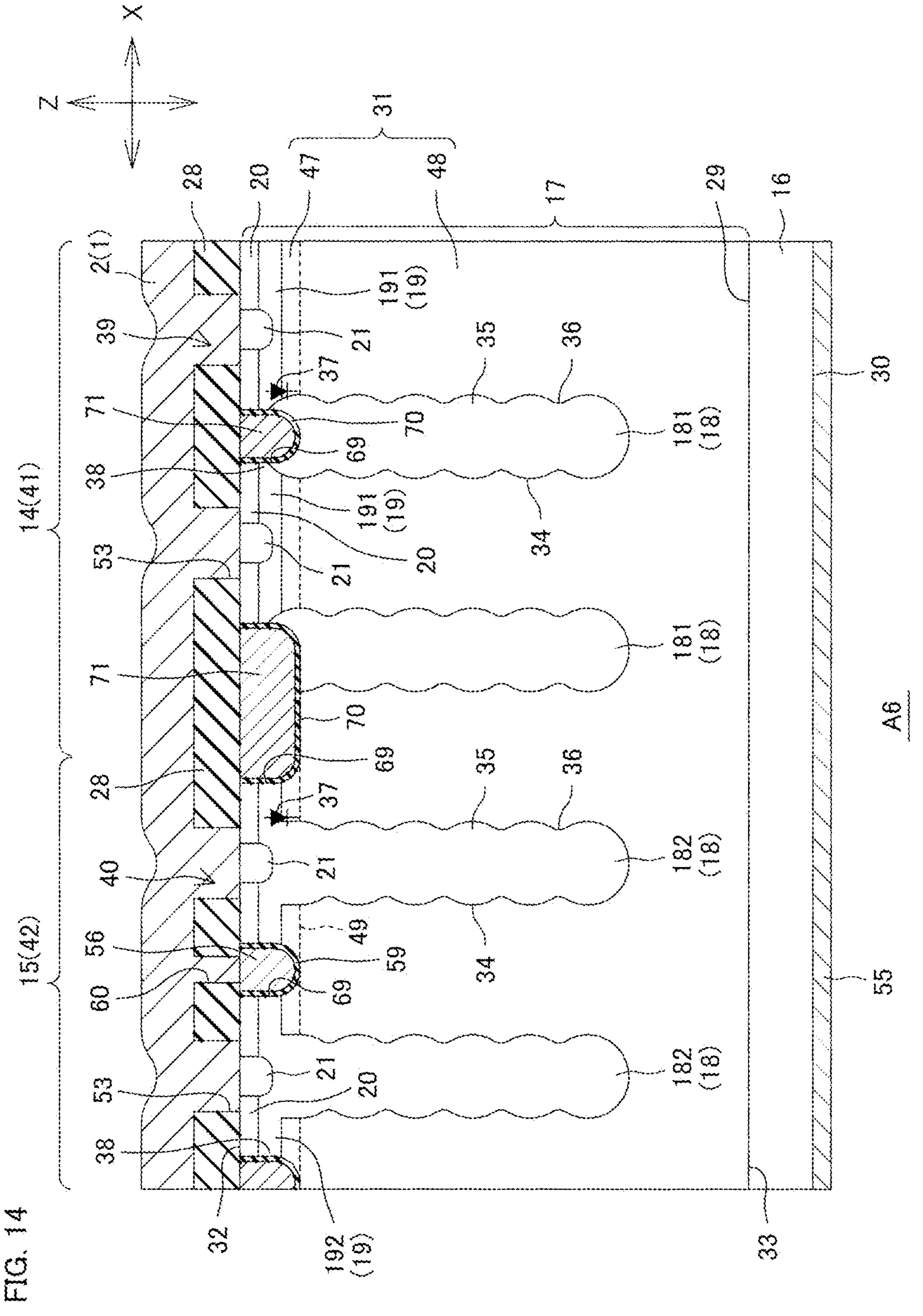
FIG. 14 is a schematic cross-sectional view of a semiconductor device according to a sixth preferred embodiment of the present disclosure.

FIG. 14 is a schematic cross-sectional view of a semiconductor device A6 according to a sixth preferred embodiment of the present disclosure.

The first column layer 181 may be separated from the gate trench 69 as in the fifth preferred embodiment or, alternatively, may be in contact with the gate trench 69 as with the semiconductor device A6. More specifically, the first column layer 181 may be formed continuously to a bottom portion of the gate trench 69 and extend from the gate trench 69 toward the second surface 33 of the epitaxial layer 17.

Seventh Preferred Embodiment

Figure 15:
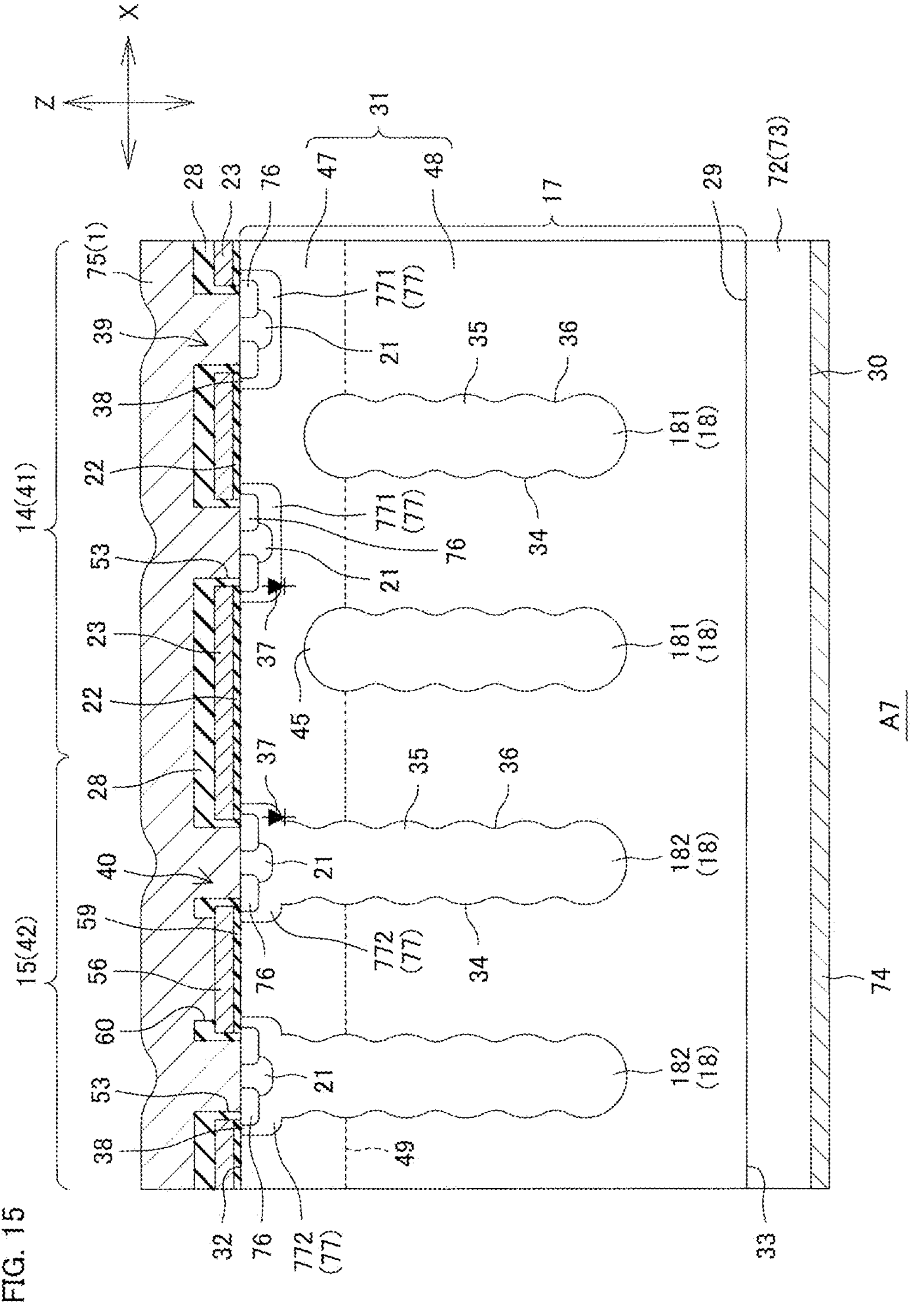
FIG. 15 is a schematic cross-sectional view of a semiconductor device according to a seventh preferred embodiment of the present disclosure.

FIG. 15 is a schematic cross-sectional view of a semiconductor device A7 according to a seventh preferred embodiment of the present disclosure.

The element structure may be a MISFET as in the above-mentioned preferred embodiments or, alternatively, may be an IGBT (Insulated Gate Bipolar Transistor) as with the semiconductor device A7. In this case, the $n^+$ type semiconductor substrate 16 may be replaced with a $p^+$ type semiconductor substrate 72 ($p^+$ type collector layer 73). Further, the drain electrode 55 and the source electrode film 2 may also be referred to, respectively, as a collector electrode 74 and an emitter electrode film 75. In addition, the $n^+$ type source region 20 and the p type body region 19 may also be referred to, respectively, as an $n^+$ type emitter region 76 and a p type base region 77 (a first base region 771 and a second base region 772).

Eighth Preferred Embodiment

<<Overall Structure of Semiconductor Device A8>>

Figure 16:
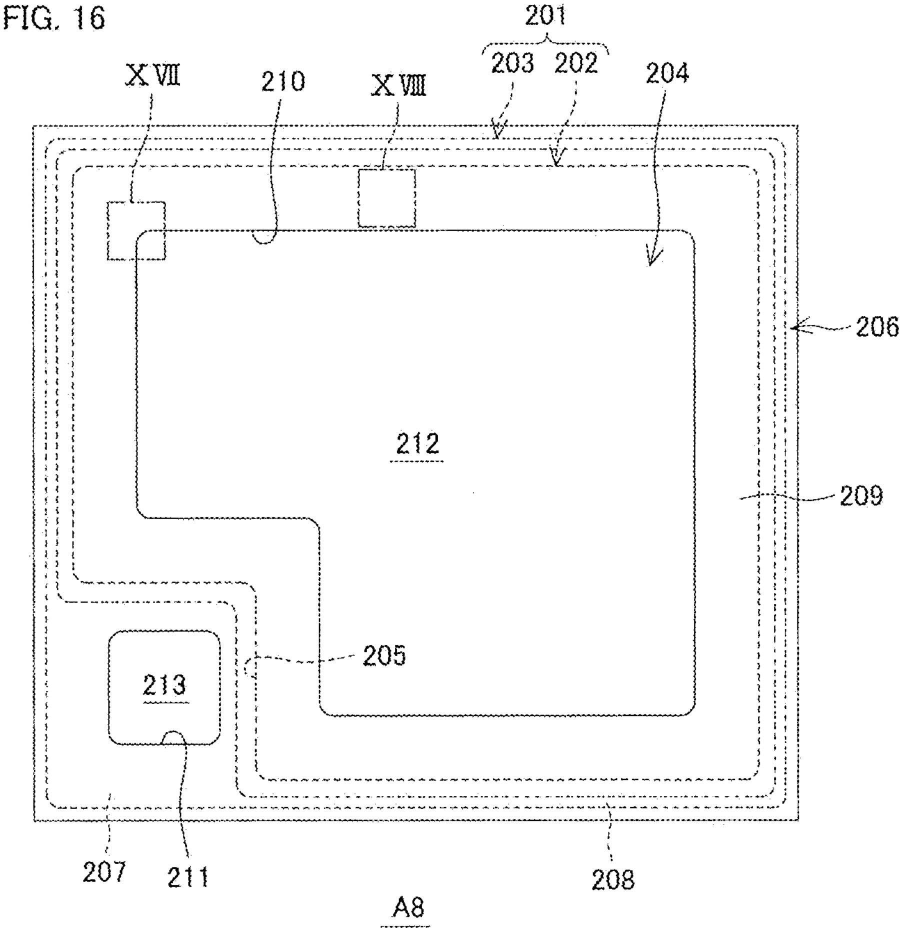
FIG. 16 is a schematic plan view of a semiconductor device according to an eighth preferred embodiment of the present disclosure.

FIG. 16 is a schematic plan view of a semiconductor device A8 according to an eighth preferred embodiment of the present disclosure.

The semiconductor device A8 has a quadrilateral shape in a plan view. The semiconductor device A8 is formed with, for example, a MISFET (Metal Insulator Semiconductor Field Effect Transistor). An electrode film 201 is formed on the surface of the semiconductor device A8. The electrode film 201 covers approximately the entire surface of the semiconductor device A8. In this preferred embodiment, the electrode film 201 includes a source electrode film 202 and a gate electrode film 203. In this preferred embodiment, the source electrode film 202 may be an example of the "first electrode" cited in the appended claims.

The source electrode film 202 is formed in a manner covering an active region 204 of the semiconductor device A8. The active regions 204 is, for example, a region in which element structures 239, 240 to be described hereinafter are formed. The source electrode film 202 is formed over approximately the entire active region 204. The source electrode film 202 is formed selectively with a recessed portion 205 in a plan view. In this preferred embodiment, the recessed portion 205 is formed at one of the corners of the semiconductor device A8.

The gate electrode film 203 is formed in an outer peripheral region 206 of the semiconductor device A8 surrounding the active region 204. The gate electrode film 203 integrally includes a pad portion 207 formed within the recessed portion 205 of the source electrode film 202 and a finger portion 208 extending from the pad portion 207 along the sides of the semiconductor device A8 in a plan view. In this preferred embodiment, the finger portion 208 is formed in a closed annular shape to surround the source electrode film 202. As a matter of course, the finger portion 208 may not necessarily have a closed annular shape. For example, the finger portion 208 may extend in parallel along two mutually opposing sides (e.g. upper and lower sides in FIG. 16) of the semiconductor device A8 and terminate at the corners of the semiconductor device A8.

The electrode film 201 is partially covered with a passivation film 209 formed on the surface of the semiconductor device A8. The passivation film 209 collectively covers the source electrode film 202 and the gate electrode film 203, and has a plurality of openings 210, 211 that expose portions of the electrode film 201 therethrough. In FIG. 16, a portion of the source electrode film 202, a portion of the pad portion 207 and the finger portion 208 of the gate electrode film 203 are indicated by a broken line, and the broken line portion corresponds to a portion covered with the passivation film 209.

A portion of the source electrode film 202 is exposed through the first pad opening 210 as a source pad 212, and a portion of the gate electrode film 203 (pad portion 207) is exposed through the second pad opening 211 as a gate pad 213. A bonding material such as a bonding wire may be bonded to each pad 212, 213 at the time of packaging of the semiconductor device A8.

Figure 17:
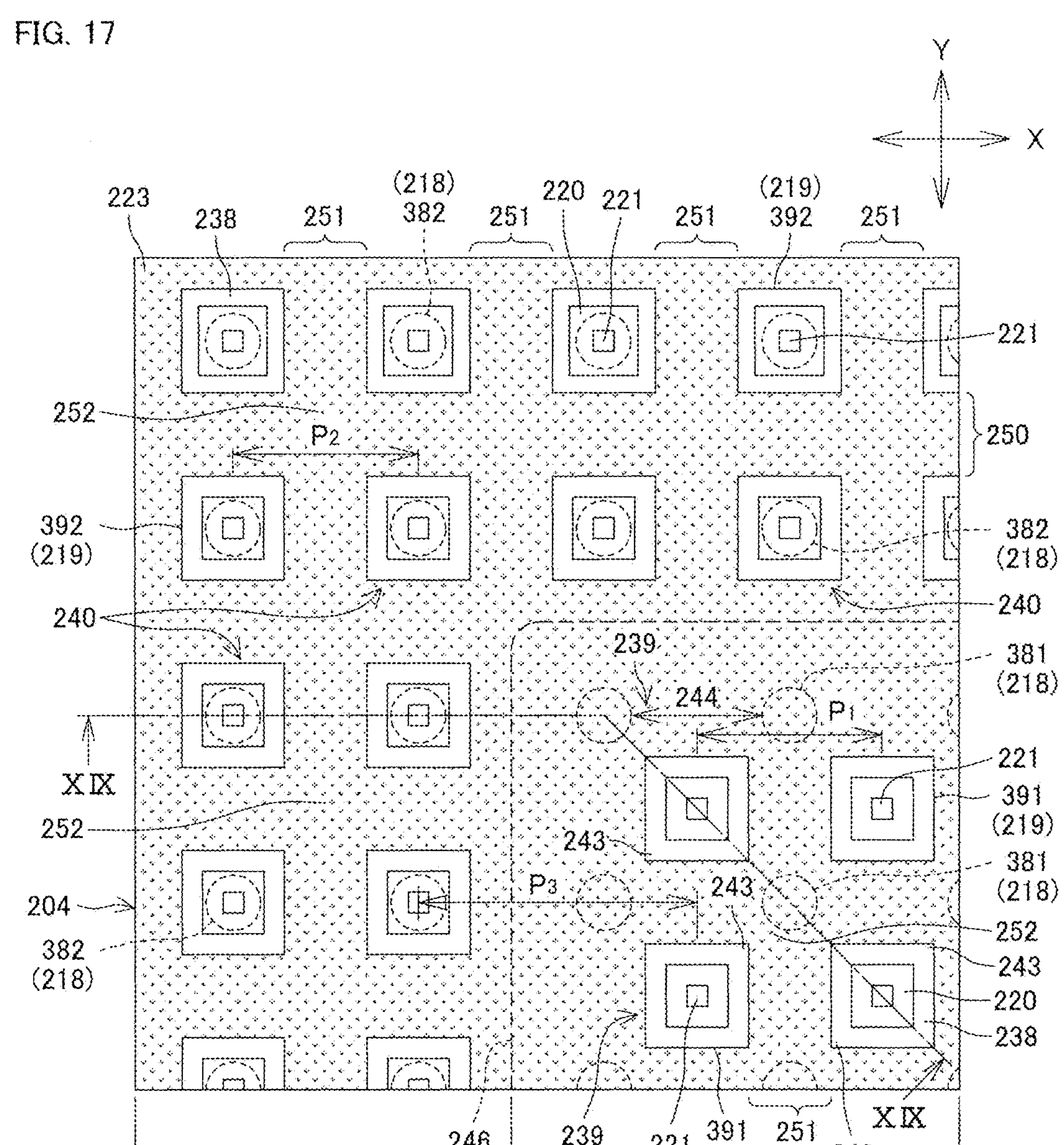
FIG. 17 is a main part enlarged view of a part surrounded by the alternate long and two short dashed line XVII in FIG. 16.
Figure 18:
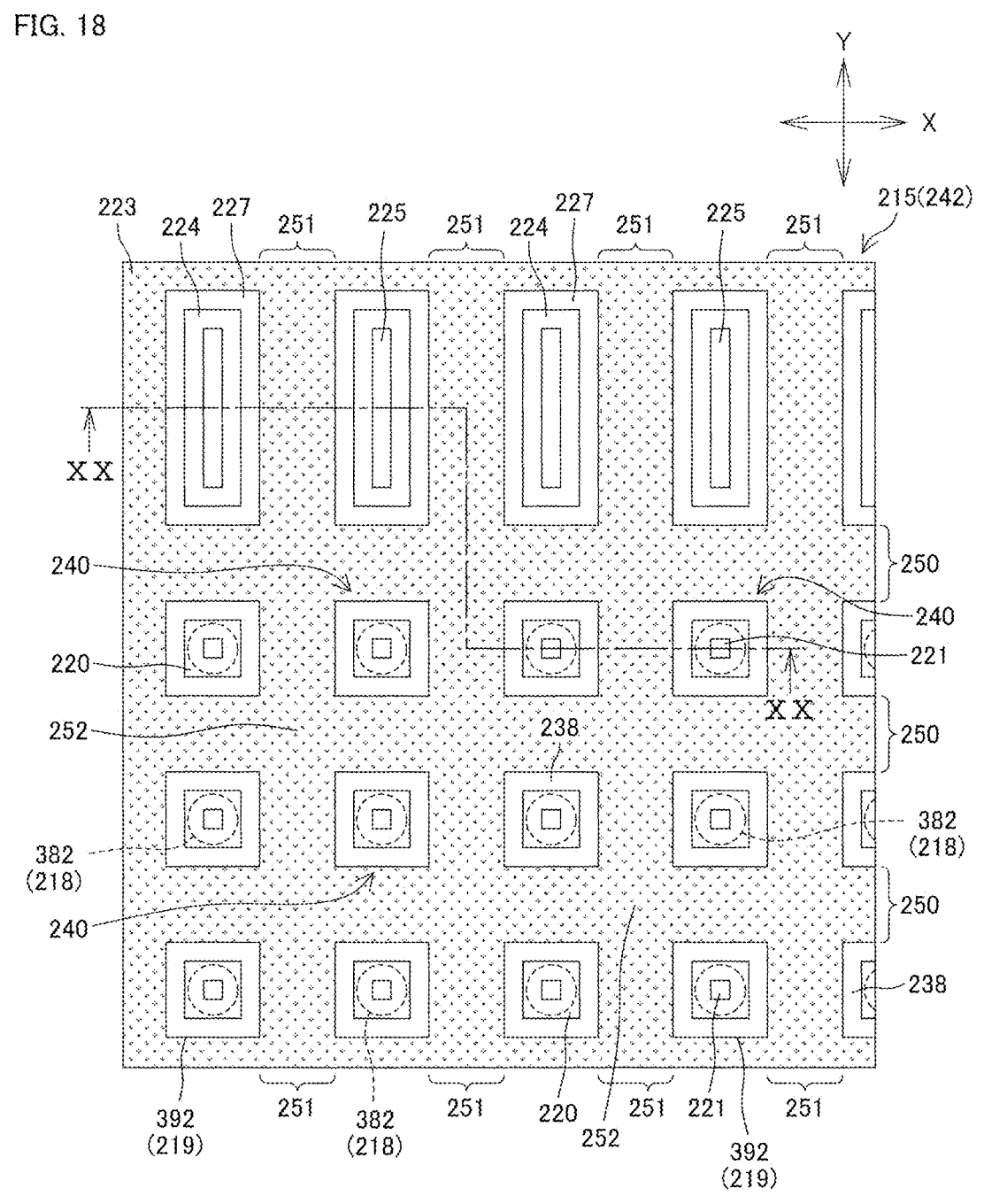

FIG. 17 is a main part enlarged view of a part surrounded by the alternate long and two short dashed line XVII in FIG. 16. FIG. 18 is a main part enlarged view of a part surrounded by the alternate long and two short dashed line XVIII in FIG. 16. More specifically, FIG. 17 shows the internal structure of a boundary portion between the region of the source electrode film 202 covered with the passivation film 209 and the source pad 212. FIG. 18 shows the internal structure of the region of the source electrode film 202 covered with the passivation film 209. The region of the source electrode film 202 covered with the passivation film 209 has a closed annular shape surrounding the source pad 212 and forms a peripheral edge portion of the source electrode film 202. The peripheral edge portion is also an outer peripheral portion of the active region 204 surrounding a central portion 214 of the active region 204 below the source pad 212 and therefore may also be referred to as a peripheral edge portion 215 of the active region 204. Also, in FIGS. 17 and 18, the gate electrode 223 is partially hatched for convenience of understanding (portions of the gate electrode 223 opposing body regions 219 are not hatched for the purpose of clarification).

Figure 19:
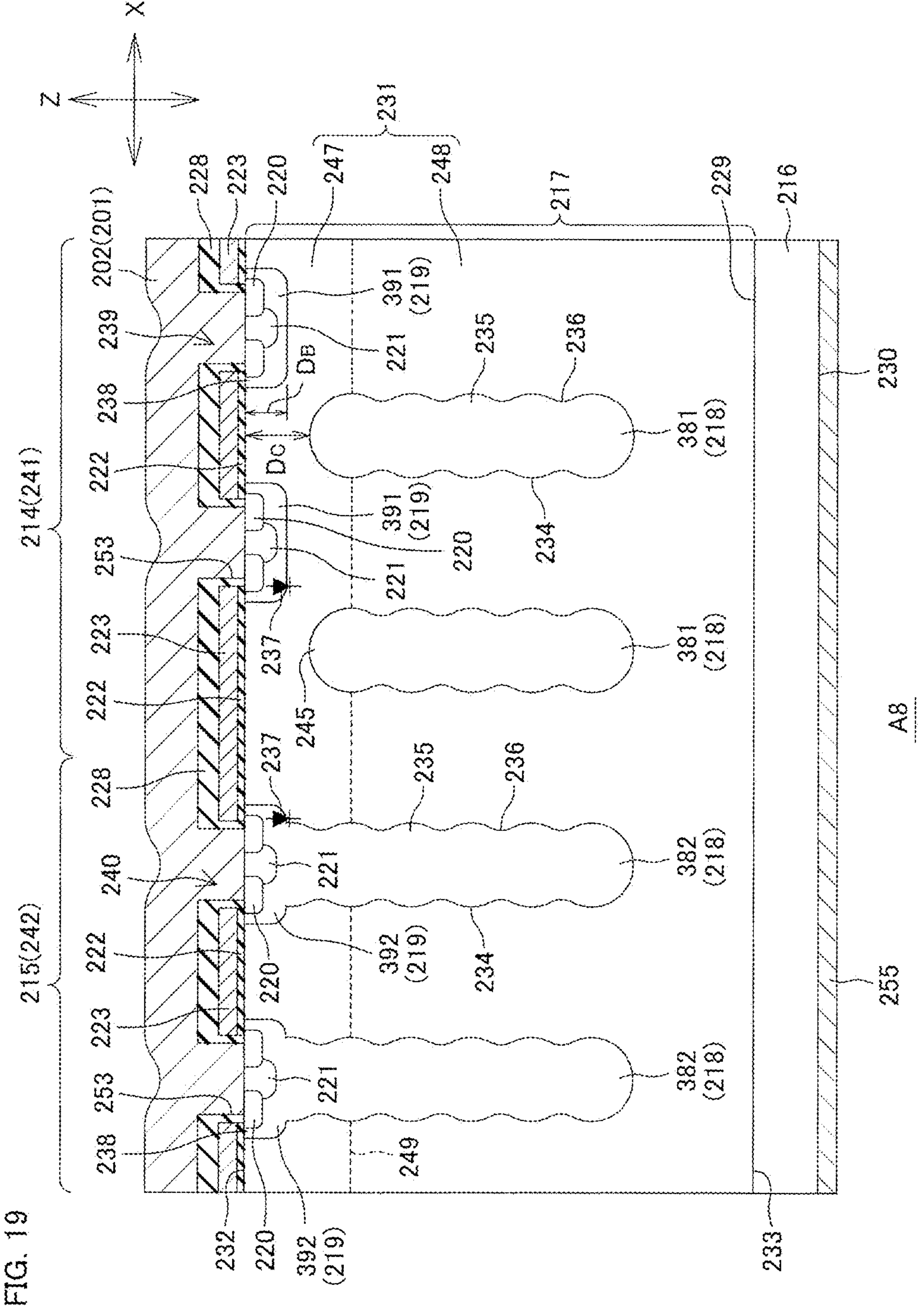
FIG. 19 is a cross-sectional view taken along the line XIX-XIX in FIG. 17.
Figure 20:
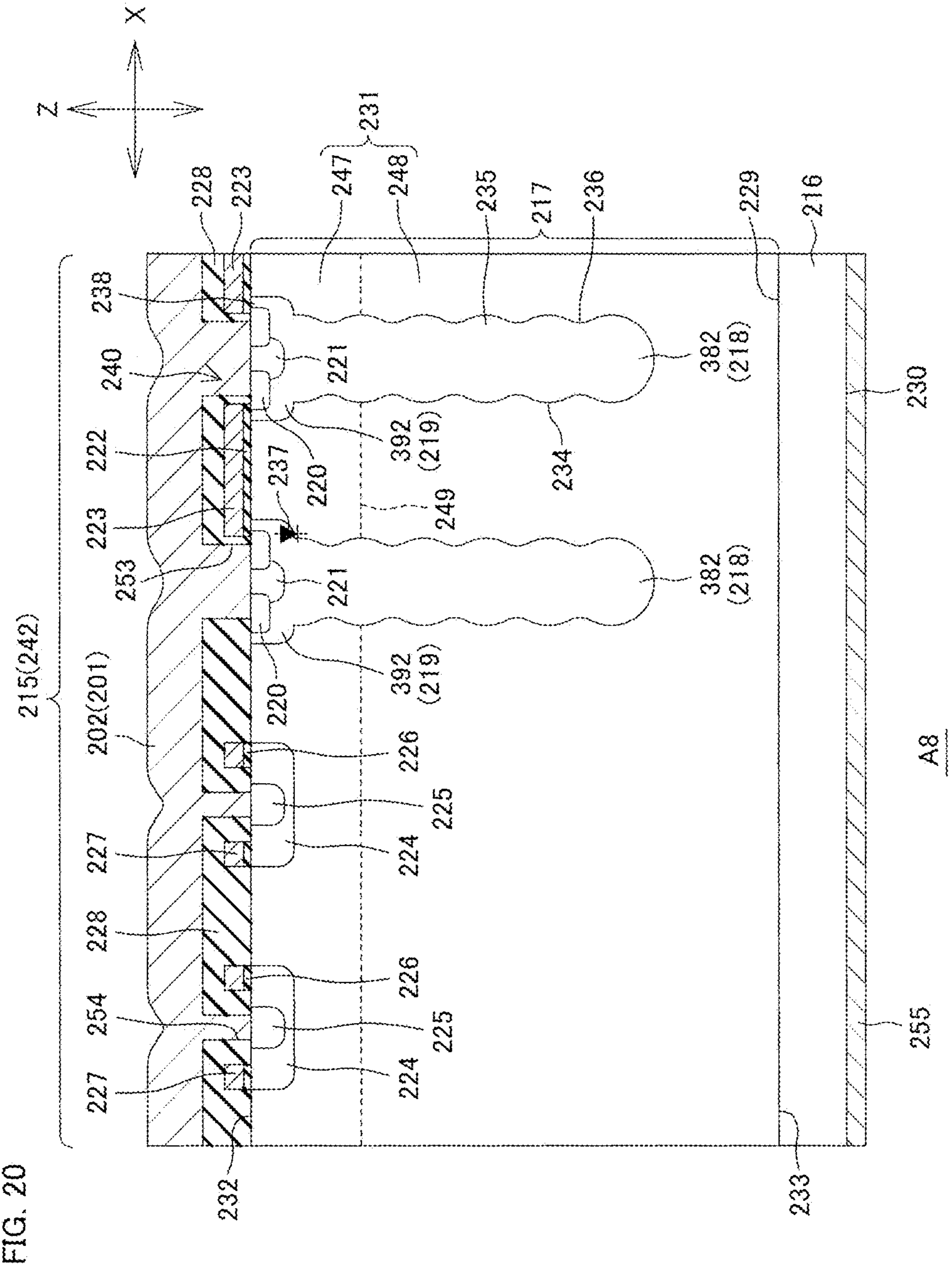
FIG. 20 is a cross-sectional view taken along the line XX-XX in FIG. 18.

FIG. 19 is a cross-sectional view taken along the line XIX-XIX in FIG. 17. FIG. 20 is a cross-sectional view taken along the line XX-XX in FIG. 18. For the purpose of description, three mutually orthogonal directions are defined as X direction, Y direction, and Z direction. The Z direction corresponds to a thickness direction of the semiconductor device A8. The X direction corresponds to a left-right direction in a plan view of the semiconductor device A8 (see FIGS. 17 and 18). The Y direction corresponds to an up-down direction in a plan view of the semiconductor device A8 (see FIGS. 17 and 18).

The semiconductor device A8 may include a semiconductor substrate 216, an epitaxial layer 217, a column layer 218, a body region 219, a source region 220, a body contact region 221, a gate insulating film 222, a gate electrode 223, a p type region 224, a p type contact region 225, an insulating film 226, a floating electrode 227, and an interlayer insulating film 228. In this preferred embodiment, a combination of the semiconductor substrate 216 and the epitaxial layer 217, the body region 219, and the source region 220 may be respective examples of the "semiconductor layer," "second region," and "first region" cited in the appended claims.

In this preferred embodiment, the semiconductor substrate 216 may be composed of an $n^+$ type semiconductor substrate (e.g. silicon substrate). Other substrate types commonly employed for transistors, such as an SiC substrate and GaN substrate, may also be used. The $n^+$ type semiconductor substrate 216 may be a semiconductor substrate that has undergone crystal growth with n type impurities being doped. P (phosphorus), As (arsenic), Sb (antimony), etc. may be applied as the n type impurities. The $n^+$ type semiconductor substrate 216 may also have an impurity concentration of, for example, about $1.0\times10^{18}$ $cm^{-3}$ to $5.0\times10^{20}$ $cm^{-3}$. The semiconductor substrate 216 has a first surface 229 and a second surface 230 on the side opposite thereto.

The epitaxial layer 217 may be, for example, an $n^-$ type layer on the $n^+$ type semiconductor substrate 216 that has undergone epitaxial growth with n type impurities being doped. Examples of the n type impurities include those as mentioned above. The $n^-$ type epitaxial layer 217 may also have an impurity concentration of, for example, about $1.0\times10^{10}$ $cm^{-3}$ to $1.0\times10^{16}$ $cm^{-3}$, which is lower than that of the $n^+$ type semiconductor substrate 216. The $n^-$ type region in the epitaxial layer 217 may also be referred to as an $n^-$ type drift region 231. In this preferred embodiment, the drift region 231 may be an example of the "third region" cited in the appended claims.

The epitaxial layer 217 (drift region 231) has a first surface 232 and a second surface 233 on the side opposite thereto. The first surface 232 may also be referred to as an element principal surface, in which element structures 239, 240 to be described hereinafter are formed. The second surface 233 is a surface in contact with the first surface 229 of the semiconductor substrate 216.

The column layer 218 may be a semiconductor layer formed through ion implantation of p type impurities into the epitaxial layer 217. B (boron), Al (aluminum), Ga (gallium), etc. may be applied as the p type impurities. The column layer 218 may also have an impurity concentration of, for example, about $1.0\times10^{15}$ $cm^{-3}$ to $1.0\times10^{19}$ $cm^{-3}$.

Figure 22A:
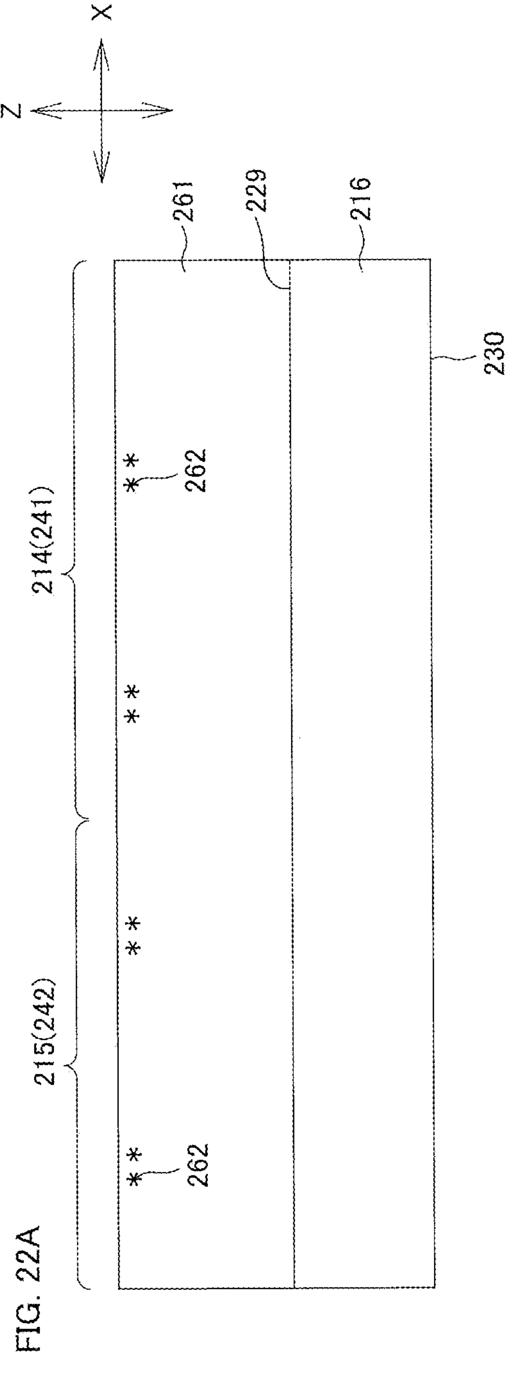
FIG. 22A is a view showing a process step for manufacturing the semiconductor device in FIG. 19.
Figure 22B:
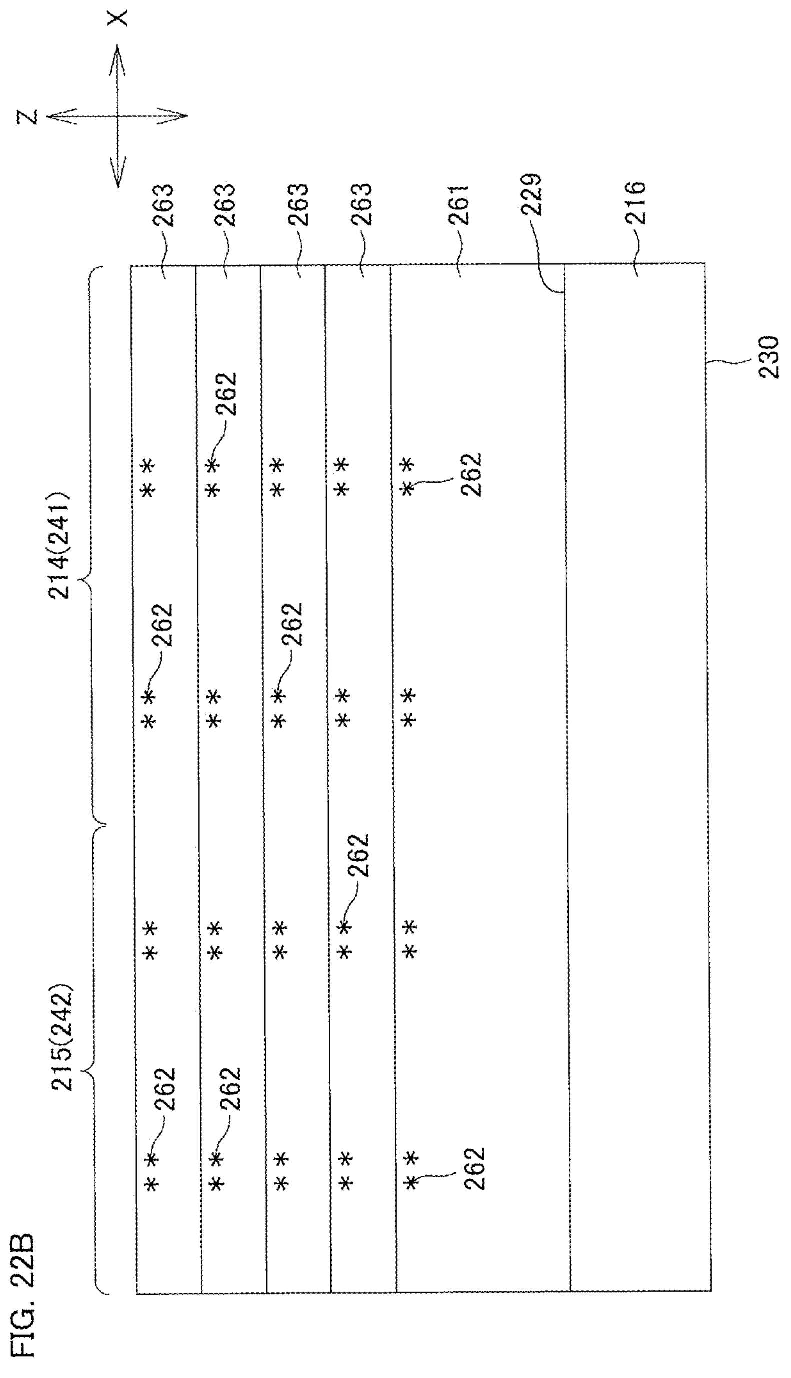
FIG. 22B is a view showing a step following FIG. 22A.

As shown in FIGS. 19 and 20, the column layer 218 extends in the Z direction, for example, from an upper portion of the epitaxial layer 217 beyond a central portion of the epitaxial layer 217 in the Z direction. As shown in FIGS. 17 and 18, the column layer 218 has a circular shape in a plan view. It is noted that the column layer 218 is not limited to have a circular shape but may have, for example, a triangular shape, a quadrilateral shape, etc. in a plan view. The column layer 218 also has a periodically waving concavo-convex side surface 234 extending in the Z direction and formed with multiple repeating sets of convex portions 235 and concave portions 236 in the Z direction. The number of the concavities and convexities 235, 236 commonly approximately corresponds to the step number of n type semiconductor layers 263 to be described hereinafter (FIGS. 22A and 22B).

As shown in FIGS. 17 and 18, the column layers 218 are arranged regularly at equal spacing from each other. In this preferred embodiment, the plurality of column layers 218 are arranged to have the same spacing (pitch) in the X and Y directions. As shown in FIG. 17, the column layers 218 are also arranged in an equally spaced matrix manner across the boundary between the peripheral edge portion 215 of the active region 214 and the central portion 214 of the active region 204.

A plurality of body regions 219 are formed in a surficial portion of the epitaxial layer 217, and more specifically, may be provided as a semiconductor layer formed through ion implantation of p type impurities into the $n^-$ type epitaxial layer 217. Examples of the p type impurities include those as mentioned above. The body regions 219 may also have an impurity concentration of, for example, about $1.0\times10^{15}$ $cm^{-3}$ to $1.0\times10^{19}$ $cm^{-3}$, which may be equal to that of the column layers 218. The body regions 219 may each have a quadrilateral shape in a plan view with a width of 3 μm to 10 μm, for example. As shown in FIGS. 19 and 20, the body regions 219 each form a parasitic diode 237 (body diode) at the interface (pn junction plane) with the drift region 231.

The source region 220 is formed in an inner region of each body region 219. The source region 220 is formed selectively in a surficial portion of the body region 219 in the inner region. The source region 220 may be formed through selective ion implantation of n type impurities into the body region 219. Examples of the n type impurities include those as mentioned above. The source region 220 may also have an impurity concentration of, for example, about $1.0\times10^{18}$ $cm^{-3}$ to $5.0\times10^{20}$ $cm^{-3}$, which is higher than that of the drift region 231.

The source region 220 has a quadrilateral shape in a plan view and is spaced inward by a predetermined distance from the peripheral edge of the body region 219 (the boundary between the body region 219 and the drift region 231). This causes the surficial portion of the body region 219 to be interposed between the source region 220 and the drift region 231 in a surficial portion of the epitaxial layer 217 including the drift region 231, the body region 219, etc. The interposed surficial portion serves as a channel region 238 in which a channel is formed when an appropriate voltage is applied to the gate electrode 223.

The body contact region 221 has a quadrilateral shape in a plan view and is formed selectively in a surficial portion of the body region 219. The body contact region 221 extends toward the second surface 233 of the epitaxial layer 217 to pass through the source region 220 and reach the body region 219. The body contact region 221 may be formed through selective ion implantation of p type impurities into the body region 219. Examples of the p type impurities include those as mentioned above. The body contact region 221 may also have an impurity concentration of, for example, about $5.0\times10^{17}$ $cm^{-3}$ to $1.0\times10^{19}$ $cm^{-3}$, which is higher than that of the body region 219.

Further, the body region 219, the source region 220, and the body contact region 221 constitute element structures 239, 240 (unit cells) of the MISFET. A portion of the drift region 231 is exposed between mutually adjoining element structures 239, 240.

In this preferred embodiment, the element structures 239, 240 may include first element structures 239 and second element structures 240. The first element structures 239 are arranged in the central portion 214 of the active region 204 as shown in FIG. 17, while the second element structures 240 are arranged in the peripheral edge portion 215 of the active region 204 as shown in FIGS. 17 and 18. The central portion 214 of the active region 204 is a region in which the plurality of first element structures 239 are arranged and therefore may also be referred to as a first element region 241. On the other hand, the peripheral edge portion 215 of the active region 204 is a region in which the plurality of second element structures 240 are arranged and thereby may also be referred to as a second element region 242.

As shown in FIG. 17, the first element structures 239 are each an element structure that includes a column layer 218 and a body region 219, in which the body region 219 is formed apart from the column layer 218 so as not to overlap the column layer 218 in a plan view, while the column layer 218 is adjacent to the body region 219. The body region 219 and the column layer 218 of the first element structure 239 may also be referred to as, respectively, a first body region 391 and a first column layer 381.

The first column layer 381 is separated physically from the first body region 391 in a direction along the first surface 232 of the epitaxial layer 217 (a direction along the X-Y plane in this preferred embodiment), serving as a floating region in the epitaxial layer 217. As shown in FIG. 17, the first column layer 381 is formed adjacent to one of the corners 243 of the first body region 391 having a quadrilateral shape in a plan view. For example, first column layers 381 may be formed adjacent to the four respective corners 243 of one first body region 391. The first body region 391 may also be formed apart from a region 244 between mutually adjacent first column layers 381 (a region sandwiched between adjoining first column layers 381). Further, each first column layer 381 may be shared by adjoining first element structures 239.

As shown in FIG. 19, the first column layer 381 may have a top portion 245 at a position deeper than that of a bottom portion of the first body region 391 (the convex portion 235 of the first column layer 381 closest to the first surface 232 of the epitaxial layer 217 in this preferred embodiment). That is, the distance $D_C$ from the first surface 232 of the epitaxial layer 217 to the first column layer 381 may be longer than the distance $D_B$ from the first surface 232 to the bottom portion of the first body region 391.

As shown in FIGS. 17 and 18, the second element structures 240 are each an element structure that includes a column layer 218 and a body region 219, in which the body region 219 overlaps the column layer 218 in a plan view and the column layer 218 is adjacent to the body region 219. The body region 219 and the column layer 218 of the second element structure 240 may also be referred to as, respectively, a second body region 392 and a second column layer 382.

The second column layer 382 is formed in an inner region of each second body region 392. More specifically, the second column layer 382 is formed continuously to a lower portion of the second body region 392 and extends from the second body region 392 toward the second surface 233 of the epitaxial layer 217. Bottom portions of the second column layer 382 and the first column layer 381 may be positioned at the same depth position from the first surface 232 of the epitaxial layer 217.

As shown in FIG. 17, the spacing between adjoining first and second body regions 391 and 392 may be increased selectively in a boundary portion 246 between the first element region 241 and the second element region 242. For example, the spacing (pitch $P_1$) between first body regions 391 in the first element region 241 and the spacing (pitch $P_2$) between second body regions 392 in the second element region 242 are from 5 μm to 20 μm and may be equal to each other. On the other hand, the spacing $P_3$ between the first body region 391 and the second body region 392 adjoining across the boundary portion 246 may be from 5 μm to 20 μm. It is noted that the pitch $P_3$ has a range from 5 μm to 20 μm by way of example, which is the same as an example of the range of the pitches $P_1$, $P_2$, but may be greater than the pitches $P_1$, $P_2$ within the foregoing range.

Also, as shown in FIG. 19, the drift region 231 may include a first portion 247 and a second portion 248 having their respective different impurity concentrations. The first portion 247 is formed between the top portion 245 of the first column layer 381 and the first body region 391 and has a first impurity concentration. On the other hand, the second portion 248 is formed closer to the second surface 233 of the epitaxial layer 217 with respect to the first portion 247 and has a second impurity concentration lower than the first impurity concentration. More specifically, a boundary portion 249 between the first portion 247 and the second portion 248 may be set in a Z-directional middle portion of the top portion 245 of the first column layer 381. In this preferred embodiment, the first impurity concentration may be about $1\times10^{10}$ $cm^{-3}$ to $1\times10^{13}$ $cm^{-3}$, and the second impurity concentration may also be about $1\times10^{10}$ $cm^{-3}$ to $1\times10^{13}$ $cm^{-3}$. It is noted that the first impurity concentration has a range from $1\times10^{10}$ $cm^{-3}$ to $1\times10^{13}$ $cm^{-3}$ by way of example, which is the same as an example of the range of the second impurity concentration, but the first impurity concentration may be higher than the second impurity concentration within the foregoing range.

The gate insulating film 222 may be composed of, for example, a silicon oxide film, a silicon nitride film, a silicon oxynitride film, a hafnium oxide film, an alumina film, a tantalum oxide film, etc. The gate electrode 223 may also be composed of polysilicon that is formed through impurity implantation. If the gate insulating film 222 is composed of a silicon oxide film, MISFET may also be referred to as MOSFET (Metal Oxide Semiconductor Field Effect Transistor).

The gate insulating film 222 covers at least the surface of the body region 219. In this preferred embodiment, the gate insulating film 222 covers a portion of the surface of the source region 220 and the surfaces of the channel region 238 and the drift region 231. More briefly, the gate insulating film 222 is formed in a pattern having an opening in the body contact region 221 of each element structure 239, 240 and a portion of the source region 220 that is continuous to the body contact region 221.

The gate insulating film 222 is interposed between the gate electrode 223 and the epitaxial layer 217. This causes the gate electrode 223 to oppose the channel region 238 with the gate insulating film 222 therebetween. The gate electrode 223 is formed in approximately the same pattern as the gate insulating film 222 to thereby form a planar gate structure. The gate insulating film 222 may also have a thickness of, for example, 300 Å to 700 Å.

Also, in this preferred embodiment, the gate electrode 223 is formed across the first element region 241 and the second element region 242, as shown in FIGS. 17 and 18. The gate electrode 223 is formed in a grid pattern in each of the first element region 241 and the second element region 242. More specifically, in the first element region 241 and the second element region 242, the gate electrode 223 includes a first portion 250 extending in the X direction, a second portion 251 extending in the Y direction orthogonal to the X direction, and an intersecting portion 252 in which the first portion 250 and the second portion 251 intersect each other. In the first element region 241, the first column layer 381 is formed below the intersecting portion 252 of the gate electrode 223.

A plurality of p type regions 224 are formed in a surficial portion of the epitaxial layer 217, and more specifically, may be provided as a semiconductor layer formed through ion implantation of p type impurities into the $n^-$ type epitaxial layer 217. Examples of the p type impurities include those as mentioned above. The p type regions 224 may also have an impurity concentration of, for example, about $1.0\times10^{15}$ $cm^{-3}$ to $1.0\times10^{19}$ $cm^{-3}$, which may be equal to that of the body regions 219. The p type regions 224 each have, for example, a rectangular shape in a plan view extending in the Y direction. The p type regions 224 are also arranged on the outside of the second element structures 240 in the second element region 242.

The p type contact region 225 has, for example, a quadrilateral shape in a plan view extending in the Y direction and is formed selectively in a surficial portion of each p type region 224. This causes the closed annular-shaped p type region 224 to be exposed around the p type contact region 225. The p type contact region 225 may be formed through selective ion implantation of p type impurities into the p type region 224. Examples of the p type impurities include those as mentioned above. The p type contact region 225 may also have an impurity concentration of, for example, about $5.0\times10^{17}$ $cm^{-3}$ to $1.0\times10^{19}$ $cm^{-3}$, which is higher than that of the p type region 224 and may be equal to that of the body contact region 221.

The insulating film 226 may be composed of, for example, a silicon oxide film, a silicon nitride film, a silicon oxynitride film, a hafnium oxide film, an alumina film, a tantalum oxide film, etc. The floating electrode 227 may also be composed of polysilicon that is formed through impurity implantation. The insulating film 226 covers the exposed portion of the closed annular-shaped p type region 224, and the floating electrode 227 is formed on the insulating film 226 in a closed annular shape. The floating electrode 227 is an electrically floating conductive layer.

The interlayer insulating film 228 is formed on the epitaxial layer 217. The interlayer insulating film 228 covers the gate electrode 223 and the floating electrode 227. The interlayer insulating film 228 may be composed of an insulating material such as a silicon oxide film, a silicon nitride film, or a TEOS (tetraethoxysilane).

The interlayer insulating film 228 is formed with a first contact hole 253 through which the body contact region 221 and the source region 220 of the MISFET are exposed and a second contact hole 254 through which the p type contact region 225 is exposed. The first contact hole 253 penetrates the interlayer insulating film 228 and the gate insulating film 222.

The above-mentioned electrode film 201 is formed on the interlayer insulating film 228. The electrode film 201 may be composed of aluminum or other metal. The source electrode film 202 is shown in FIGS. 19 and 20. It is noted that the source electrode film 202 may be referred to simply as a source electrode.

The source electrode film 202 is connected to the body contact region 221 and the source region 220 within the first contact hole 253 as shown in FIGS. 19 and 20, and connected to the p type contact region 225 within the second contact hole 254 as shown in FIG. 20.

The source electrode film 202 thus connects in parallel the body region 219 and the source region 220 of the element structure that can serve as a MISFET (active cell that allows current to flow between drain and source) and the p type region 224 that cannot serve as a MISFET (non-active cell that does not allow current to flow between drain and source). It is noted that the gate electrode film 203 is connected to the gate electrode 223 at respective positions not shown.

A drain electrode 255 is formed on the second surface 230 of the semiconductor substrate 216. The drain electrode 255 may be composed of aluminum or other metal. The drain electrode 255 is electrically connected to the drift region 231 via the semiconductor substrate 216.

<<Resistance Distribution in Epitaxial Layer 217>>

Figure 21:
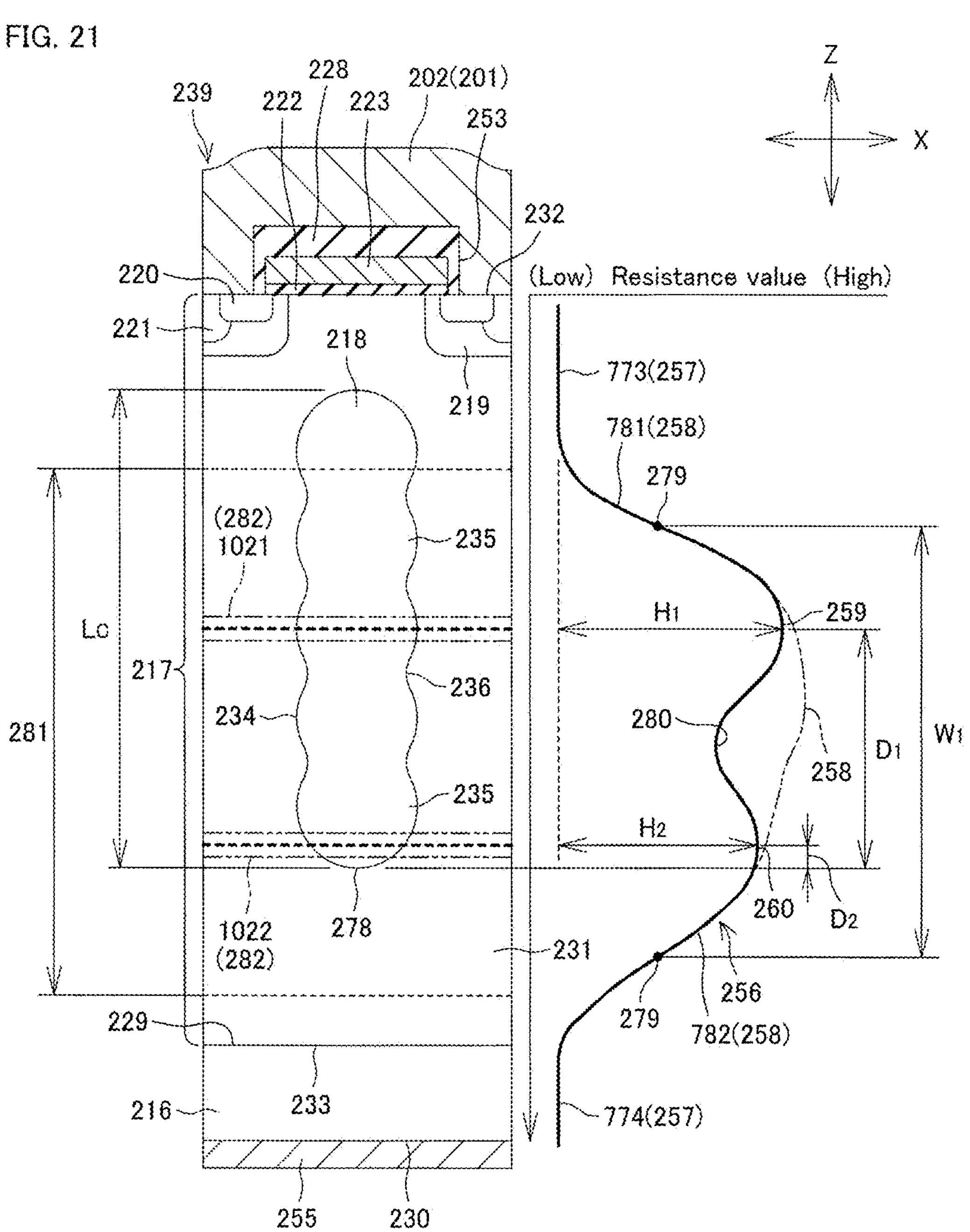
FIG. 21 is a view for describing a resistance distribution in the epitaxial layer.

FIG. 21 is a view for describing a resistance distribution in the epitaxial layer 217. It is noted that in FIG. 21, the first body region 391 and the second body region 392 are referred to collectively as a body region 219, and the first column layer 381 and the second column layer 382 are referred to collectively as a column layer 218.

As shown in FIG. 21, the resistance distribution in the thickness direction (Z direction) of the epitaxial layer 217 can be described based on a resistance distribution curve 256. The resistance distribution curve 256 is a curvilinear graph showing the relationship between the depth position from the first surface 232 of the epitaxial layer 217 (vertical axis) and the resistance value at that position (horizontal axis). In this preferred embodiment, the resistance distribution curve 256 shows a resistance distribution below the gate electrode 223 (i.e. a region in which the drift region 231 is exposed through the first surface 232 of the epitaxial layer 217), which indicates how the resistance value of the epitaxial layer 217 changes from the first surface 232 of the epitaxial layer 217 toward the second surface 233. Such a resistance distribution curve 256 can be created based on the resistance distribution measured by, for example, a scanning spread resistance microscope (SSRM).

The resistance distribution curve 256 includes a baseline 257 and a convex line 258 that bulges into a convex shape relative to the baseline 257.

The baseline 257 may be a line indicating that the resistance value is approximately constant from the first surface 232 of the epitaxial layer 217 toward the second surface 233. The phrase "the resistance value is approximately constant" does not mean that the resistance value of the epitaxial layer 217 is exactly constant in the Z direction, but means that unlike, for example, the boundary between the baseline 257 and the convex line 258, the resistance value does not change rapidly.

The baseline 257 includes a first baseline 773 formed closer to the first surface 232 of the epitaxial layer 217 and a second baseline 774 formed closer to the second surface 233, and the convex line 258 is formed between the first baseline 773 and the second base line 774.

The convex line 258 is a view showing a bimodal resistance distribution with a plurality of peaks 259, 260. It is noted that as indicated by the alternate long and two short dashed line in FIG. 21, the convex line 258 may not show a bimodal resistance distribution. That is, the convex line 258 may have no distinct peak.

In this preferred embodiment, the convex line 258 includes a first convex line 781 formed closer to the first surface 232 of the epitaxial layer 217 and a second convex line 782 formed closer to the second surface 233. The first convex line 781 has a first peak 259 and the second convex line 782 has a second peak 260. The first convex line 782 and the second convex line 782 are connected via a valley 280 between the first peak 259 and the second peak 260.

The first peak 259 and the second peak 260 are both formed at depth positions where the column layer 218 exists.

More specifically, the second peak 260 is formed at a position corresponding to a bottom portion of the column layer 218, for example, at which the distance $D_2$ from the lower end 278 of the column layer 218 toward the first surface 232 has a range from 1 μm to 5 μm. In other words, the second peak 260 may be formed at the depth position of the convex portion 235 formed at the lowermost end 278 side of the column layer 218.

On the other hand, the first peak 259 is formed at a position corresponding to a Z-directional middle portion of the column layer 218, for example, at which the distance $D_1$ from the lower end 278 of the column layer 218 toward the first surface 232 has a range from 20 μm to 30 μm. Also, in this preferred embodiment, the column layer 218 has a Z-directional length $L_c$ of, for example, 40 μm to 50 μm.

Further, the first peak 259 and the second peak 260 are preferably separated by, for example, 15 μm to 30 μm from each other.

In the resistance distribution curve 256, the height $H_1$ (horizontal magnitude) of the first peak 259 relative to the baseline 257 is larger than the height $H_2$ of the second peak 260 relative to the baseline 257. Accordingly, in the epitaxial layer 217, the resistance value in the Z-directional middle portion of the column layer 218 is higher than the resistance value in the bottom portion of the column layer 218.

Also, in the resistance distribution curve 256, the width $W_1$ of the resistance distribution curve 256 at the half 279 of the resistance value of the second peak 260 is equal to or greater than 20 μm. The width $W_1$ may be defined based on, for example, the length of a straight line connecting the half 279 of the first convex line 781 and the half 279 of the second convex line 782.

In the epitaxial layer 217, the region with a certain thickness corresponding to the convex line 258 thus has a higher resistance than the region corresponding to baseline 257, and the region may be set as a high resistance region 281. The high resistance region 281 may have a thickness of, for example, 20 μm or more, preferably 40 μm to 60 μm.

A crystal defect region 282 is also formed in the epitaxial layer 217. The crystal defect region 282 is a region formed through light ion irradiation through the second surface 230 of the semiconductor substrate 216, as will be described hereinafter. There are many recombination centers in the crystal defect region 282 that trap and recombine carriers to disappear. This allows carriers to disappear quickly during the reverse recovery phenomenon to shorten the carrier lifetime, thereby reducing the reverse recovery time and the reverse recovery current.

The crystal defect region 282 is formed locally within the epitaxial layer 217 to spread thinly (e.g., with a thickness of about 10 μm to 15 μm) at a predetermined depth position from the second surface 230 of the semiconductor substrate 216.

The crystal defect region 282 may include, for example, a first crystal defect region 1021 formed in a region corresponding to the first convex line 781 and a second crystal defect region 1022 formed in a region corresponding to the second convex line 782. The first crystal defect region 1021 is formed in the Z-directional middle portion of the column layer 218, while the second crystal defect region 1022 is formed in the bottom portion of the column layer 218.

<<Method for Manufacturing Semiconductor Device A8>>

Figure 22C:
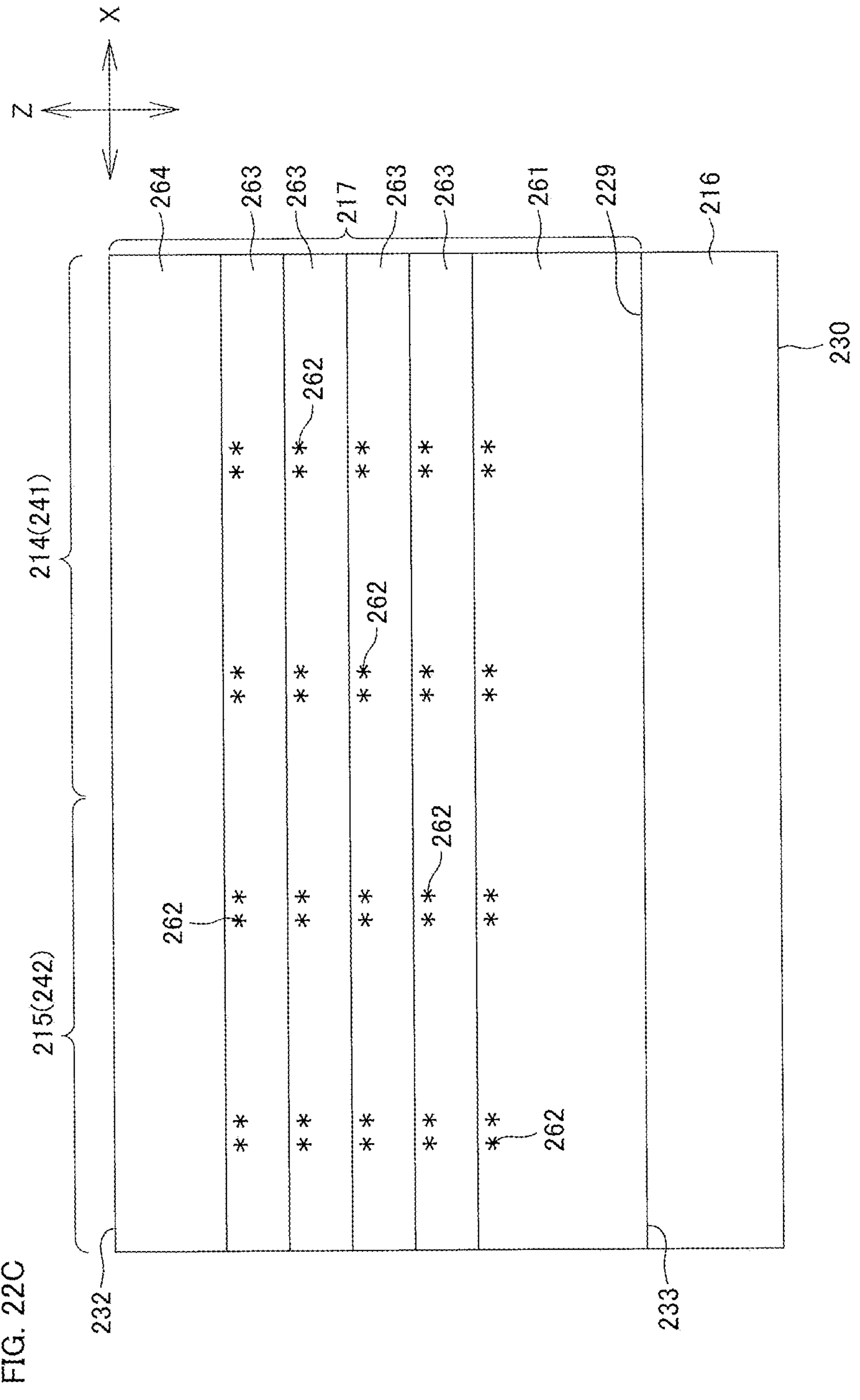
FIG. 22C is a view showing a step following FIG. 22B.
Figure 22D:
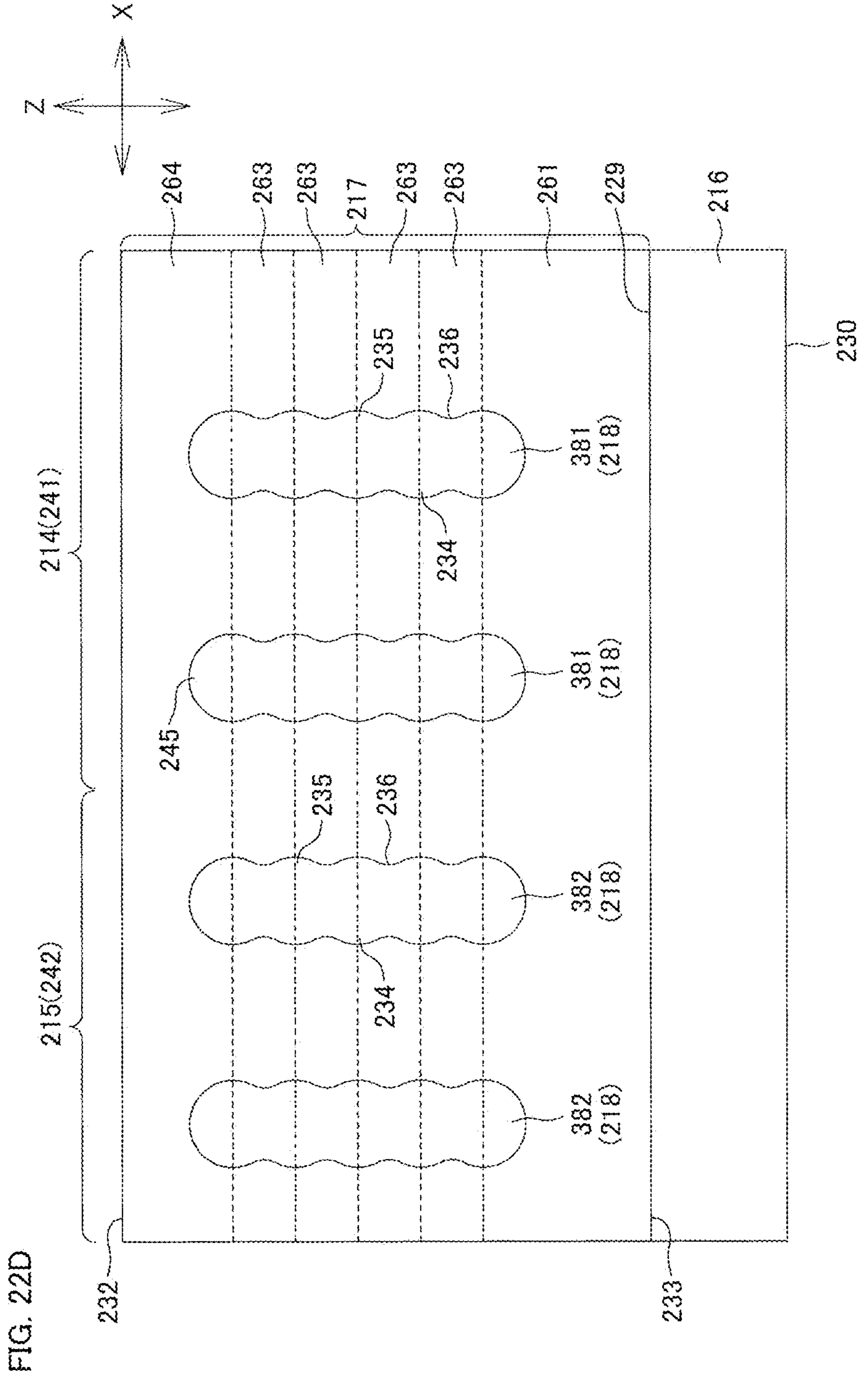
FIG. 22D is a view showing a step following FIG. 22C.
Figure 22E:
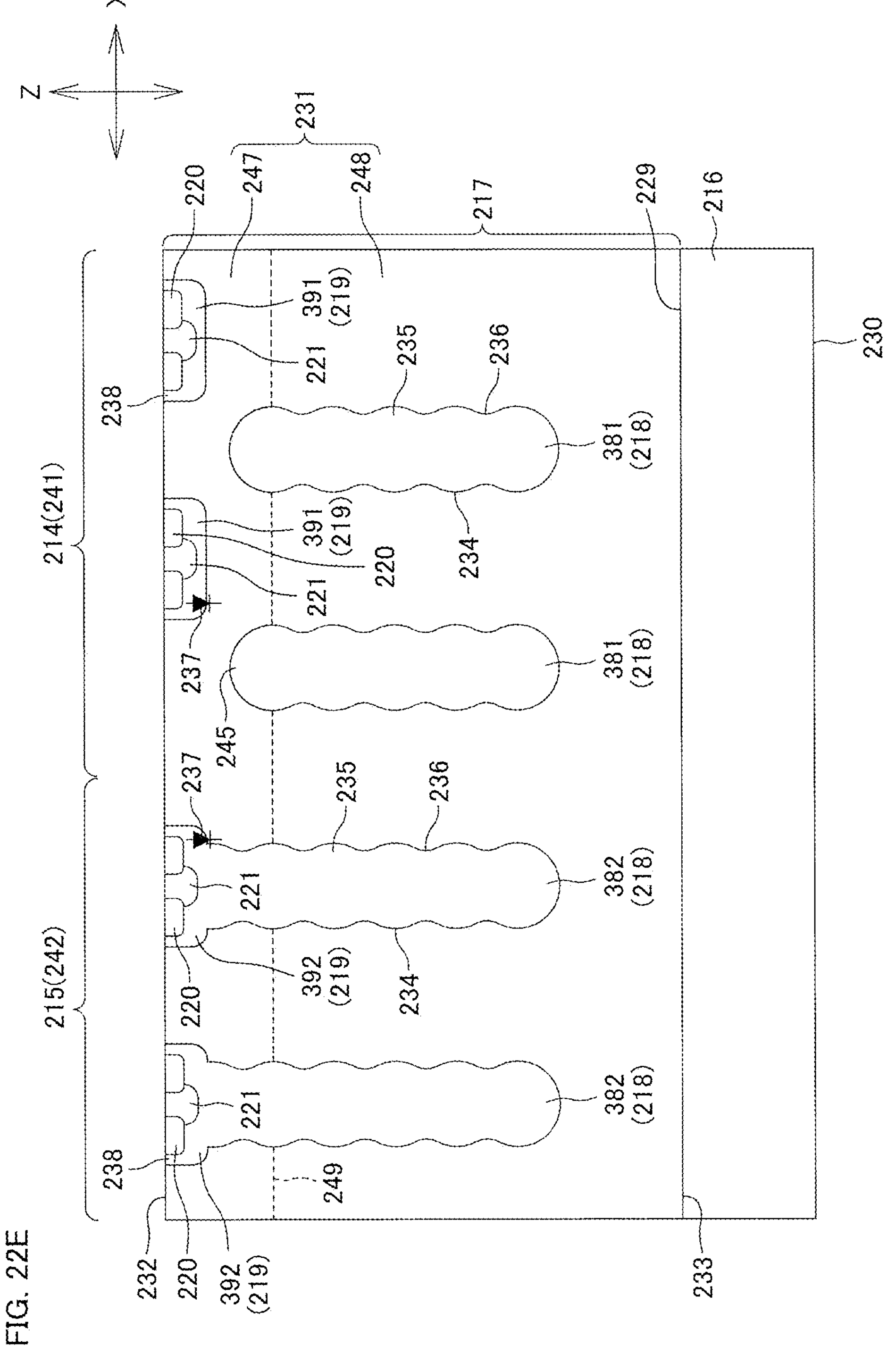
FIG. 22E is a view showing a step following FIG. 22D.
Figure 22F:
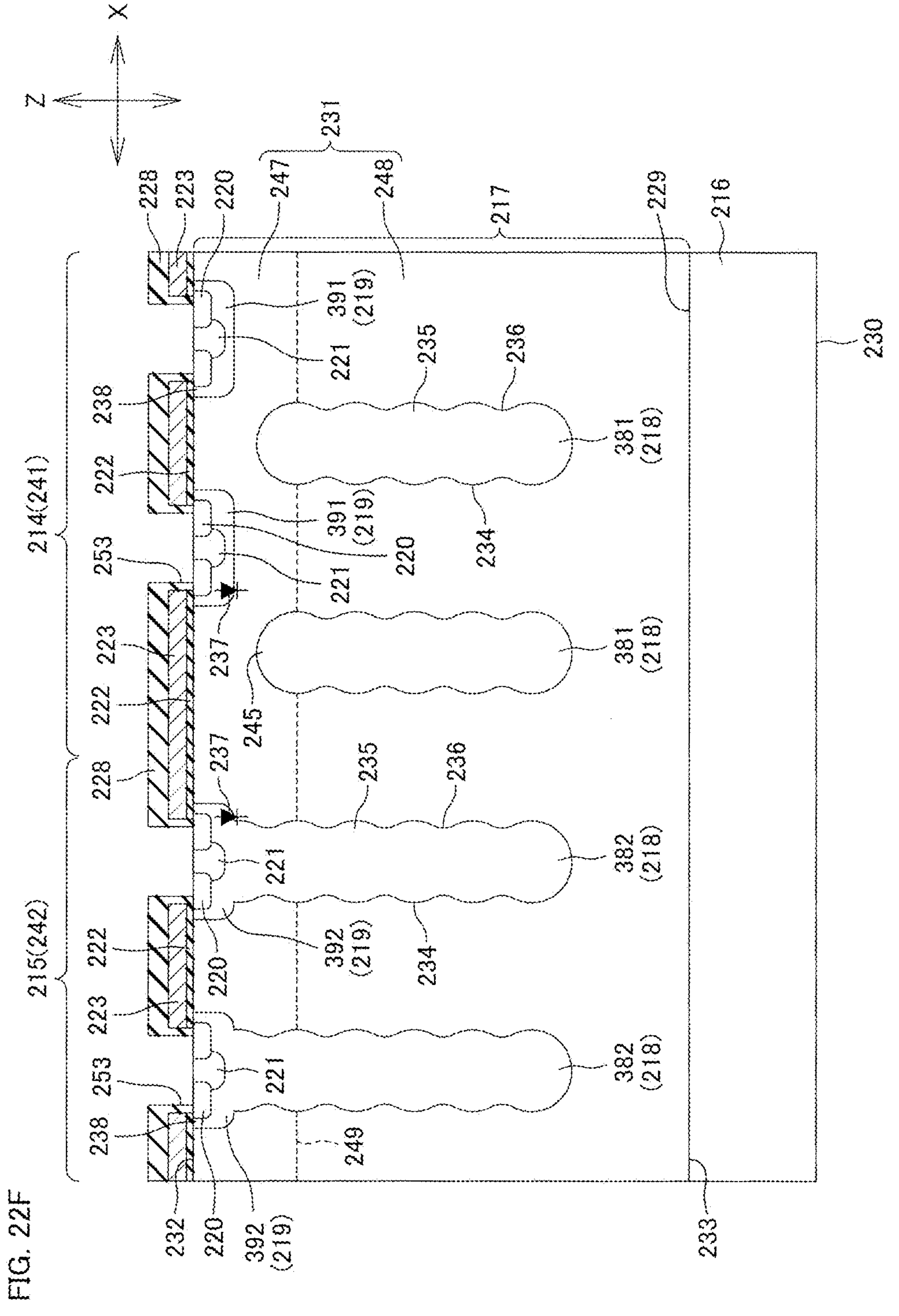
FIG. 22F is a view showing a step following FIG. 22E.
Figure 22G:
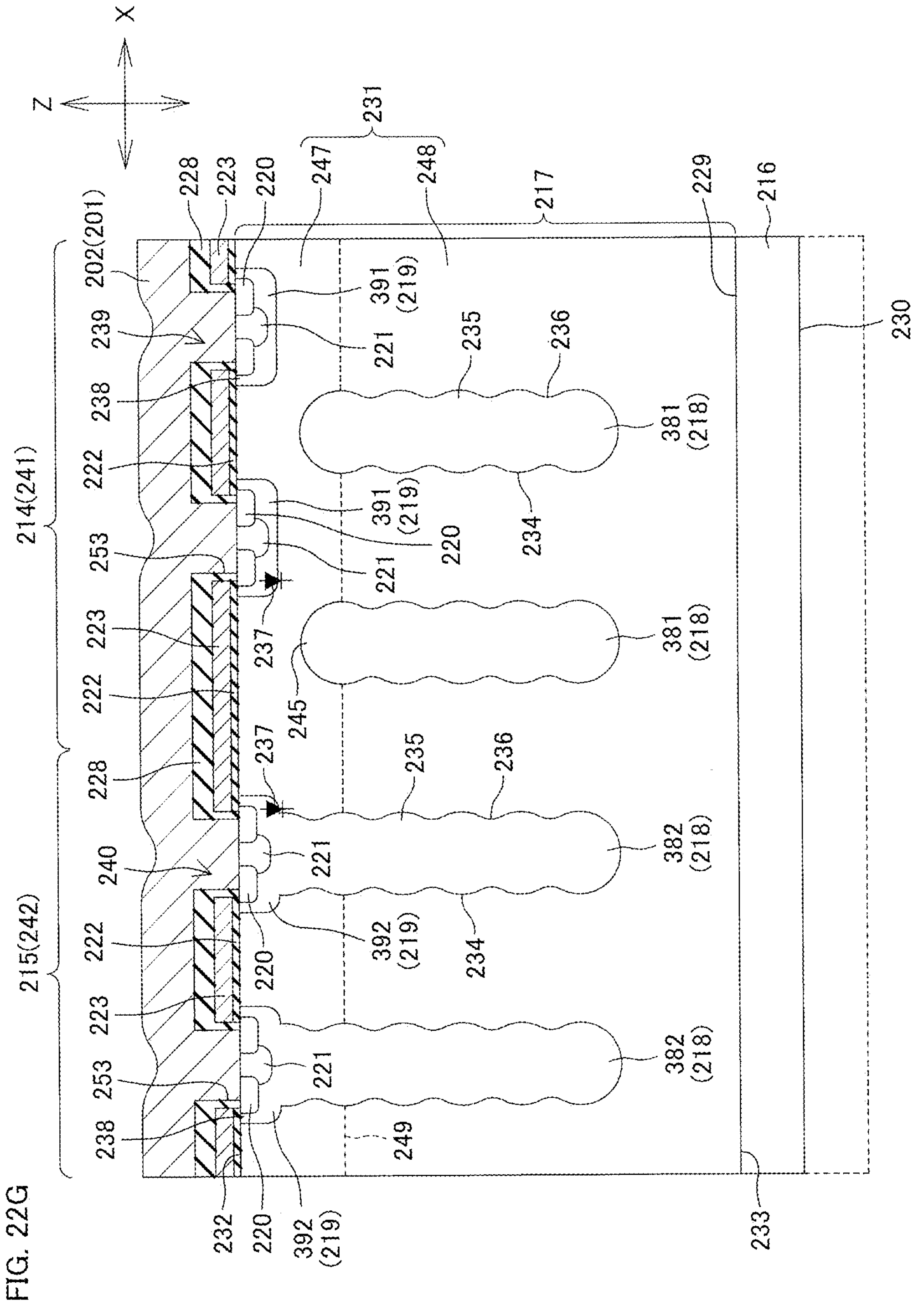
FIG. 22G is a view showing a step following FIG. 22F.
Figure 22H:
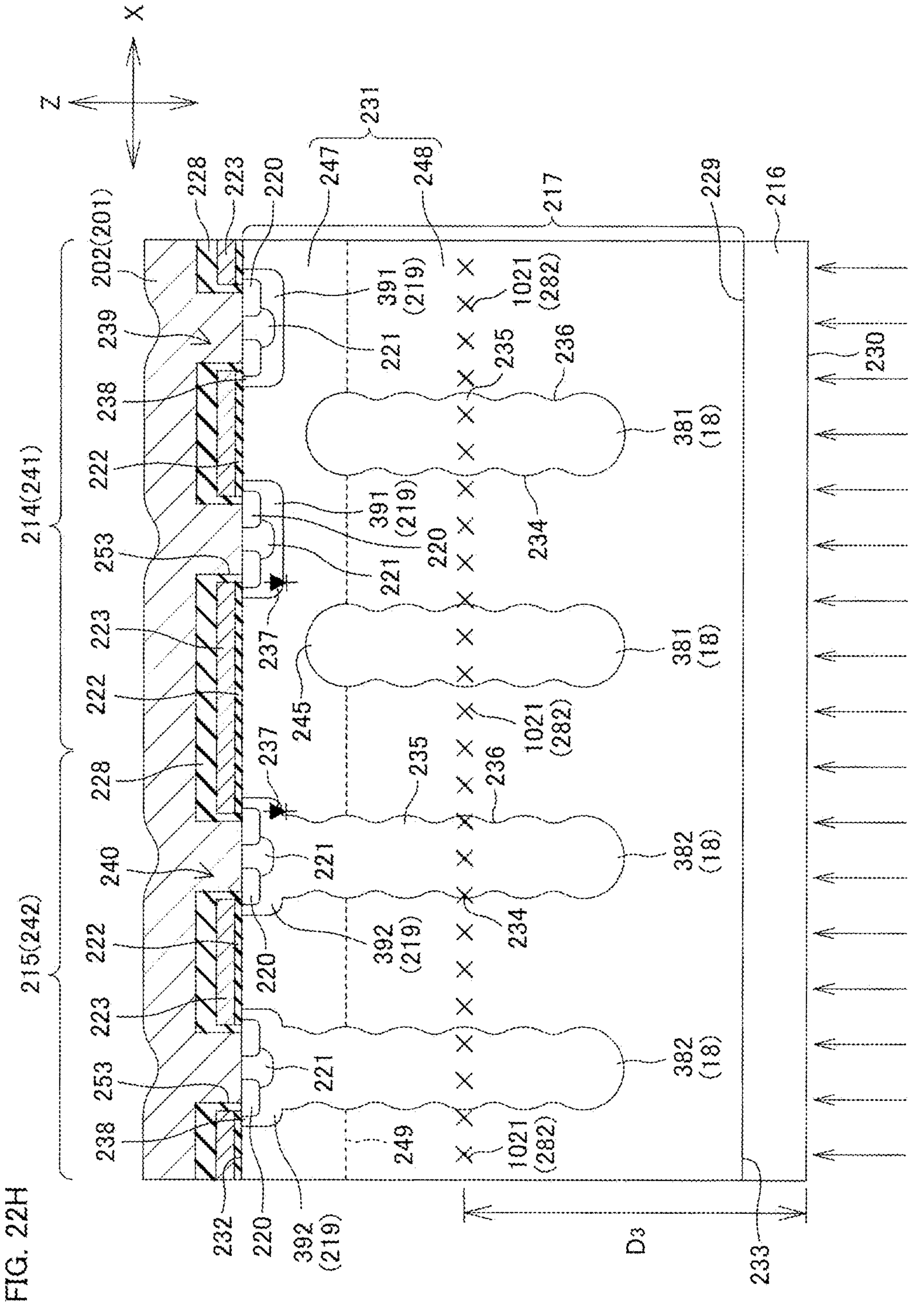
FIG. 22H is a view showing a step following FIG. 22G.
Figure 22:
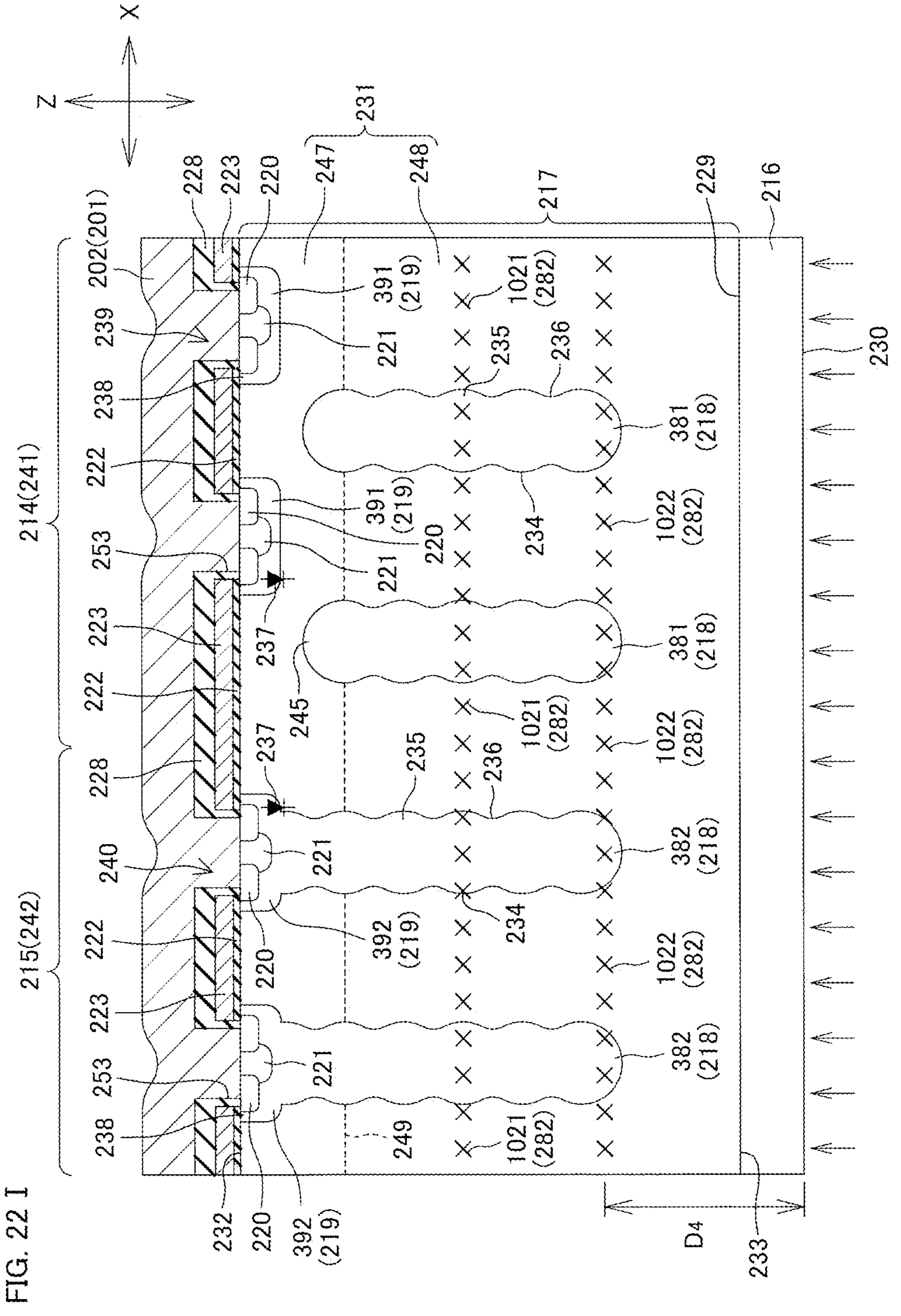
FIG. 22I is a view showing a step following FIG. 22H.
FIG. 22J is a view showing a step following FIG. 22I.

FIGS. 22A to 22J are views showing process steps for manufacturing a semiconductor device A8 in the order of steps. It is noted that the configurations shown in FIG. 21 are not shown in FIGS. 22A to 22J, except that crystal defect regions 282 are shown in FIGS. 22H and 22I.

In order to manufacture the semiconductor device A8, referring first to FIG. 22A, an initial base layer 261 is formed on a wafer-shaped semiconductor substrate 216 through epitaxial growth. Next, p type impurities 262 are implanted selectively at positions where column layers 218 are to be formed in the surface of the initial base layer 261.

Referring next to FIG. 22B, multiple layers of n type semiconductor layers 263 are laminated on the initial base layer 261 through multi-epitaxial growth in which the step of forming an n type semiconductor layer 263 is repeated while p type impurities 262 are implanted selectively at positions where column layers 218 are to be formed.

Referring further to FIG. 22C, an n type semiconductor layer 264 is laminated as an uppermost layer with no implantation of p type impurities. The plurality of n type semiconductor layers 263, 264 and the initial base layer 261 are thus integrated to form an epitaxial layer 217 (drift region 231). At this time, the impurity concentration when the n type semiconductor layer 264 is grown as an uppermost layer is higher than the impurity concentration when the n type semiconductor layers 263 under the uppermost n type semiconductor layer 264 are grown. Thus, a first portion 247 and a second portion 248 of the drift region 231 can be formed.

Referring next to FIG. 22D, p type impurities in the initial base layer 261 and the plurality of n type semiconductor layers 263, 264 are drive-diffused through annealing treatment (1000° C. to 1200° C.). This causes column layers 218 to be formed within the epitaxial layer 217.

Referring next to FIG. 22E, p type impurities are implanted selectively into a surficial portion of the epitaxial layer 217 to form body regions 219 and p type regions 224 (not shown). The body regions 219 (second body regions 392) are connected to second column layers 382 in the second element region 242. Next, n type impurities are implanted selectively into a surficial portion of the body regions 219 to form source regions 220. Next, p type impurities are implanted selectively into a surficial portion of each body region 219 and a surficial portion of each p type region 224 to form body contact regions 221 and p type contact regions 225 (not shown).

Referring next to FIG. 22F, a gate insulating film 222 and an insulating film 226 (not shown) are formed on the epitaxial layer 217. The gate insulating film 222 and the insulating film 226 may be formed by growing an oxide film through thermal oxidation of the semiconductor crystal surface and then patterning the oxide film. Next, a gate electrode 223 is formed on the gate insulating film 222 and a floating electrode 227 (not shown) is formed on the insulating film 226. The gate electrode 223 and the floating electrode 227 may be formed by, for example, forming a polysilicon film with impurities added thereto on the entire surface and then selectively etching the polysilicon film through photolithography. Next, an interlayer insulating film 228 is formed so as to cover the gate electrode 223 and the floating electrode 227. Next, first contact holes 253 and second contact holes 254 (not shown) are formed in the interlayer insulating film 228 through photolithography.

Referring next to FIG. 22G, the semiconductor substrate 216 is ground and flattened on the second surface 230. The amount of grinding is not particularly limited, but is preferably set such that the semiconductor substrate 216 has a thickness of 90 μm to 310 μm after grinding, for example.

Referring next to FIGS. 22H and 22I, two-step light ion irradiation is performed. Two-step irradiation means that the epitaxial layer 217 is irradiated at different depths with light ions at two steps, as will be described hereinafter. In contrast, single irradiation of the epitaxial layer 217 at a predetermined depth position with light ions may be referred to as one-step irradiation.

Referring first to FIG. 22H, first light ion irradiation is performed on the second surface 230 of the semiconductor substrate 216. The irradiation may be performed with light ions such as protons, $^3He^{++}$, $^4He^{++}$. The light ion acceleration energy or an absorber arranged to reduce the light ion energy is adjusted so as to achieve a light ion range (implantation depth $D_3$) with which, for example, first crystal defect regions 1021 (see FIG. 21) are formed near the Z-directional central portion of the column layer 218. For example, the irradiation energy of light ions (e.g. $^3He^{++}$) may be about 5 MeV to 40 MeV. The dosage of light ions (e.g. $^3He^{++}$) may also be, for example, about $1\times10^{10}$ ions/cm$^2$ to $1\times10^{16}$ ions/cm$^2$. The first crystal defect region 1021 is thus formed.

Referring next to FIG. 22I, second light ion irradiation is performed on the second surface 230 of the semiconductor substrate 226. The irradiation may be performed with light ions such as protons, $^3He^{++}$, $^4He^{++}$, and preferably ions of the same type as the above-mentioned first light ion irradiation ($^3He^{++}$ or $^4He^{++}$ in this preferred embodiment). The light ion acceleration energy or an absorber arranged to reduce the light ion energy is adjusted so as to achieve a light ion range (implantation depth $D_4$) with which, for example, second crystal defect regions 1022 (see FIG. 21) are formed near the bottom portion of the column layer 218. For example, the irradiation energy of light ions (e.g. $^3He^{++}$) may be about 5 MeV to 40 MeV, which is lower than in the case of the first light ion irradiation. The dosage of light ions (e.g. $^3He^{++}$) may also be, for example, about $1\times10^{10}$ ions/cm$^2$ to $1\times10^{16}$ ions/cm$^2$, which is lower than in the case of the first light ion irradiation.

It is noted that the irradiation energy and the dosage during the second light ion irradiation have respective ranges from 5 MeV to 40 MeV and from $1\times10^{10}$ ions/cm$^2$ to $1\times10^{16}$ ions/cm$^2$ by way of example, which is the same as an example of the ranges of the irradiation energy and the dosage during the first light ion irradiation. However, the irradiation energy and the dosage during the second light ion irradiation may be lower than the irradiation energy and the dosage during the first light ion irradiation, respectively, within the foregoing ranges.

As a result, the second crystal defect regions 1022 are formed at a position shallower than that of the first crystal defect regions 1021 with respect to the second surface 230 of the semiconductor substrate 216. For example, the first crystal defect regions 1021 and the second crystal defect regions 1022 are preferably formed at positions 15 μm to 30 μm apart from each other.

Thereafter, the irradiated light ions are activated through, for example, thermal treatment. This results in obtaining a bimodal resistance distribution indicated by the resistance distribution curve 256 in FIG. 21 due to the first crystal defect regions 1021 and the second crystal defect regions 1022, which are formed at their respective different depth positions. If $^3He^{++}$ is selected as the light ions, for example, the introduced $^3He^{++}$ can be activated through thermal treatment at about 320° C. to 380° C. (e.g. 350° C.) for 30 to 90 minutes (e.g. 60 minutes). It is noted that depending on, for example, the conditions of the thermal treatment, the resistance distribution curve 256 may not have two peaks 259, 260, but may have, for example, the shape indicated by the alternate long and two short dashed line in FIG. 21.

Figure 22J:
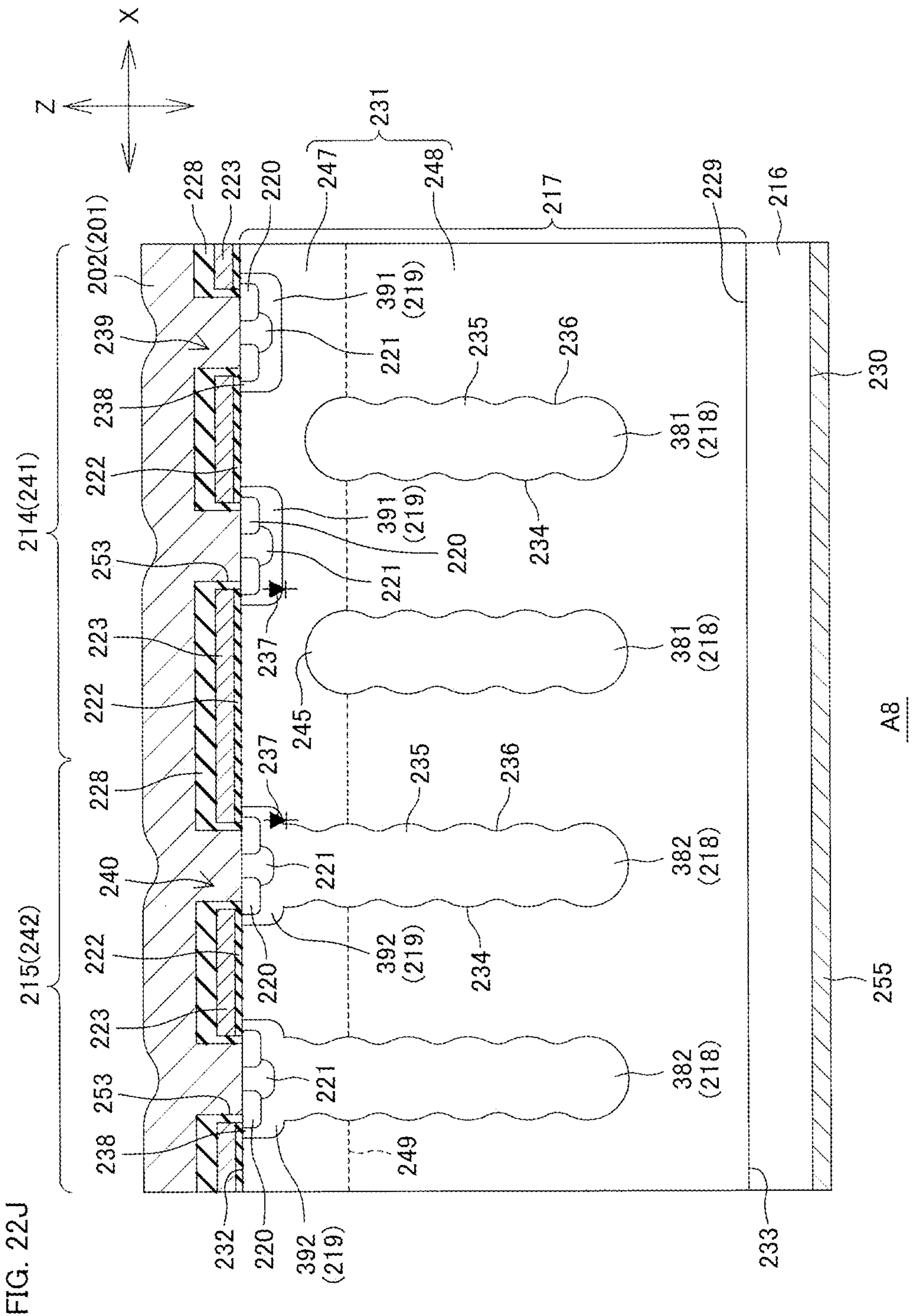

Referring next to FIG. 22J, a source electrode film 202 and a gate electrode film 203 (not shown) are formed on the interlayer insulating film 228. Next, a passivation film 209 (not shown) is formed so as to cover the source electrode film 202 and the gate electrode film 203. Next, pad openings 210, 211 (not shown) are formed in the passivation film 209 through photolithography.

Thereafter, a drain electrode 255 is formed on the second surface 230 of the semiconductor substrate 216, whereby the above-mentioned semiconductor device A8 can be obtained.

<<Operations and Effects of Semiconductor Device A8>>

First, an operation of the MISFET of the semiconductor device A8 will be described. When the drain electrode 255 is connected to an electric potential higher than that of the source electrode film 202 and a control voltage equal to or higher than a threshold voltage is applied to the gate electrode 223, an inversion layer (channel) is formed in the body region 219 (channel region 238). This causes a current path to be formed between the source region 220 and the drift region 231. When the gate electrode 223 is applied with no control voltage, no inversion layer is generated, so that the current path between the source and the drain is blocked. The parasitic diode 237 between the body region 219 and the drift region 231 is turned on when a forward voltage is applied, while it is turned off when a reverse voltage is applied. When the parasitic diode 237 is turned off, a reverse recovery phenomenon occurs. This causes a current to flow, which is called a reverse recovery current. Carrier migration causes a depletion layer to extend from the pn junction, whereby the parasitic diode 237 is turned off.

In this preferred embodiment, the first column layer 381 is separated from the first body region 391 to electrically float with respect to the first body region 391. Accordingly, the first column layer 381 does not contribute to the operation of the parasitic diode 237, which suppresses steep extension of the depletion layer during the reverse recovery phenomenon. This suppresses extension of the depletion layer extending in the Z direction of the epitaxial layer 217 and thereby suppresses the rate of extension of the depletion layer when the parasitic diode 237 is turned off. This reduces the rate of change in the reverse recovery current (dir/dt) to thereby improve the recovery characteristics.

Figure 23:
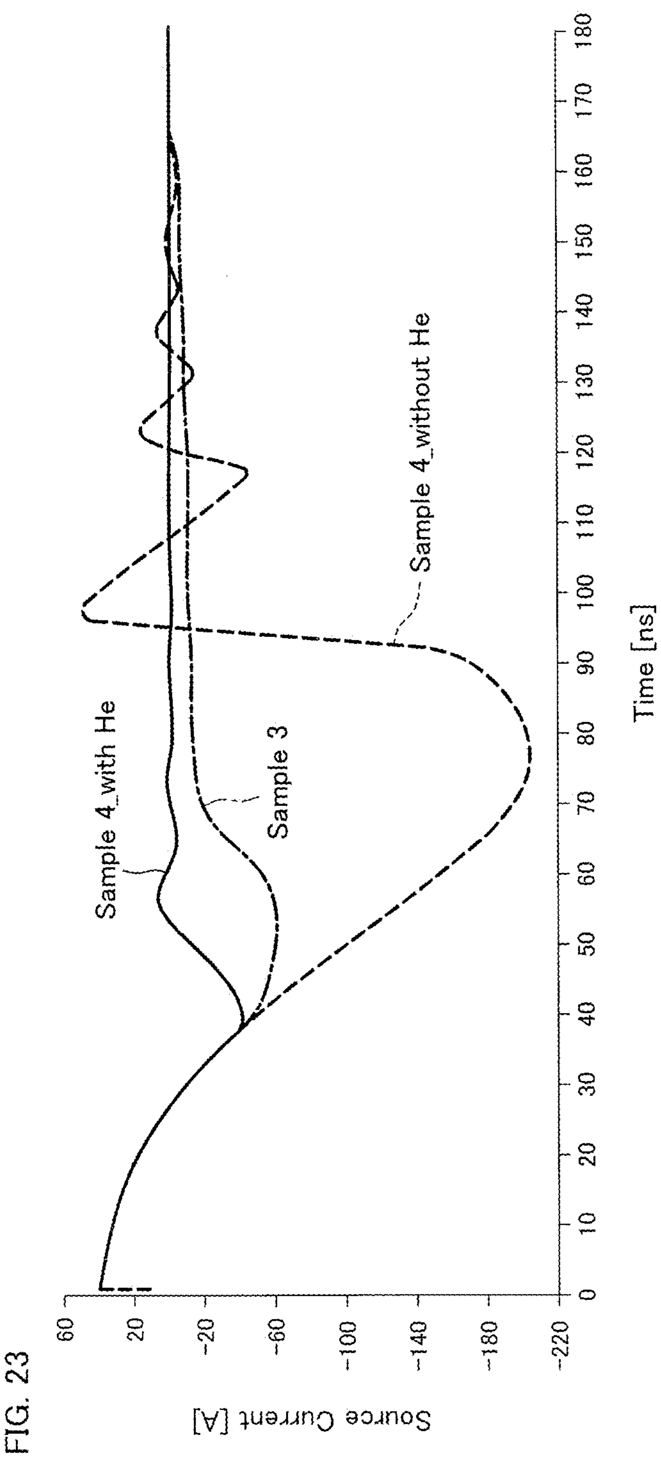
FIG. 23 is a view showing a simulation result of the recovery characteristics (source current).
Figure 24:
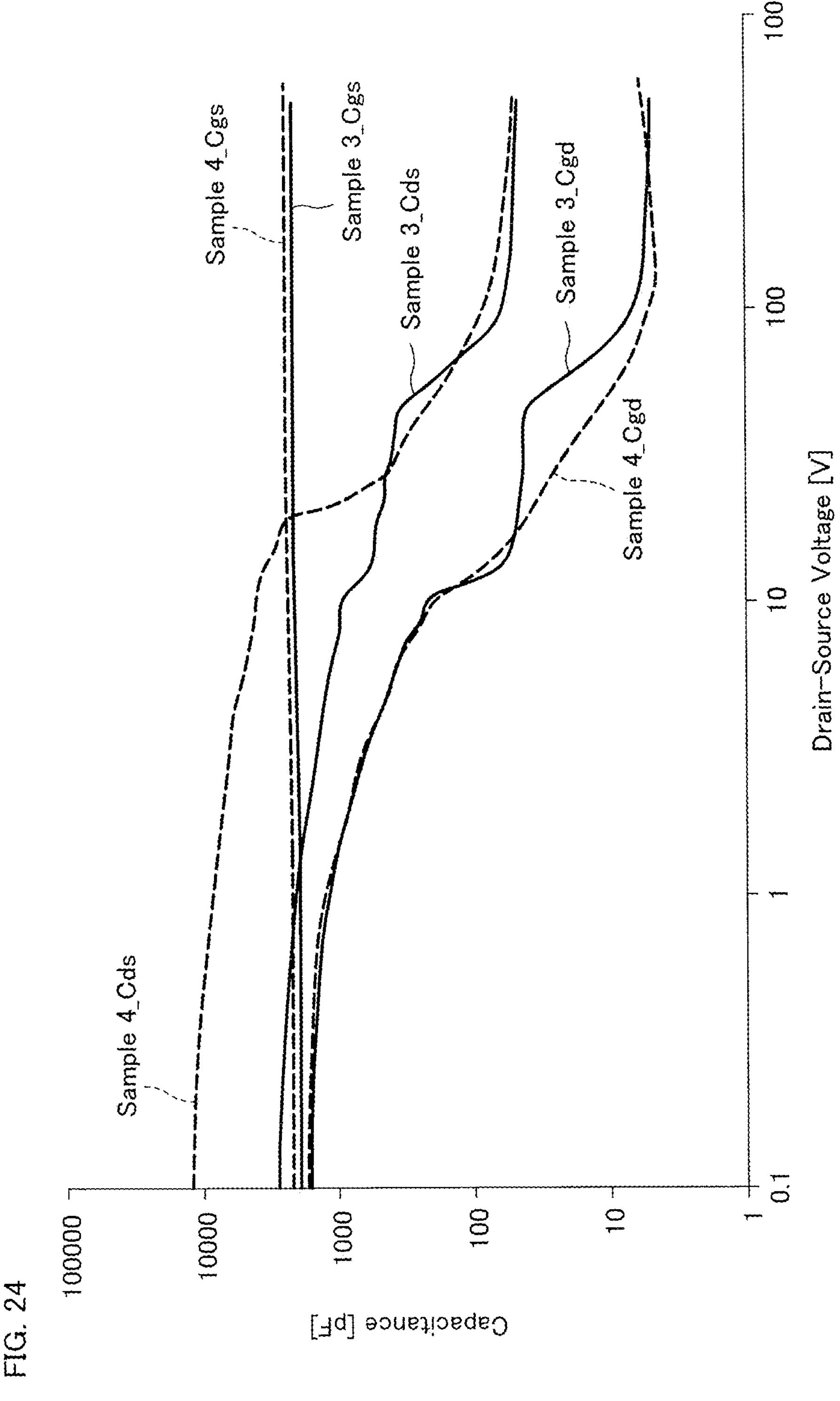
FIG. 24 is a view showing a simulation result of the capacitance characteristics.

FIG. 23 is a view showing a simulation result of the recovery characteristics (source current). FIG. 24 is a view showing a simulation result of the capacitance characteristics.

Next, how the structure of the above-mentioned semiconductor device A8 can improve the recovery characteristics was verified through a simulation. In FIGS. 23 and 24, "sample 3" is an example in which the first element structure 239 of the semiconductor device A8 employs a structure in which the first column layer 381 is separated from the body region 219, while "sample 4" is an example in which the first element structure 239 of the semiconductor device A8 employs a structure in which the column layer 218 is connected to the body region 219 as with the second column layer 382. In addition, "with He" and "without He" attached to "sample 4" indicate, respectively, structures with and without He irradiation at a Z-directional middle portion of the drift region 231. It is noted that "sample 3" has no condition set for He irradiation.

As shown in FIG. 23, it could be confirmed from results of the simulation that as with sample 4_with He, "sample 3" can have a reduced reverse current (Irr) even without He irradiation, compared to sample 4_without He. In accordance with the semiconductor device A8 of this preferred embodiment, the reverse recovery characteristics of the parasitic diode 237 can therefore be made closer to soft recovery characteristics, compared to sample 4_without He. In addition, since no He irradiation is required and thereby crystal defects that impede current (source-drain current) flowing in the Z direction of the drift region 231 can be reduced, the ON-resistance can be suppressed from increasing, compared to sample 4_with He.

Next, the parasitic capacitance was compared between sample 3 and sample 4. As a result, sample 3 shows reduction in the Cgs (gate-source capacitance), the Cds (drain-source capacitance), and the Cgd (gate-drain capacitance) all being lower than those of sample 4, as shown in FIG. 24. It is therefore possible to control both the recovery characteristics and the parasitic capacitance by adjusting the ratio of combination between the first element structures 239 and the second element structures 240. For example, if the semiconductor device A8 is intended for in-vehicle use and it is desirable to set the lifetime control weaker, the ratio of the first element structure 239 may be set lower.

Figure 25:
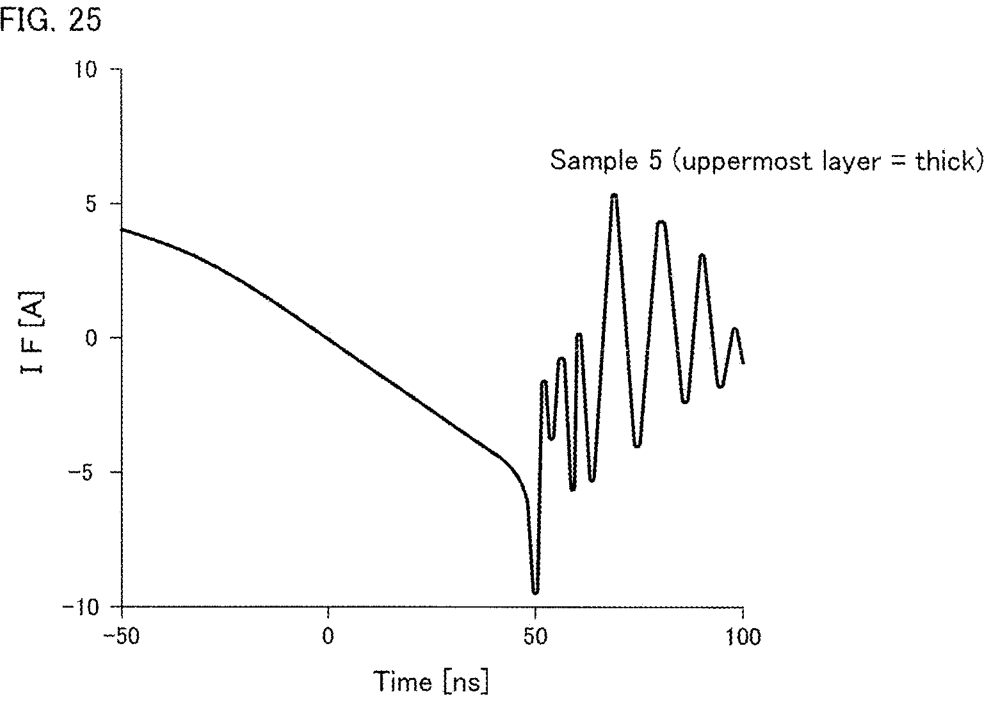
FIG. 25 is a view showing an evaluation result of the recovery characteristics of sample 5.
Figure 26:
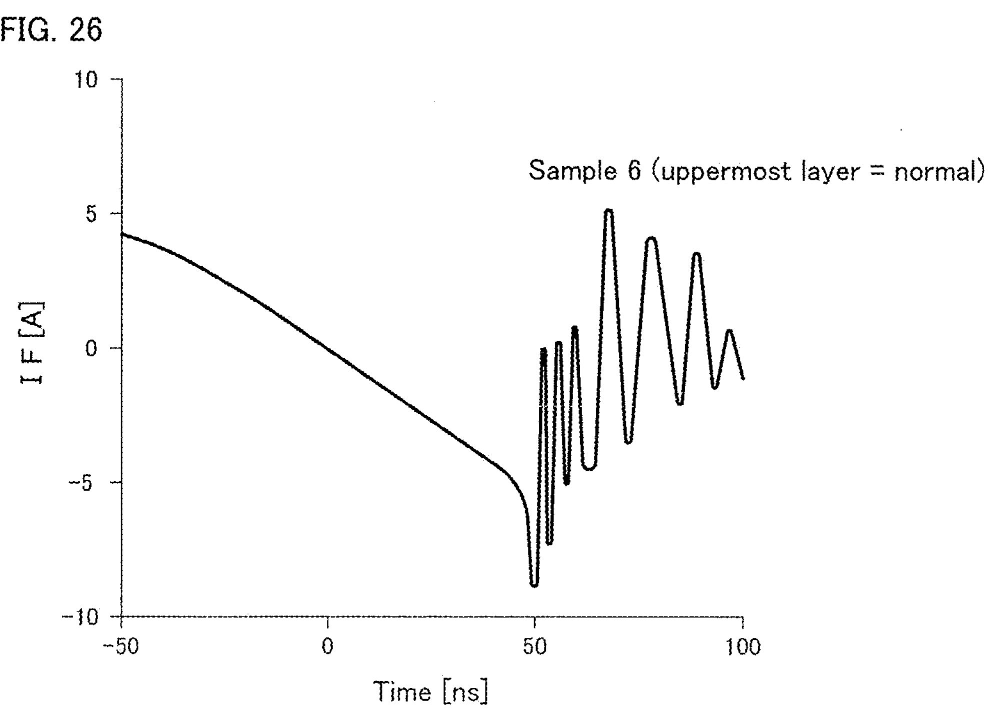
FIG. 26 is a view showing an evaluation result of the recovery characteristics of sample 6.
Figure 27:
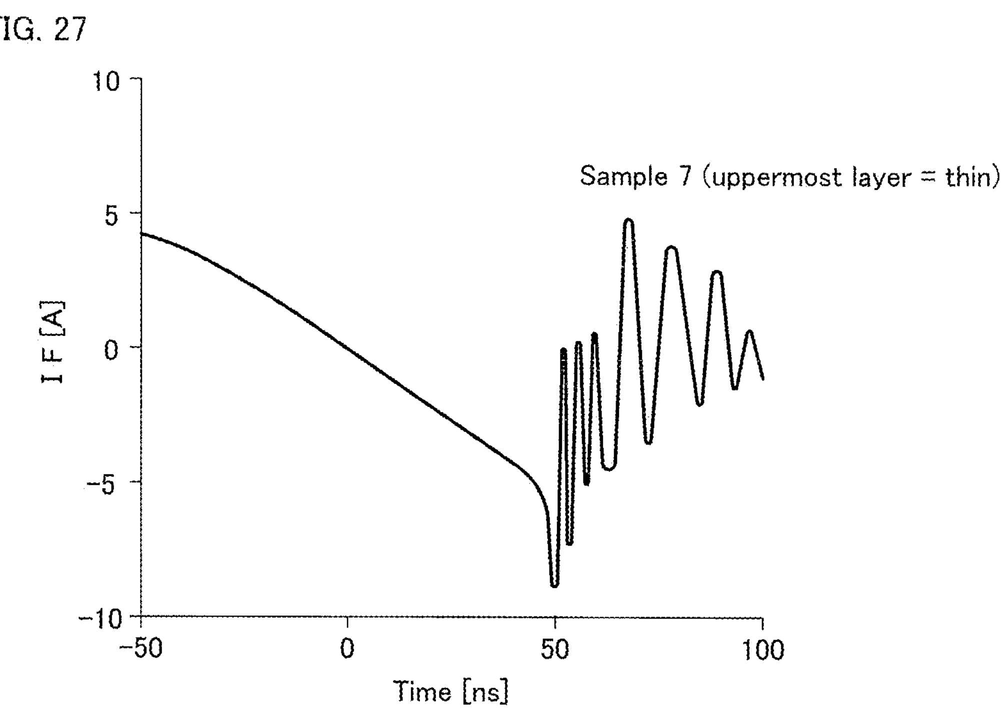
FIG. 27 is a view showing an evaluation result of the recovery characteristics of sample 7.
Figure 28:
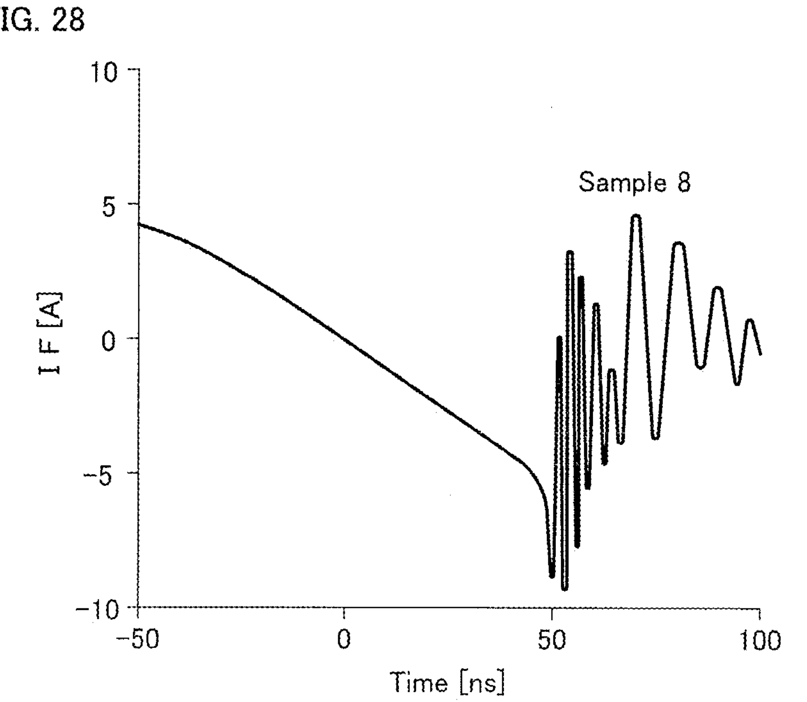
FIG. 28 is a view showing an evaluation result of the recovery characteristics of sample 8.
Figures 29, 30:
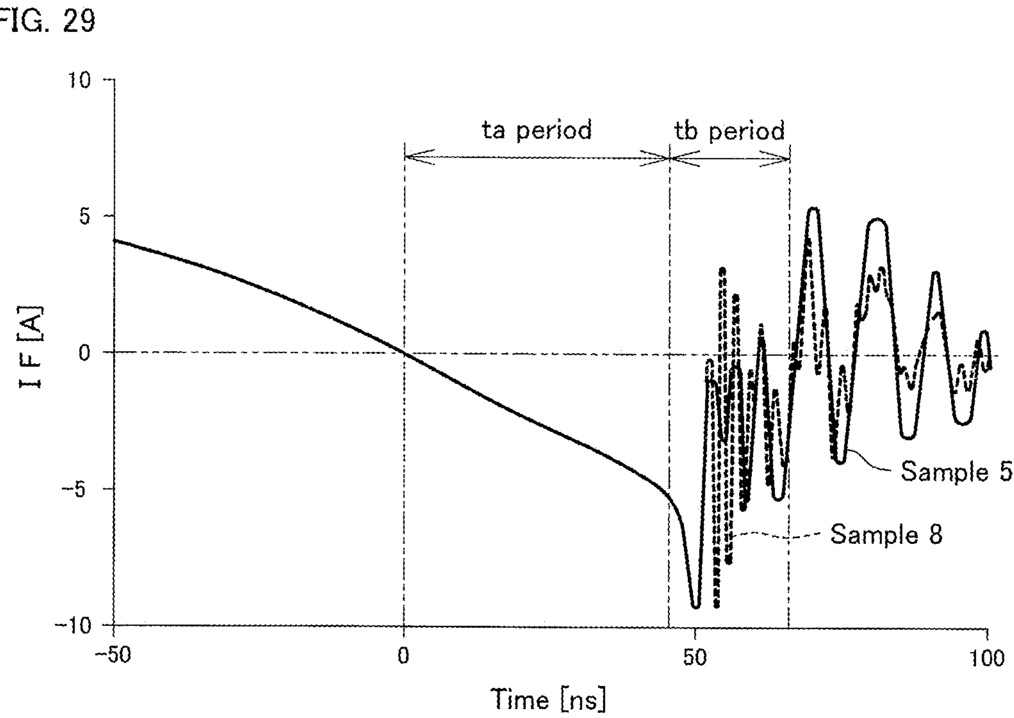
FIG. 29 is a view for comparing recovery characteristics between sample 5 and sample 8.
FIG. 30 is a view for comparing withstand voltage characteristics (breakdown voltage ($BV_{DSS}$)) between sample 9 and sample 10.

Next, how the structure of the above-mentioned semiconductor device A8 can improve the recovery characteristics was verified through experiments. FIGS. 25 to 27 are views showing evaluation results of the recovery characteristics of respective samples 5 to 7. FIG. 28 is a view showing an evaluation result of the recovery characteristics of sample 8. FIG. 29 is a view for comparing the recovery characteristics between sample 5 and sample 8.

Samples 5 to 7 are all examples in which the first element structure 239 of the semiconductor device A8 employs a structure in which the first column layer 381 is separated from the body region 219. The difference between the samples is the thickness of the uppermost n type semiconductor layer 264 as a result of multi-epitaxial growth (see FIG. 22C). Among three samples 5 to 7, the uppermost n type semiconductor layer 264 is thickest in sample 5, next thickest in sample 6, and least thickest in sample 7. On the other hand, sample 8 is an example in which the first element structure 239 of the semiconductor device A8 employs a structure in which the column layer 218 is connected to the body region 219 as with the second column layer 382. It is noted that the drift region 231 was applied with one-step He irradiation for all samples 5 to 7 and 8.

It could be confirmed from a comparison among FIGS. 25 to 28 that the ringing noise during the tb period, during which the reverse recovery time (trr) returns from a peak value to zero, for samples 5 to 7 is improved compared to sample 8. For a more detailed understanding, in FIG. 29, the waveforms of recovery currents for sample 1 and sample 2 are superimposed. FIG. 29 also shows that the ringing noise during the tb period for sample 5 is improved significantly compared to sample 8.

Further, in the semiconductor device A8, the first column layer 381 is separated from the first body region 391 in a horizontal direction along the first surface 232 of the epitaxial layer 217. That is, since the first body region 391 is not formed on an extension of the first column layer 381 in the Z direction of the epitaxial layer 217, the first column layer 381 cannot come into contact with the first body region 391 even if the first column layer 381 is brought closer to the first surface 232. It is therefore possible to suppress an increase in the thickness of the epitaxial layer 217 as a result of providing spacing between the first column layer 381 and the first body region 391 and thereby suppress the current flowing in the Z direction of the drift region 231 from having an increased ON-resistance.

Further, in the semiconductor device A8, since the first portion 247 of the drift region 231, which is a region in the vicinity of the parasitic diode 237, has a relatively higher first impurity concentration, it is possible to suppress steep extension of the depletion layer in the Z direction (vertical direction) of the drift region 231 during the reverse recovery phenomenon and cause the first portion 247 to have a low resistance. On the other hand, since the second portion 248, which is closer to the second surface 233 with respect to the top portion 245 of the first column layer 381, has a second impurity concentration relatively lower than the first impurity concentration, it is possible to facilitate extension of the depletion layer from the first column layer 381 in the horizontal direction along the first surface 232 of the epitaxial layer 217 and thereby maintain the withstand voltage.

Furthermore, the semiconductor device A8 has, as the second element structure 240, a super junction structure in which the second column layer 382 extends from the second body region 392. Accordingly, by defining the spacing between second column layers 382 such that the depletion layers extending horizontally from the second column layers 382 are integrated, the inherent characteristics of the super junction structure of achieving excellent ON-resistance and switching speed can also be realized.

Figure 31:
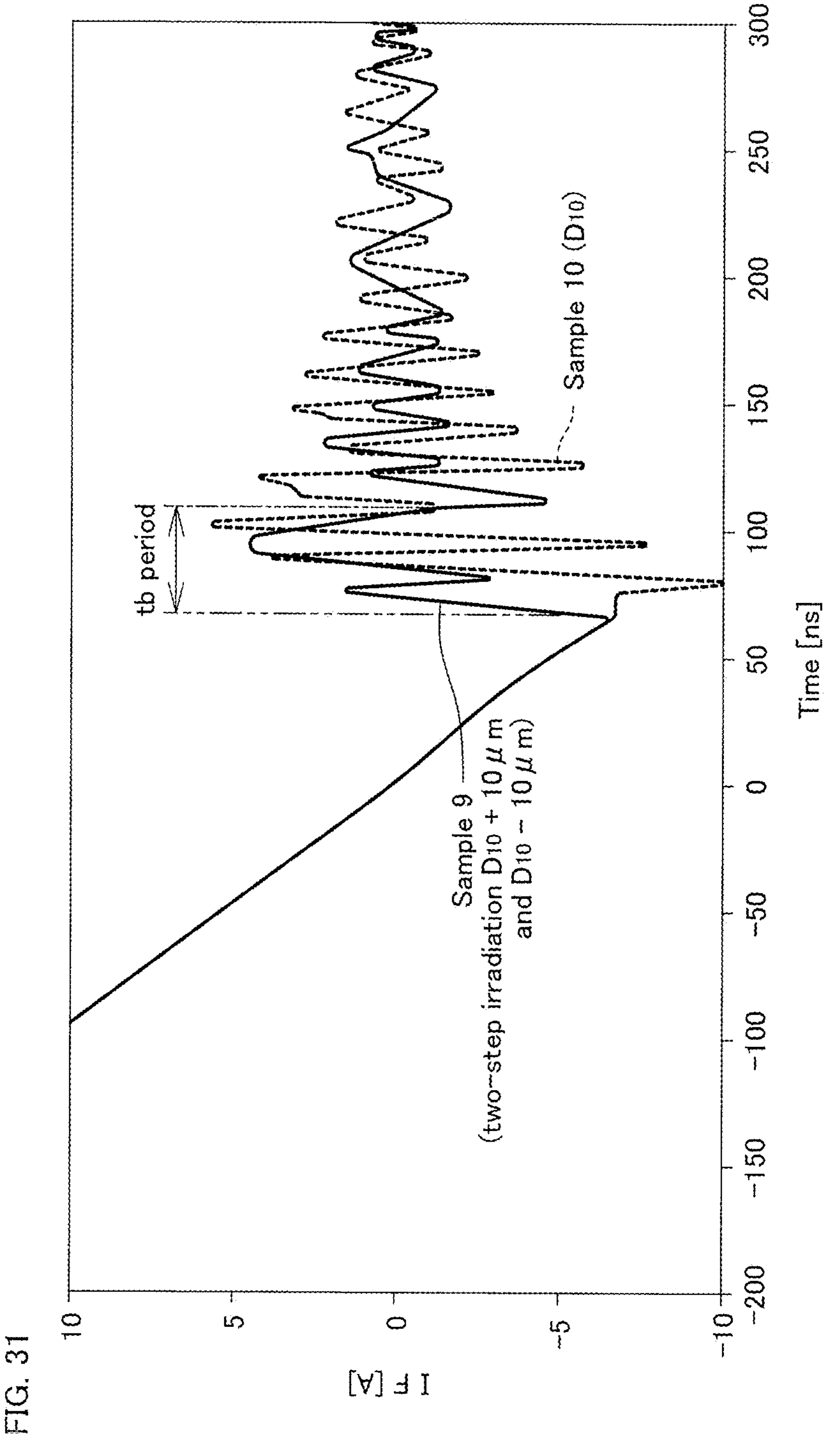
FIG. 31 is a view for comparing recovery characteristics between sample 9 and sample 10.

FIG. 30 is a view for comparing withstand voltage characteristics (breakdown voltage ($BV_{DSS}$)) between sample 9 and sample 10. FIG. 31 is a view for comparing the recovery characteristics between sample 9 and sample 10.

Next, how the resistance distribution (bimodal distribution) indicated by the resistance distribution curve 256 in FIG. 21 can improve the withstand voltage characteristics and the recovery characteristics was verified through experiments.

In FIGS. 30 and 31, sample 10 is an example in which the first element structure 239 of the semiconductor device A8 employs a structure in which the column layer 218 is connected to the body region 219 as with the second column layer 382 and one-step He irradiation was applied at a predetermined depth position.

In contrast, sample 9 is an example employing the same structure as sample 10, except that He irradiation (two-step irradiation) was applied at depth positions ($D_{10}$+10 μm and $D_{10}$−10 μm) each 10 μm apart from the He depth position $D_{10}$ of sample 10, respectively, toward the first surface 232 and the second surface 233 of the epitaxial layer 217. It is noted that for sample 9, the dosage during irradiation at the relatively deeper position ($D_{10}$+10 μm) from the second surface 233 of the semiconductor substrate 216 was fixed, while the dosage during irradiation at the relatively shallower position ($D_{10}$−10 μm) was divided into conditions A, B, C, and D in the order from the lowest to highest in the experiment shown in FIG. 30.

It could be confirmed from FIG. 30 that sample 9 has an improved breakdown voltage ($BV_{DSS}$) compared to sample 10 under all of the conditions A, B, C, and D. It could also be confirmed from FIG. 31 that the ringing noise during the tb period, during which the reverse recovery time (trr) returns from a peak value to zero, for sample 9 is improved compared to sample 10.

Ninth Preferred Embodiment

Figure 32:
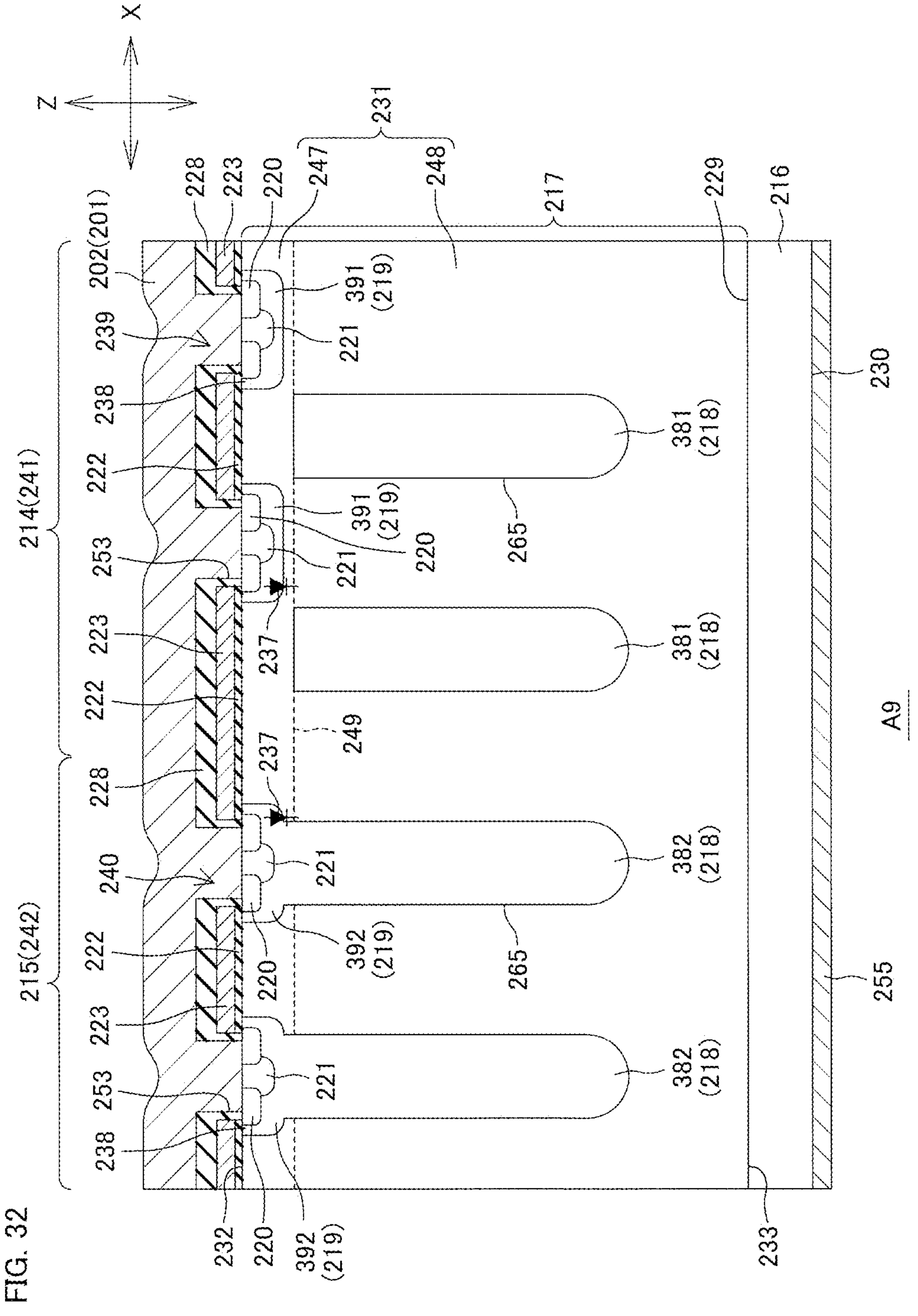
FIG. 32 is a schematic cross-sectional view of a semiconductor device according to a ninth preferred embodiment of the present disclosure.

FIG. 32 is a schematic cross-sectional view of a semiconductor device A9 according to a ninth preferred embodiment of the present disclosure.

The column layers 218 may each have a concavo-convex side surface 234 as in the eighth preferred embodiment or, alternatively, may have a flat side surface 265 as with the semiconductor device A9. In this case, the semiconductor device A9 may be manufactured through, for example, steps shown in FIGS. 33A to 33D.

Figure 33A:
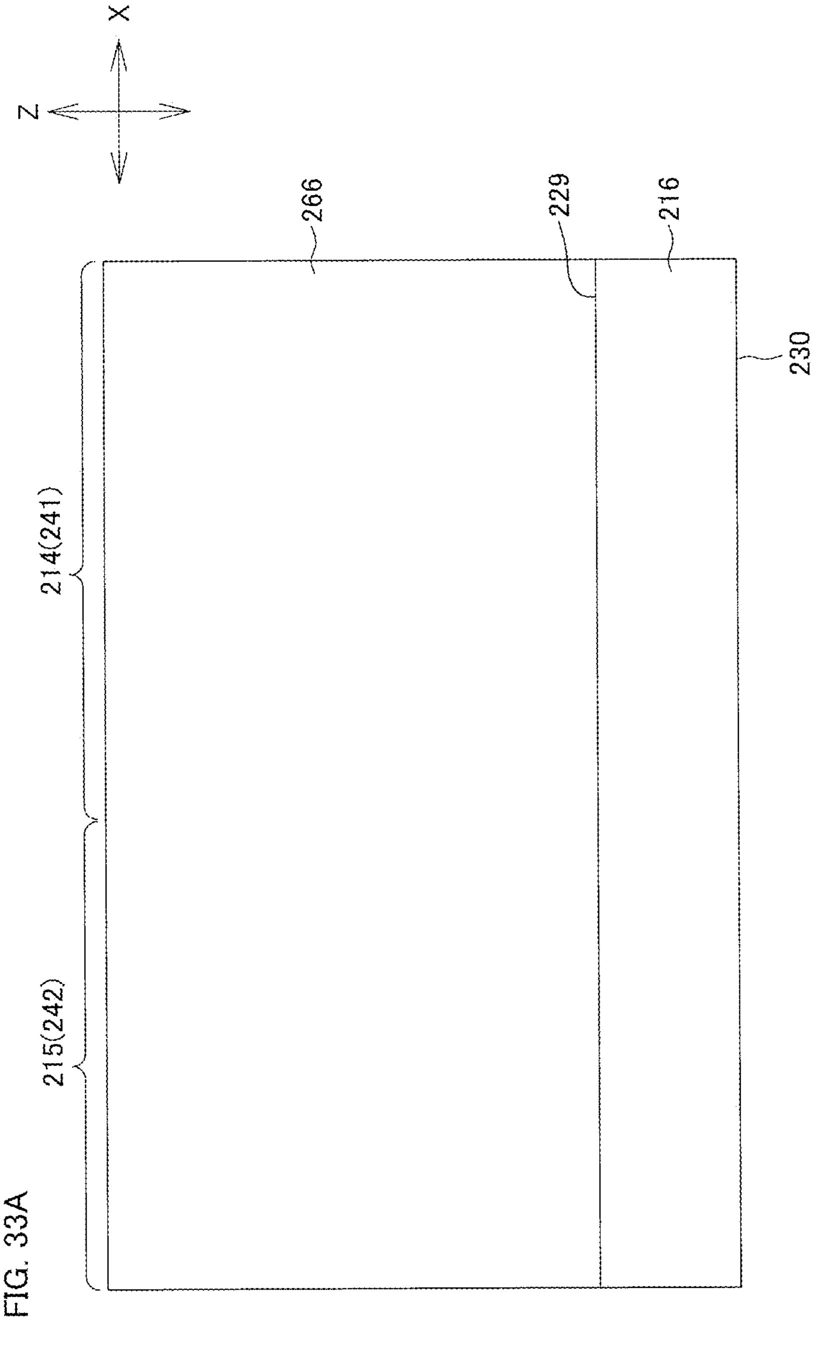
FIG. 33A is a view showing a process step for manufacturing the semiconductor device in FIG. 32.

In order to manufacture the semiconductor device A9, referring first to FIG. 33A, an initial base layer 266 is formed on a semiconductor substrate 216 through epitaxial growth.

Figure 33B:
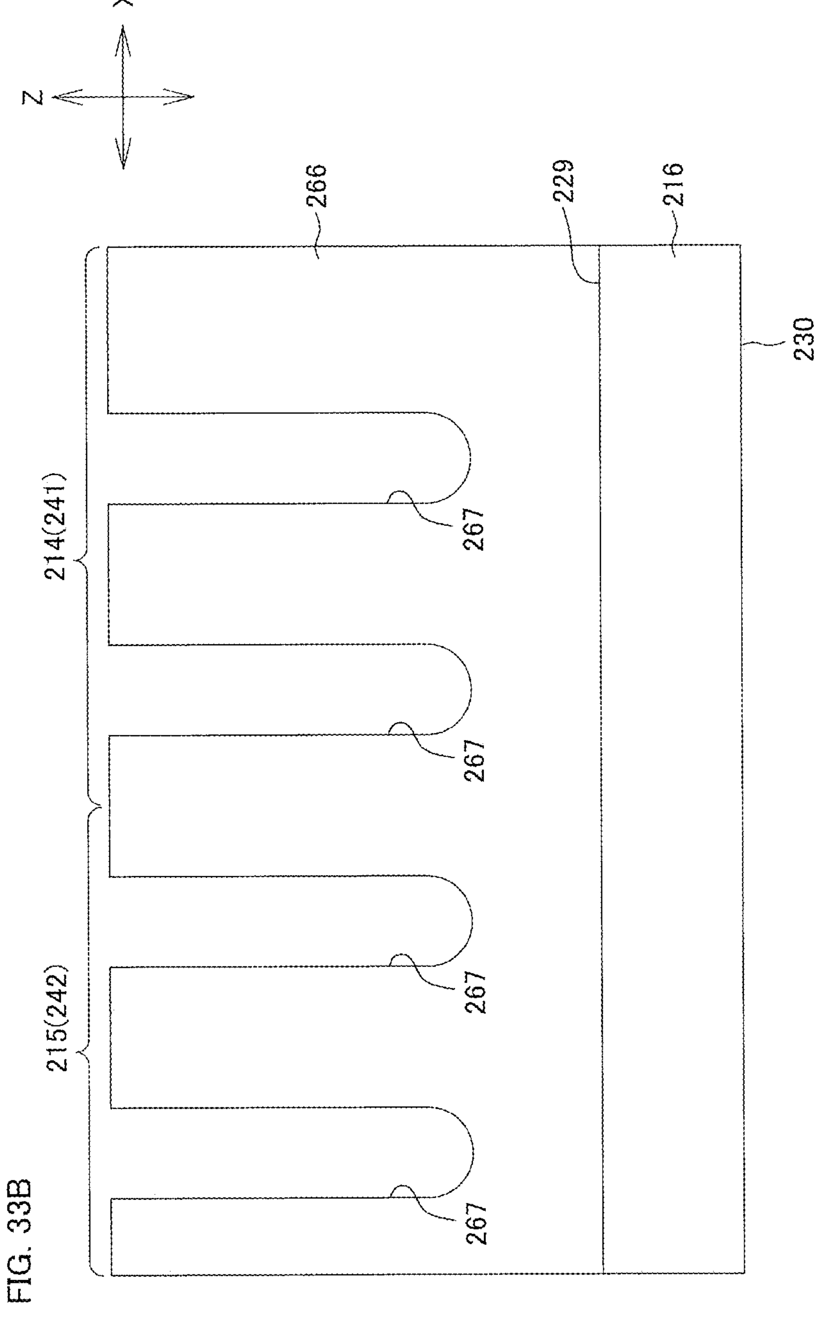
FIG. 33B is a view showing a step following FIG. 33A.

Referring next to FIG. 33B, regions in which column layers 218 are to be formed are removed selectively through etching in the initial base layer 266. This causes trenches 267 (more specifically, deep trenches) to be formed.

Figure 33C:
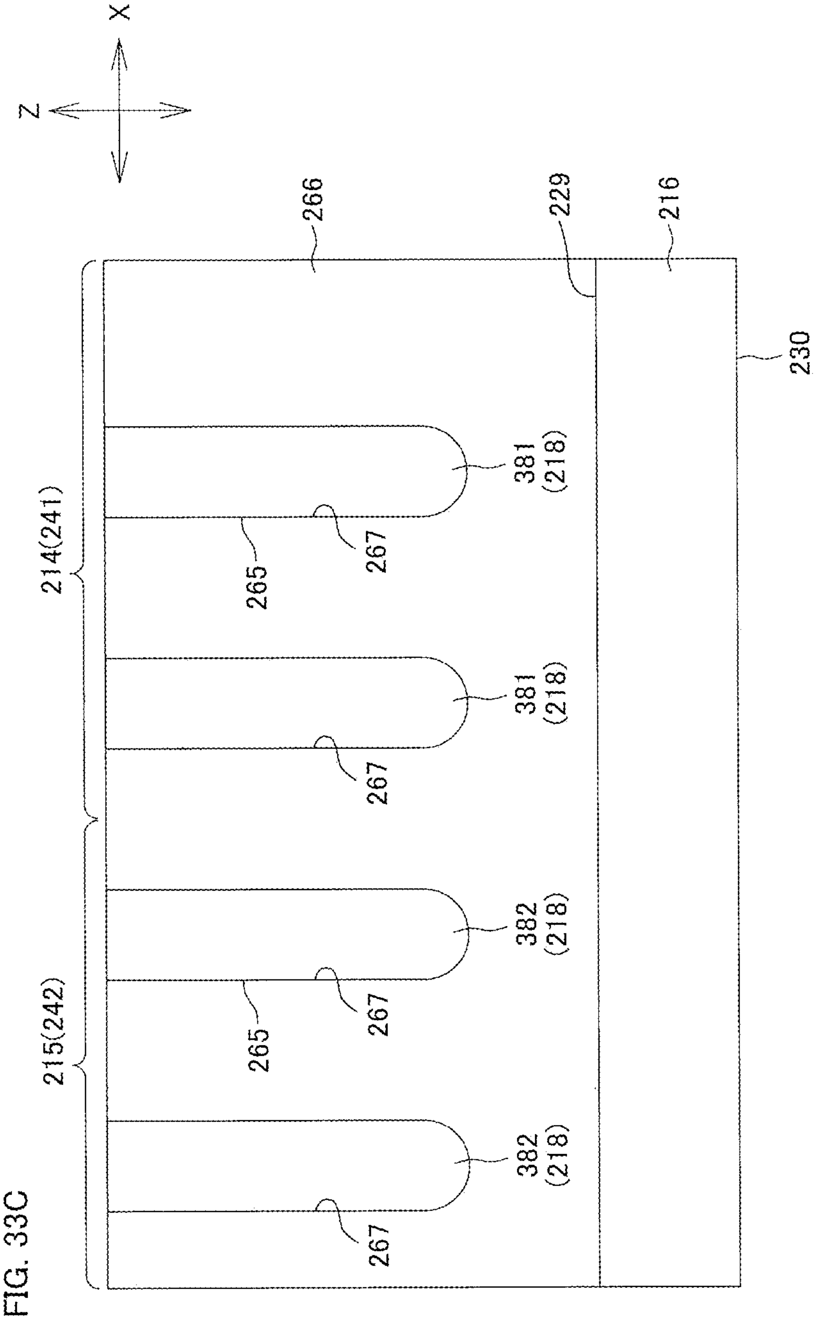
FIG. 33C is a view showing a step following FIG. 33B.

Referring next to FIG. 33C, the trenches 267 are backfilled with a semiconductor layer while p type impurities are implanted. This causes column layers 218 to be formed in the initial base layer 266.

Figure 33D:
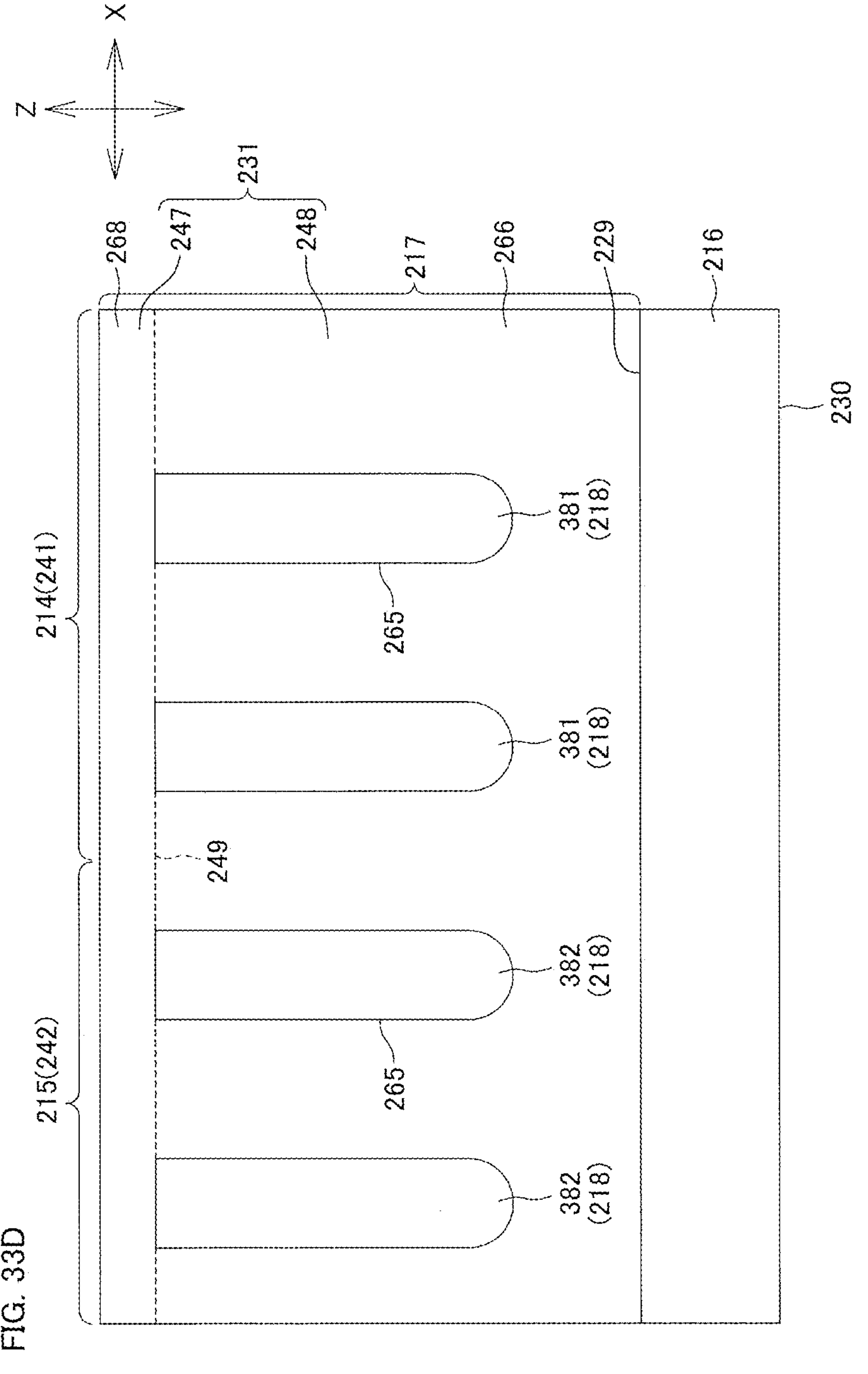
FIG. 33D is a view showing a step following FIG. 33C.

Referring next to FIG. 33D, an n type semiconductor layer 268 is laminated on the initial base layer 266 with no implantation of p type impurities. The n type semiconductor layer 268 and the initial base layer 266 are thus integrated to form an epitaxial layer 217 (drift region 231). At this time, the impurity concentration when the n type semiconductor layer 268 is grown is higher than the impurity concentration when the initial base layer 266 is grown. Thus, a first portion 247 and a second portion 248 of the drift region 231 can be formed.

Thereafter, the same steps as in FIGS. 22E to 22J are followed, whereby the semiconductor device A9 can be obtained.

Tenth Preferred Embodiment

Figure 34:
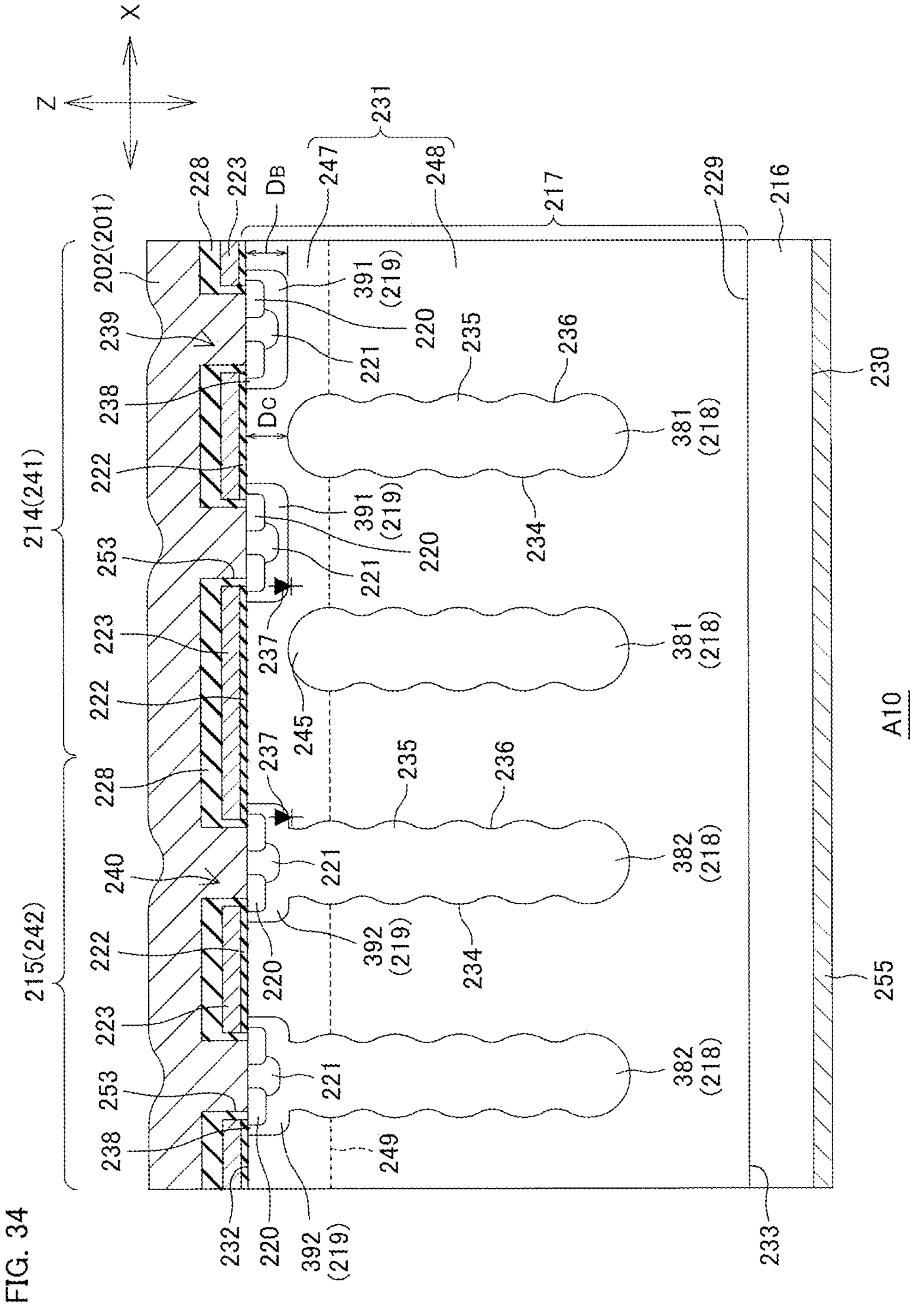
FIG. 34 is a schematic cross-sectional view of a semiconductor device according to a tenth preferred embodiment of the present disclosure.

FIG. 34 is a schematic cross-sectional view of a semiconductor device A10 according to a tenth preferred embodiment of the present disclosure.

The first column layers 381 may each have a top portion 245 at a position deeper than that of the bottom portion of the first body region 391 as in the eighth preferred embodiment or, alternatively, may have a top portion 245 at a depth position equal to that of the bottom portion of the first body region 391 as with the semiconductor device A10. That is, the distance $D_C$ from the first surface 232 of the epitaxial layer 217 to the first column layer 381 may be equal to the distance $D_B$ from the first surface 232 to the bottom portion of the first body region 391.

Eleventh Preferred Embodiment

Figure 35:
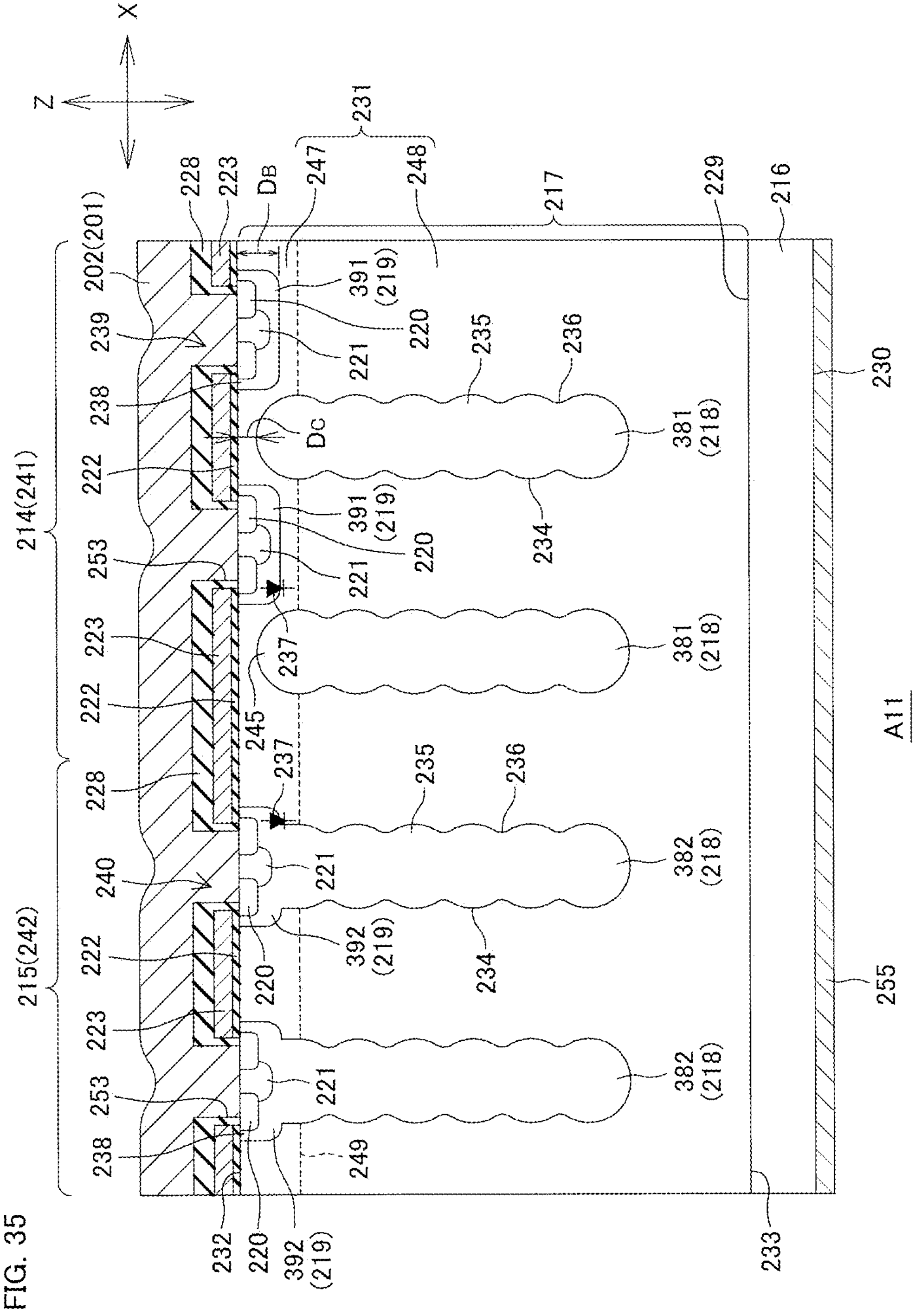
FIG. 35 is a schematic cross-sectional view of a semiconductor device according to an eleventh preferred embodiment of the present disclosure.

FIG. 35 is a schematic cross-sectional view of a semiconductor device A11 according to an eleventh preferred embodiment of the present disclosure.

The first column layers 381 may each have a top portion 245 at a position deeper than that of the bottom portion of the first body region 391 as in the eighth preferred embodiment or, alternatively, may have a top portion 245 at a position shallower than that of the bottom portion of the first body region 391 as with the semiconductor device A11. That is, the distance $D_C$ from the first surface 232 of the epitaxial layer 217 to the first column layer 381 may be shorter than the distance $D_B$ from the first surface 232 to the bottom portion of the first body region 391.

Twelfth Preferred Embodiment

Figure 36:
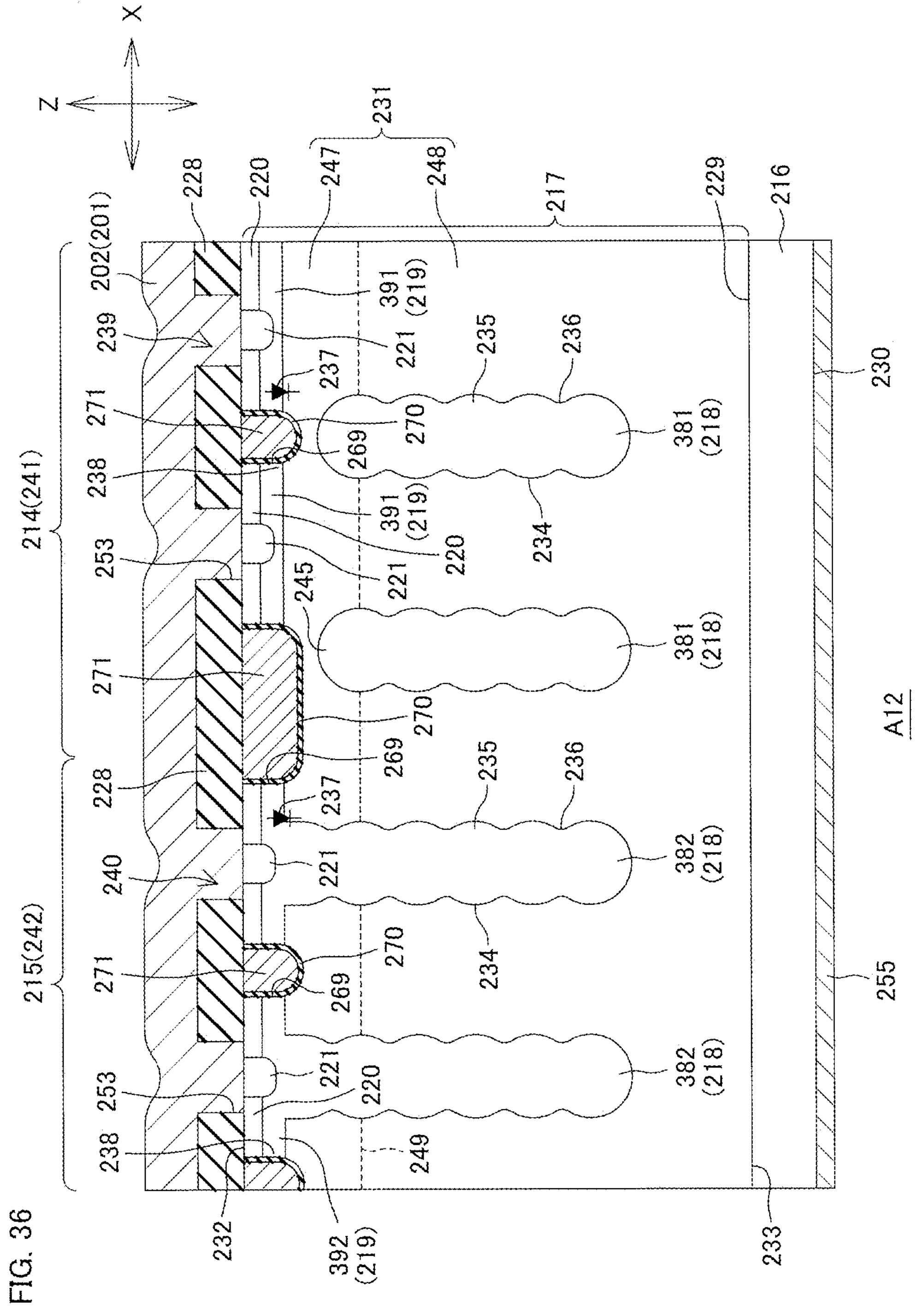
FIG. 36 is a schematic cross-sectional view of a semiconductor device according to a twelfth preferred embodiment of the present disclosure.

FIG. 36 is a schematic cross-sectional view of a semiconductor device A12 according to a twelfth preferred embodiment of the present disclosure.

The element structure of the semiconductor device A12 may be a planar gate structure as in the eighth preferred embodiment or, alternatively, may be a trench gate structure as with the semiconductor device A12.

The semiconductor device A12 includes a gate trench 269, a gate insulating film 270, and a gate electrode 271.

The gate trench 269 penetrates the source region 220 and the body region 219 from the first surface 232 of the epitaxial layer 217. The gate insulating film 270 is formed on the interior surface of the gate trench 269. The gate electrode 271 is filled, in the gate trench 269, inside the gate insulating film 270 therebetween. This forms a trench gate structure.

The first column layer 381 may be formed below the gate trench 269 and thereby separated from the first body region 391 in a direction along the first surface 232 of the epitaxial layer 217. In the semiconductor device A12, the first column layer 381 is further separated from the gate trench 269 toward the second surface 233 of the epitaxial layer 217.

Thirteenth Preferred Embodiment

Figure 37:
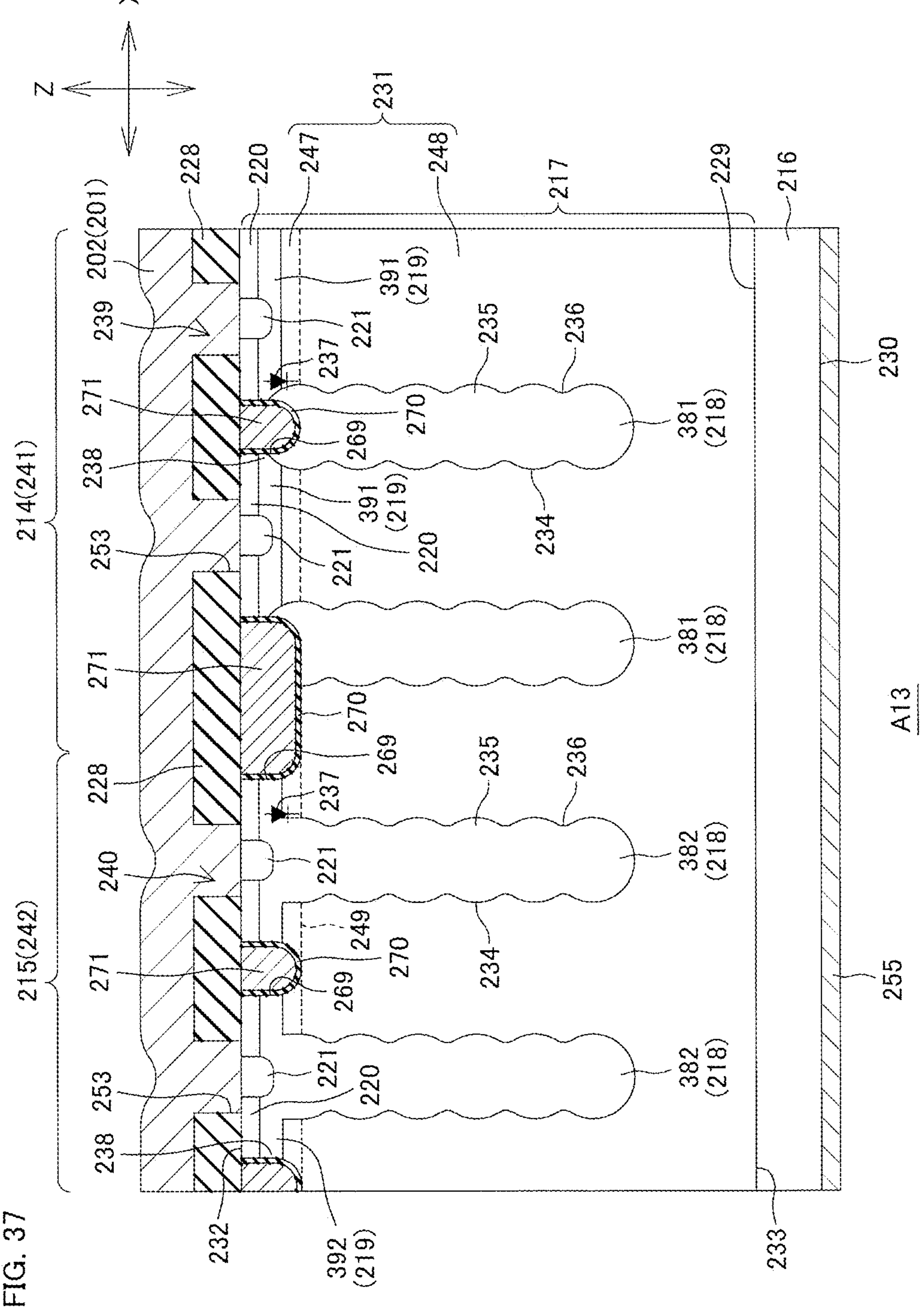
FIG. 37 is a schematic cross-sectional view of a semiconductor device according to a thirteenth preferred embodiment of the present disclosure.

FIG. 37 is a schematic cross-sectional view of a semiconductor device A13 according to a thirteenth preferred embodiment of the present disclosure.

The first column layer 381 may be separated from the gate trench 269 as in the twelfth preferred embodiment or, alternatively, may be in contact with the gate trench 269 as with the semiconductor device A13. More specifically, the first column layer 381 may be formed continuously to a bottom portion of the gate trench 269 and extend from the gate trench 269 toward the second surface 233 of the epitaxial layer 217.

Fourteenth Preferred Embodiment

Figure 38:
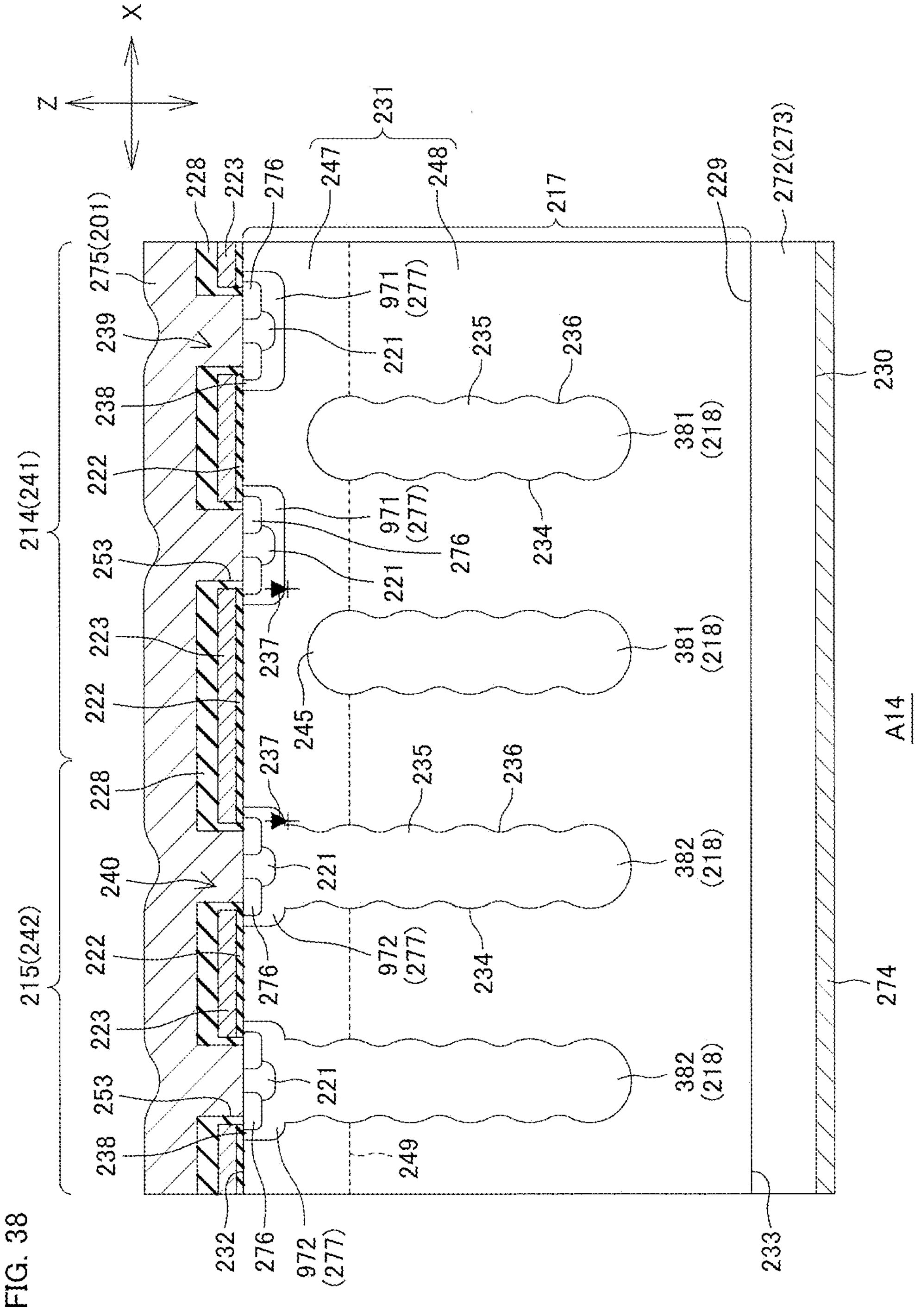
FIG. 38 is a schematic cross-sectional view of a semiconductor device according to a fourteenth preferred embodiment of the present disclosure.

FIG. 38 is a schematic cross-sectional view of a semiconductor device A14 according to a fourteenth preferred embodiment of the present disclosure.

The element structure may be a MISFET as in the above-mentioned preferred embodiments or, alternatively, may be an IGBT (Insulated Gate Bipolar Transistor) as with the semiconductor device A14. In this case, the $n^+$ type semiconductor substrate 216 may be replaced with a $p^+$ type semiconductor substrate 272 ($p^+$ type collector layer 273). Further, the drain electrode 255 and the source electrode film 202 may also be referred to, respectively, as a collector electrode 274 and an emitter electrode film 275. In addition, the $n^+$ type source region 220 and the p type body region 219 may also be referred to, respectively, as an $n^+$ type emitter region 276 and a p type base region 277 (a first base region 971 and a second base region 972).

While preferred embodiments of the present disclosure have heretofore been described, the present disclosure may be embodied in other modes.

For example, an arrangement may also be adopted in which the conductivity type of the semiconductor portions in the semiconductor devices A1 to A14 is inverted. For example, in the semiconductor devices A1 to A14, the p type portions may be of n type, while the n type portions may be of p type.

While FIG. 21 takes an example in which the resistance distribution curve 256 has two peaks 259, 260, the resistance distribution curve 256 may have three or more peaks.

Also, in the semiconductor devices A8 to A14, the first column layer 381 of the first element structure 239 may be connected to the body region 219 (first body region 391) as with the second column layer 382 of the second element structure 240.

The preferred embodiments of the present disclosure are illustrative in all respects and should not be construed as limiting, and are intended to include modifications in all respects.

From the description herein and the drawings, the following appended features may be extracted.

APPENDIX 1-1

A semiconductor device comprising:

- a semiconductor layer having a first surface and a second surface;
- an element structure formed on the first surface side of the semiconductor layer and including a first conductivity type first region and a second conductivity type second region in contact with the first region;
- a gate electrode opposing the second region with a gate insulating film therebetween;
- a first conductivity type third region formed in the semiconductor layer to be in contact with the second region; and
- a second conductivity type first column layer separated from the second region in a direction along the first surface of the semiconductor layer and extending in a thickness direction of the semiconductor layer.

For example, if the first conductivity type is n type and the second conductivity type is p type and when the third region is connected to an electric potential higher than that of the first region and the gate electrode is applied with a control voltage equal to or higher than a threshold voltage, an inversion layer (channel) is formed in the second region. This causes a current path to be formed between the first region and the third region. When the gate electrode is applied with no control voltage, no inversion layer is generated, so that the current path is blocked. The pn junction between the second region and the third region forms a parasitic diode. The parasitic diode is turned on when a forward voltage is applied, while it is turned off when a reverse voltage is applied. When the parasitic diode is turned off, a reverse recovery phenomenon occurs. This causes a current to flow, which is called a reverse recovery current. Carrier migration causes a depletion layer to extend from the pn junction, whereby the parasitic diode is turned off.

In the arrangement of appendix 1-1, the first column layer is separated from the second region to electrically float with respect to the second region in the first element structure. Accordingly, the first column layer does not contribute to the operation of the parasitic diode, which suppresses steep extension of the depletion layer during the reverse recovery phenomenon. This suppresses extension of the depletion layer extending in the thickness direction of the semiconductor layer and thereby suppresses the rate of extension of the depletion layer when the parasitic diode is turned off. This reduces the rate of change in the reverse recovery current (dir/dt) to thereby improve the recovery characteristics.

Further, the first column layer is separated from the second region in a horizontal direction along the first surface of the semiconductor layer. That is, since the second region is not formed on an extension of the first column layer in the thickness direction of the semiconductor layer, the first column layer cannot come into contact with the second region even if the first column layer is brought closer to the first surface. It is therefore possible to suppress an increase in the thickness of the semiconductor layer as a result of providing spacing between the first column layer and the second region and thereby suppress the current flowing in the thickness direction of the semiconductor layer from having an increased ON-resistance.

APPENDIX 1-2

The semiconductor device according to appendix 1-1, wherein the third region includes a first portion formed between a top portion of the first column layer and the second region and having a first impurity concentration and a second portion formed closer to the second surface of the semiconductor layer with respect to the first portion and having a second impurity concentration lower than the first impurity concentration.

In accordance with the arrangement above, since the region in the vicinity of the parasitic diode has a relatively higher first impurity concentration, it is possible to suppress steep extension of the depletion layer in the thickness direction (vertical direction) of the semiconductor layer during the reverse recovery phenomenon and cause the region to have a low resistance. On the other hand, since the region closer to the second surface with respect to the top portion of the first column layer has a second impurity concentration relatively lower than the first impurity concentration, it is possible to facilitate extension of the depletion layer from the first column layer in the horizontal direction along the first surface of the semiconductor layer and thereby maintain the withstand voltage.

APPENDIX 1-3

The semiconductor device according to appendix 1-2, wherein

- the first column layer has a concavo-convex side surface formed with a plurality of repeating sets of convex portions and concave portions in the thickness direction of the semiconductor layer, and
- the top portion of the first column layer includes the convex portion that is closest to the first surface of the semiconductor layer.

APPENDIX 1-4

The semiconductor device according to any one of appendices 1-1 to 1-3, wherein

- the gate electrode includes a first portion extending in a first direction, a second portion extending in a second direction orthogonal to the first direction, and an intersecting portion in which the first portion and the second portion intersect each other, and
- the first column layer is formed below the intersecting portion of the gate electrode.

APPENDIX 1-5

The semiconductor device according to any one of appendices 1-1 to 1-4, wherein

- the second region is formed in a quadrilateral shape in a plan view, and
- the first column layer is formed adjacent to one of the corners of the second region.

APPENDIX 1-6

The semiconductor device according to any one of appendices 1-1 to 1-5, wherein

- a plurality of the first column layers are formed with spacing from each other, and
- the second region is formed apart from a region between the first column layers adjacent to each other.

APPENDIX 1-7

The semiconductor device according to any one of appendices 1-1 to 1-6, further comprising a second conductivity type second column layer formed continuously to the second region and extending in the thickness direction of the semiconductor layer from the second region toward the second surface of the semiconductor layer.

In accordance with the arrangement above, the semiconductor device has a super junction structure in which the second column layer extends from the second region. Accordingly, by defining the spacing between second column layers such that the depletion layers extending horizontally from the second column layers are integrated, the inherent characteristics of the super junction structure of achieving excellent ON-resistance and switching speed can also be realized.

APPENDIX 1-8

The semiconductor device according to appendix 1-7, wherein the element structure includes a first element structure and a second element structure, the first element structure including the first column layer and the second region adjacent to the first column layer, the second element structure including the second region with the second column layer connected thereto.

APPENDIX 1-9

The semiconductor device according to appendix 1-8, wherein the semiconductor layer includes a first element region with a plurality of the first element structures arranged therein and a second element region with a plurality of the second element structures arranged therein.

APPENDIX 1-10

The semiconductor device according to appendix 1-9, wherein the first element region is surrounded by the second element region.

APPENDIX 1-11

The semiconductor device according to appendix 1-9 or 1-10, wherein the semiconductor layer includes an active region with the element structure formed therein and an outer peripheral region surrounding the active region, and the second element region is formed in a peripheral edge portion of the active region.

APPENDIX 1-12

The semiconductor device according to any one of appendices 1-9 to 1-11, further comprising a first electrode covering the element structure and electrically connected to the first region, wherein the second element region is formed along a peripheral edge portion of the first electrode.

APPENDIX 1-13

The semiconductor device according to any one of appendices 1-7 to 1-12, wherein a plurality of the first column layers and a plurality of the second column layers are arranged regularly at equal spacing from each other.

APPENDIX 1-14

The semiconductor device according to any one of appendices 1-1 to 1-13, wherein the element structure includes a planar gate structure.

APPENDIX 1-15

The semiconductor device according to any one of appendices 1-1 to 1-13, wherein the element structure includes a trench gate structure.

APPENDIX 1-16

The semiconductor device according to any one of appendices 1-1 to 1-15, wherein the semiconductor device includes a MISFET having the first region as a source region and the second region as a body region.

APPENDIX 1-17

The semiconductor device according to any one of appendices 1-1 to 1-15, wherein the semiconductor device includes an IGBT having the first region as an emitter region, the second region as a base region, and a second conductivity type collector region in contact with the third region.

APPENDIX 2-1

A semiconductor device comprising:

a semiconductor layer having a first surface and a second surface;

an element structure formed on the first surface side of the semiconductor layer and including a first conductivity type first region and a second conductivity type second region in contact with the first region;

a gate electrode opposing the second region with a gate insulating film therebetween;

a first conductivity type third region formed in the semiconductor layer to be in contact with the second region; and a second conductivity type column layer extending in a thickness direction of the semiconductor layer, wherein a resistance distribution curve of the semiconductor layer in the thickness direction of the semiconductor layer has a plurality of peaks.

In accordance with the arrangement above, the semiconductor device provided can have an increased withstand voltage and improved recovery characteristics.

APPENDIX 2-2

The semiconductor device according to appendix 2-1, wherein the resistance distribution curve includes a baseline indicating that a resistance value is approximately constant from the first surface of the semiconductor layer toward the second surface, the plurality of peaks includes a first peak that is higher relative to the baseline and a second peak that is lower relative to the first peak, and a width of the resistance distribution curve at a half of a resistance value of the second peak is equal to or greater than 20 μm.

APPENDIX 2-3

The semiconductor device according to appendix 2-2, wherein the second peak is formed within a range from 1 μm to 5 μm with respect to the lower end of the column layer, and the first peak is formed within a range from 20 μm to 30 μm with respect to the lower end of the column layer.

APPENDIX 2-4

The semiconductor device according to any one of appendices 2-1 to 2-3, wherein the column layer has a length of 40 μm to 60 μm in the thickness direction of the semiconductor layer.

APPENDIX 2-5

The semiconductor device according to any one of appendices 2-1 to 2-4, wherein the column layer has a concavo-convex side surface formed with a plurality of repeating sets of convex portions and concave portions in the thickness direction of the semiconductor layer, and at least one peak of the resistance distribution curve is formed at the position of the convex portion formed at the lowermost end side of the column layer.

APPENDIX 2-6

A semiconductor device comprising:

a semiconductor layer having a first surface and a second surface;

an element structure formed on the first surface side of the semiconductor layer and including a first conductivity type first region and a second conductivity type second region in contact with the first region;

a gate electrode opposing the second region with a gate insulating film therebetween;

a first conductivity type third region formed in the semiconductor layer to be in contact with the second region; and a second conductivity type column layer extending in a thickness direction of the semiconductor layer, wherein the semiconductor layer includes a high-resistance region corresponding to a distribution part that bulges into a convex shape in a resistance distribution curve drawn for the semiconductor layer in the thickness direction of the semiconductor layer, and the high-resistance region has a thickness of 20 μm or more.

APPENDIX 2-7

A semiconductor device manufacturing method comprising the steps of:

forming, in a first conductivity type semiconductor layer having a first surface and a second surface, a second conductivity type column layer extending in a thickness direction of the semiconductor layer;

forming, closer to the first surface of the semiconductor layer with respect to the column layer, an element structure including a first conductivity type first region and a second conductivity type second region in contact with the first region;

forming a gate electrode opposing the second region with a gate insulating film therebetween;

irradiating with first light ions at a first depth position from the second surface of the semiconductor layer; and irradiating with second light ions at a second depth position from the second surface of the semiconductor layer different from the first depth position.

In accordance with the method above, the semiconductor device provided can have an increased withstand voltage and improved recovery characteristics.

APPENDIX 2-8

The semiconductor device manufacturing method according to appendix 2-7, wherein the step of irradiating with the first light ions includes a step of irradiating with the first light ions at a first dosage, and the step of irradiating with the second light ions includes a step of irradiating with the second light ions at a second dosage lower than the first dosage and at the second depth position shallower than the first depth position.

APPENDIX 2-9

The semiconductor device manufacturing method according to appendix 2-7 or 2-8, wherein the first light ions and the second light ions include light ions of the same type.

APPENDIX 2-10

The semiconductor device manufacturing method according to any one of appendices 2-7 to 2-9, wherein the first light ions and the second light ions include protons, $^{3}He^{++}$, or $^{4}He^{++}$.

This application corresponds to Japanese Patent Application No. 2020-062479 filed on Mar. 31, 2020 with the Japan Patent Office, Japanese Patent Application No. 2020-062480 filed on Mar. 31, 2020 with the Japan Patent Office, and Japanese Patent Application No. 2020-062481 filed on Mar. 31, 2020 with the Japan Patent Office, the disclosures of which are incorporated herein by reference in their entirety.

REFERENCE SIGNS LIST

1: Electrode film
2: Source electrode film
3: Gate electrode film
4: Active region
5: Recessed portion
6: Outer peripheral region
7: Pad portion
8: Finger portion
9: Passivation film
10: First pad opening
11: Second pad opening
12: Source pad
13: Gate pad
14: Central portion
15: Peripheral edge portion
16: Semiconductor substrate
17: Epitaxial layer
18: Column layer
19: Body region
20: Source region
21: Body contact region
22: Gate insulating film
23: Gate electrode
24: p type region
25: p type contact region
26: Insulating film
27: Floating electrode
28: Interlayer insulating film
29: First surface
30: Second surface
31: Drift region
32: First surface
33: Second surface
34: Side surface
35: Convex portion
36: Concave portion
37: Parasitic diode
38: Channel region
39: First element structure
40: Second element structure
41: First element region
42: Second element region
43: Corner
44: Region
45: Top portion
46: Boundary portion
47: First portion
48: Second portion
49: Boundary portion
50: First portion
51: Second portion
52: Intersecting portion
53: First contact hole
54: Second contact hole
55: Drain electrode
56: Dummy gate electrode
57: First column
58: Second column
59: Insulating film
60: Third contact hole
61: Initial base layer

62: p type impurity
63: n type semiconductor layer
64: n type semiconductor layer
65: Side surface
66: Initial base layer
67: Trench
68: n type semiconductor layer
69: Gate trench
70: Gate insulating film
71: Gate electrode
72: Semiconductor substrate
73: $p^+$ type collector layer
74: Collector electrode
75: Emitter electrode film
76: Emitter region
77: Base region
78: Depletion layer
79: Clearance gap
181: First column layer
182: Second column layer
191: First body region
192: Second body region
201: Electrode film
202: Source electrode film
203: Gate electrode film
204: Active region
205: Recessed portion
206: Outer peripheral region
207: Pad portion
208: Finger portion
209: Passivation film
210: First pad opening
211: Second pad opening
212: Source pad
213: Gate pad
214: Central portion
215: Peripheral edge portion
216: Semiconductor substrate
217: Epitaxial layer
218: Column layer
219: Body region
220: Source region
221: Body contact region
222: Gate insulating film
223: Gate electrode
224: p type region
225: p type contact region
226: Insulating film
227: Floating electrode
228: Interlayer insulating film
229: First surface
230: Second surface
231: Drift region
232: First surface
233: Second surface
234: Side surface
235: Convex portion
236: Concave portion
237: Parasitic diode
238: Channel region
239: First element structure
240: Second element structure
241: First element region
242: Second element region
243: Corner
244: Region
245: Top portion
246: Boundary portion
247: First portion
248: Second portion
249: Boundary portion
250: First portion
251: Second portion
252: Intersecting portion
253: First contact hole
254: Second contact hole
255: Drain electrode
256: Resistance distribution curve
257: Baseline
258: Convex line
259: First peak
260: Second peak
261: Initial base layer
262: p type impurity
263: n type semiconductor layer
264: n type semiconductor layer
265: Side surface
266: Initial base layer
267: Trench
268: n type semiconductor layer
269: Gate trench
270: Gate insulating film
271: Gate electrode
272: Semiconductor substrate
273: $p^+$ type collector layer
274: Collector electrode
275: Emitter electrode film
276: Emitter region
277: Base region
278: Lower end
279: Half
280: Valley
281: High-resistance region
282: Crystal defect region
381: First column layer
382: Second column layer
391: First body region
392: Second body region
771: First base region
772: Second base region
773: First baseline
774: Second baseline
781: First convex line
782: Second convex line
971: First base region
972: Second base region
1021: First crystal defect region
1022: Second crystal defect region
A1: Semiconductor device
A2: Semiconductor device
A3: Semiconductor device
A4: Semiconductor device
A5: Semiconductor device
A6: Semiconductor device
A7: Semiconductor device
A8: Semiconductor device
A9: Semiconductor device
A10: Semiconductor device
A11: Semiconductor device
A12: Semiconductor device
A13: Semiconductor device
A14: Semiconductor device
B1: Semiconductor device

The invention claimed is:

1. A semiconductor device comprising:

a semiconductor layer having a first surface and a second surface;

an element structure formed on the first surface side of the semiconductor layer and including a first conductivity type first region and a second conductivity type second region in contact with the first region;

a gate electrode opposing the second region with a gate insulating film therebetween;

a first conductivity type third region formed in the semiconductor layer to be in contact with the second region; and a first electrode formed on the semiconductor layer and electrically connected to the first region and the second region, wherein the element structure includes a first element structure and a second element structure, each of the first element structure and the second element structure including the first region and the second region, the first element structure includes a second conductivity type first column layer extending in a thickness direction of the semiconductor layer, the first column layer being separated from the second region in a direction along the first surface of the semiconductor layer, the second element structure further includes a second electrode opposing the third region with an insulating film therebetween, the second electrode is electrically connected to the first electrode, the semiconductor layer includes a first element region with a plurality of the first element structures arranged therein and a second element region with a plurality of the second element structures arranged therein, the first electrode covers the first element region and the second element region, the second element region is formed in a peripheral edge portion of the first electrode in a plan view, in the second element region, at least four second regions are adjoined to one another in both a first direction and a second direction intersecting the first direction, in the second element region, the second electrode is formed between two of the four second regions that are adjoined in the first direction, in the second element region, the gate electrode is formed between two of the four second regions that are adjoined in the second direction, and at least one of the four second regions has a quadrilateral shape in a plan view, and one side of the at least one second region having the quadrilateral shape opposes the second electrode, and the remaining three sides oppose the gate electrode.

2. The semiconductor device according to claim 1, wherein the first element region is surrounded by the second element region.

3. The semiconductor device according to claim 1, wherein the semiconductor layer includes an active region with the element structure formed therein and an outer peripheral region surrounding the active region, and the second element region is formed in a peripheral edge portion of the active region.

4. The semiconductor device according to claim 1, wherein the third region includes a first portion formed between a top portion of the first column layer and the second region and having a first impurity concentration and a second portion formed closer to the second surface of the semiconductor layer with respect to the first portion and having a second impurity concentration lower than the first impurity concentration.

5. The semiconductor device according to claim 4, wherein the first column layer has a concavo-convex side surface formed with a plurality of repeating sets of convex portions and concave portions in the thickness direction of the semiconductor layer, and the top portion of the first column layer includes the convex portion that is closest to the first surface of the semiconductor layer.

6. The semiconductor device according to claim 1, wherein the gate electrode includes a first portion extending in the first direction, a second portion extending in a second direction orthogonal to the first direction, and an intersecting portion in which the first portion and the second portion intersect each other, and the first column layer is formed below the intersecting portion of the gate electrode.

7. The semiconductor device according to claim 1, wherein the second region of the element structure is formed in a quadrilateral shape in a plan view, and the first column layer is formed adjacent to one of the corners of the second region.

8. The semiconductor device according to claim 1, wherein a plurality of the first column layers are formed with spacing from each other, and the second region of the element structure is formed apart from a region between the first column layers adjacent to each other.

9. The semiconductor device according to claim 1, wherein the second element structure further includes a second conductivity type second column layer formed continuously to the second region and extending in the thickness direction of the semiconductor layer from the second region toward the second surface of the semiconductor layer.

10. The semiconductor device according to claim 9, wherein a plurality of the first column layers and a plurality of the second column layers are arranged regularly at equal spacing from each other.

11. The semiconductor device according to claim 1, wherein the element structure includes a planar gate structure.

12. The semiconductor device according to claim 1, wherein the element structure includes a trench gate structure.

13. The semiconductor device according to claim 1, wherein the semiconductor device includes a MISFET having the first region as a source region and the second region as a body region.

14. The semiconductor device according to claim 1, wherein the semiconductor device includes an IGBT having the first region as an emitter region, the second region as a base region, and a second conductivity type collector region in contact with the third region.

15. The semiconductor device according to claim 1, wherein the second electrode is separated physically and electrically from the gate electrode.

* * * * *